(12) United States Patent
Isa et al.

(10) Patent No.: US 8,637,866 B2
(45) Date of Patent: Jan. 28, 2014

(54) THIN FILM TRANSISTOR

(75) Inventors: Toshiyuki Isa, Kanagawa (JP); Yasuhiro Jinbo, Kanagawa (JP); Sachiaki Tezuka, Kanagawa (JP); Koji Dairiki, Kanagawa (JP); Hidekazu Miyairi, Kanagawa (JP); Shunpei Yamazaki, Tokyo (JP); Takuya Hirohashi, Kanagawa (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 475 days.

(21) Appl. No.: 12/490,447

(22) Filed: Jun. 24, 2009

(65) Prior Publication Data

US 2009/0321737 A1    Dec. 31, 2009

(30) Foreign Application Priority Data

Jun. 27, 2008  (JP) ................................. 2008-169286
Feb. 27, 2009  (JP) ................................. 2009-046433
May 28, 2009  (JP) ................................. 2009-129313

(51) Int. Cl.
  *H01L 29/72*  (2006.01)
(52) U.S. Cl.
  USPC ......... 257/57; 257/66; 257/347; 257/E29.003
(58) Field of Classification Search
  USPC ............................. 257/57, 66, 347, E29.003
  See application file for complete search history.

(56) References Cited

U.S. PATENT DOCUMENTS

| | | |
|---|---|---|
| 4,409,134 A | 10/1983 | Yamazaki |
| 5,101,242 A | 3/1992 | Ikeda et al. |
| 5,221,631 A | 6/1993 | Ikeda et al. |
| 5,311,040 A | 5/1994 | Hiramatsu et al. |
| 5,453,858 A | 9/1995 | Yamazaki |

(Continued)

FOREIGN PATENT DOCUMENTS

| | | |
|---|---|---|
| EP | 0 535 979 A2 | 4/1993 |
| EP | 0535979 | * 7/1993 |

(Continued)

OTHER PUBLICATIONS

Kim.C et al., "A Novel Four-Mask-Count Process Architecture for TFT-LCDS,", SID Digest '00 : SID International Symposium Digest of Techinical Papers, 2000, pp. 1006-1009.

(Continued)

*Primary Examiner* — Edward Wojciechowicz
(74) *Attorney, Agent, or Firm* — Nixon Peabody LLP; Jeffrey L. Costellia

(57) ABSTRACT

A thin film transistor includes, as a buffer layer, a semiconductor layer which contains nitrogen and includes crystal regions in an amorphous structure between a gate insulating layer and source and drain regions, at least on the source and drain regions side. As compared to a thin film transistor in which an amorphous semiconductor is included in a channel formation region, on-current of a thin film transistor can be increased. In addition, as compared to a thin film transistor in which a microcrystalline semiconductor is included in a channel formation region, off-current of a thin film transistor can be reduced.

35 Claims, 52 Drawing Sheets

(56) References Cited

U.S. PATENT DOCUMENTS

| | | | |
|---|---|---|---|
| 5,514,879 A | 5/1996 | Yamazaki | |
| 5,591,987 A | 1/1997 | Yamazaki et al. | |
| 5,614,732 A | 3/1997 | Yamazaki | |
| 5,648,662 A | 7/1997 | Zhang et al. | |
| 5,677,236 A * | 10/1997 | Saitoh et al. | 438/485 |
| 5,701,167 A | 12/1997 | Yamazaki | |
| 5,766,989 A | 6/1998 | Maegawa et al. | |
| 5,849,601 A | 12/1998 | Yamazaki | |
| 5,859,445 A | 1/1999 | Yamazaki | |
| 5,864,150 A | 1/1999 | Lin | |
| 5,932,302 A | 8/1999 | Yamazaki et al. | |
| 6,011,277 A | 1/2000 | Yamazaki | |
| 6,023,075 A | 2/2000 | Yamazaki | |
| 6,153,893 A | 11/2000 | Inoue et al. | |
| 6,171,674 B1 | 1/2001 | Yamazaki et al. | |
| 6,183,816 B1 | 2/2001 | Yamazaki et al. | |
| 6,252,249 B1 | 6/2001 | Yamazaki | |
| 6,281,520 B1 | 8/2001 | Yamazaki | |
| 6,306,213 B1 | 10/2001 | Yamazaki | |
| 6,468,617 B1 | 10/2002 | Yamazaki et al. | |
| 6,468,839 B2 | 10/2002 | Inoue et al. | |
| 6,737,676 B2 | 5/2004 | Yamazaki | |
| 6,756,258 B2 | 6/2004 | Zhang et al. | |
| 6,835,523 B1 | 12/2004 | Yamazaki et al. | |
| 7,067,844 B2 | 6/2006 | Yamazaki | |
| 7,098,479 B1 | 8/2006 | Yamazaki | |
| 7,115,902 B1 | 10/2006 | Yamazaki | |
| 7,199,846 B2 | 4/2007 | Lim | |
| 2005/0012097 A1 | 1/2005 | Yamazaki | |
| 2005/0022864 A1 | 2/2005 | Fujioka et al. | |
| 2005/0115930 A1 | 6/2005 | Tanaka et al. | |
| 2007/0181945 A1 | 8/2007 | Nakamura | |
| 2008/0308807 A1 | 12/2008 | Yamazaki et al. | |
| 2009/0033818 A1 | 2/2009 | Nakajima et al. | |
| 2009/0057683 A1 | 3/2009 | Nakajima et al. | |
| 2009/0061574 A1 | 3/2009 | Nakajima et al. | |
| 2009/0261328 A1 | 10/2009 | Miyairi et al. | |
| 2009/0261330 A1 | 10/2009 | Yamazaki et al. | |
| 2009/0267067 A1 | 10/2009 | Jinbo et al. | |
| 2009/0267068 A1 | 10/2009 | Dairiki et al. | |
| 2009/0321743 A1 | 12/2009 | Isa et al. | |
| 2010/0096631 A1 | 4/2010 | Miyairi et al. | |
| 2010/0096637 A1 | 4/2010 | Yamazaki et al. | |
| 2010/0127261 A1 | 5/2010 | Yamazaki et al. | |
| 2012/0006493 A1 * | 1/2012 | White et al. | 156/345.52 |

FOREIGN PATENT DOCUMENTS

| | | |
|---|---|---|
| JP | 57-071126 A | 5/1982 |
| JP | 58-092217 A | 6/1983 |
| JP | 59-072781 A | 4/1984 |
| JP | 60-160170 | 8/1985 |
| JP | 4-266019 | 9/1992 |
| JP | 05-129608 A | 5/1993 |
| JP | 06-326312 A | 11/1994 |
| JP | 07-131030 A | 5/1995 |
| JP | 2000-277439 A | 10/2000 |
| JP | 2001-007024 A | 1/2001 |
| JP | 2001-053283 A | 2/2001 |
| JP | 2001-102587 | 4/2001 |
| JP | 2004-014958 A | 1/2004 |
| JP | 2005-049832 A | 2/2005 |
| JP | 2005-167051 A | 6/2005 |
| JP | 2005-191546 A | 7/2005 |
| JP | 2008-124392 | 5/2008 |
| WO | WO 2004/086487 A1 | 10/2004 |

OTHER PUBLICATIONS

Arai.T et al., "41.2: Micro Silicon Technology for Active Matrix OLED Display,", SID Digest '07 : SID International Symposium Digest of Techincal Papers, 2007, vol. XXXVIII, pp. 1370-1373.

Fujiwara.H et al., "Stress-Induced Nucleation of Microcrystalline Silicon from Amorphous Phase,", JPN. J. Appl. Phys. (Japanese Journal of Applied Physics), May 1, 2002, vol. 41/Part1, No. 5A, pp. 2821-2828.

Kamei.T et al., "A Significant Reduction of Impurity Contents in Hydrogenated Microcrystalline Silicon Films for Increased Grain Size and Reduced Defect Density,", Jpn. J. Appl. Phys. (Japanese Journal of Applied Physics), Mar. 1, 1998, vol. 37/Part2, No. 3A, pp. L265-L268.

Song.J et al., "34.1: Advanced Four-Mask Process Architecture for the A-SI TFT Array Manufacturing Method,", SID Digest '02 : SID International Symposium Digest of Technical Papers, 2002, pp. 1038-1041.

Choi.S et al., "P-16: Novel Four-Mask Process in the FFS TFT-LCD with Optimum Multiple-Slit Design Applied by the Use of a Gray-Tone Mask,", SID Digest '05 : SID International Symposium Digest of Techincal Papers, 2005, pp. 284-287.

Lee.C et al., "High-Mobility Nanocrystalline Silicon Thin-Film Transisitors Fabricated by Plasma-Enhanced Chemical Vapor Deposition,", Appl. Phys. Lett. (Applied Physics Letters), May 24, 2005, vol. 86, pp. 22106-1-22106-3.

Lee.C et al., "High-Mobility N-Channel and P-Channel Nanocrystalline Silicon Thin-Film Transistors,", IEDM 05: Technical Digest of International Electron Devices Meeting, 2005, pp. 937-940.

Lee.C et al., "Directly Deposited Nanocrystalline Silicon Thin-Film Transistors with Ultra High Mobilities,", Appl. Phys. Lett. (Applied Physics Letters), Dec. 18, 2006, vol. 89, pp. 252101-1-252101-3.

Lee.C et al., "How to Achieve High Mobility Thin Film Transistors by Direct Deposition of Silicon Using 13.56 MHZ RF PECVD?,", IEDM, 2006, pp. 295-298.

Esmaeili-Rad.M et al., "High Stability, Low Leakage Nanocrystalline Silicon Bottom Gate Thin Film Transistors for AMOLED Displays,", IEEE IEDM, 2006, pp. 303-306.

Lee.H et al., "Leakage Current Mechanisms in Top-Gate Nanocrystalline Silicon Thin-Film Transistors,", Appl. Phys. Lett. (Applied Physics Letters), Feb. 28, 2008, vol. 92, pp. 083509-1-083509-3.

Lee.C et al., "Stability of NC-SI:H TFTS with Silicon Nitride Gate Dielectric,", IEEE Transactions on Electron Devices, 2007, vol. 54, No. 1, pp. 45-51.

Sazonov.A et al., "Low-Temperature Materials and Thin Film Transistors for Flexible Electronics,", Proceedings of the IEEE, Aug. 1, 2005, vol. 93, No. 8, pp. 1420-1428.

Lee.C et al., "Top-Gate TFTS Using 13.56MHZ PECVD Microcrystalline Silicon,", IEEE Electron Device Letters, Sep. 5, 2005, vol. 26, No. 9, pp. 637-639.

Lee.C et al., "Postdeposition Thermal Annealing and Material Stability of 75° C Hydrogenated Nanocrystalline Silicon Plasma-Enhanced Chemical Vapor Deposition Films,", J. Appl. Phys. (Journal of Applied Physics), Aug. 4, 2005, vol. 98, pp. 034305-1-0343057.

Fujiwara.H et al., "Microcrystalline silicon nucleation sites in the sub-surface of hydrogenated amorphous silicon,", Surface Science, 2002, vol. 497, pp. 333-340.

Fujiwara.H et al., "Real-time spectroscopic ellipsometry studies of the nucleation and grain growth processes in microcrystalline silicon thin films,", Phys. Rev. B (Physical Review. B), Feb. 23, 2001, vol. 63, pp. 115306-1-115306-9.

Invitation to pay additional fees of the counterpart Application No. (PCT/JP2009/061795; PCT11623/12200/12401), International Searching Authority dated Jul. 28, 2009.

* cited by examiner

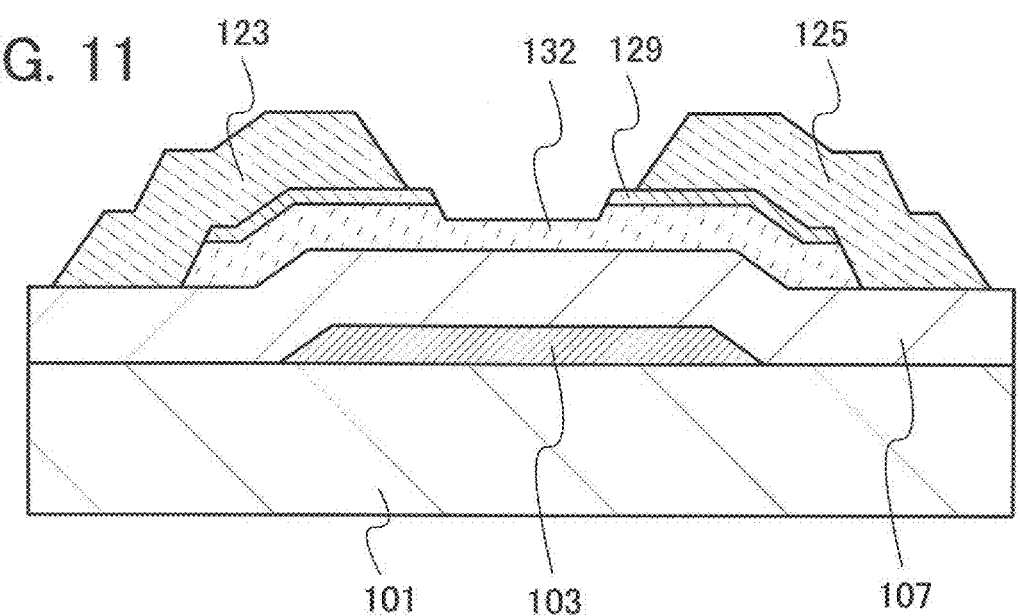

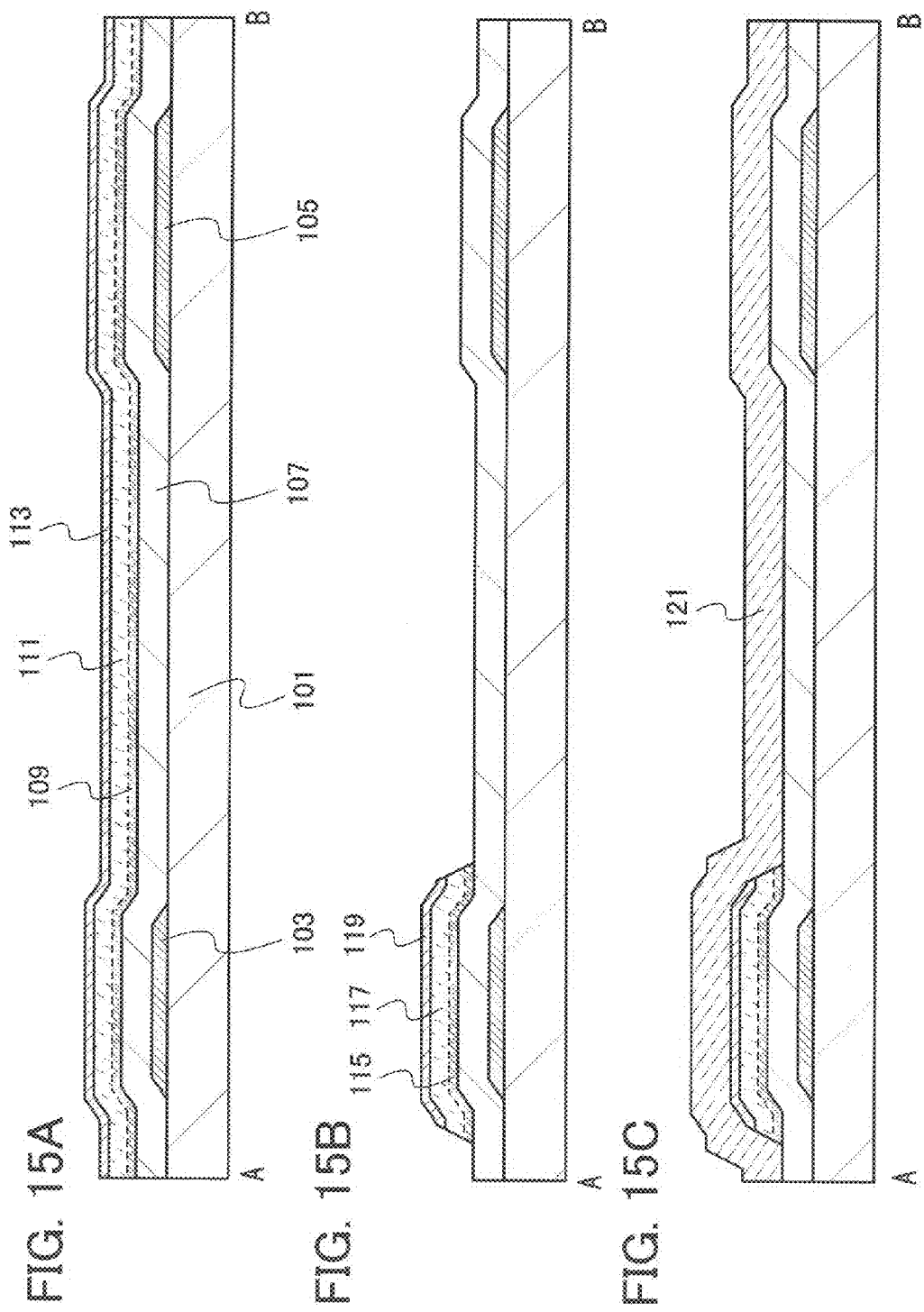

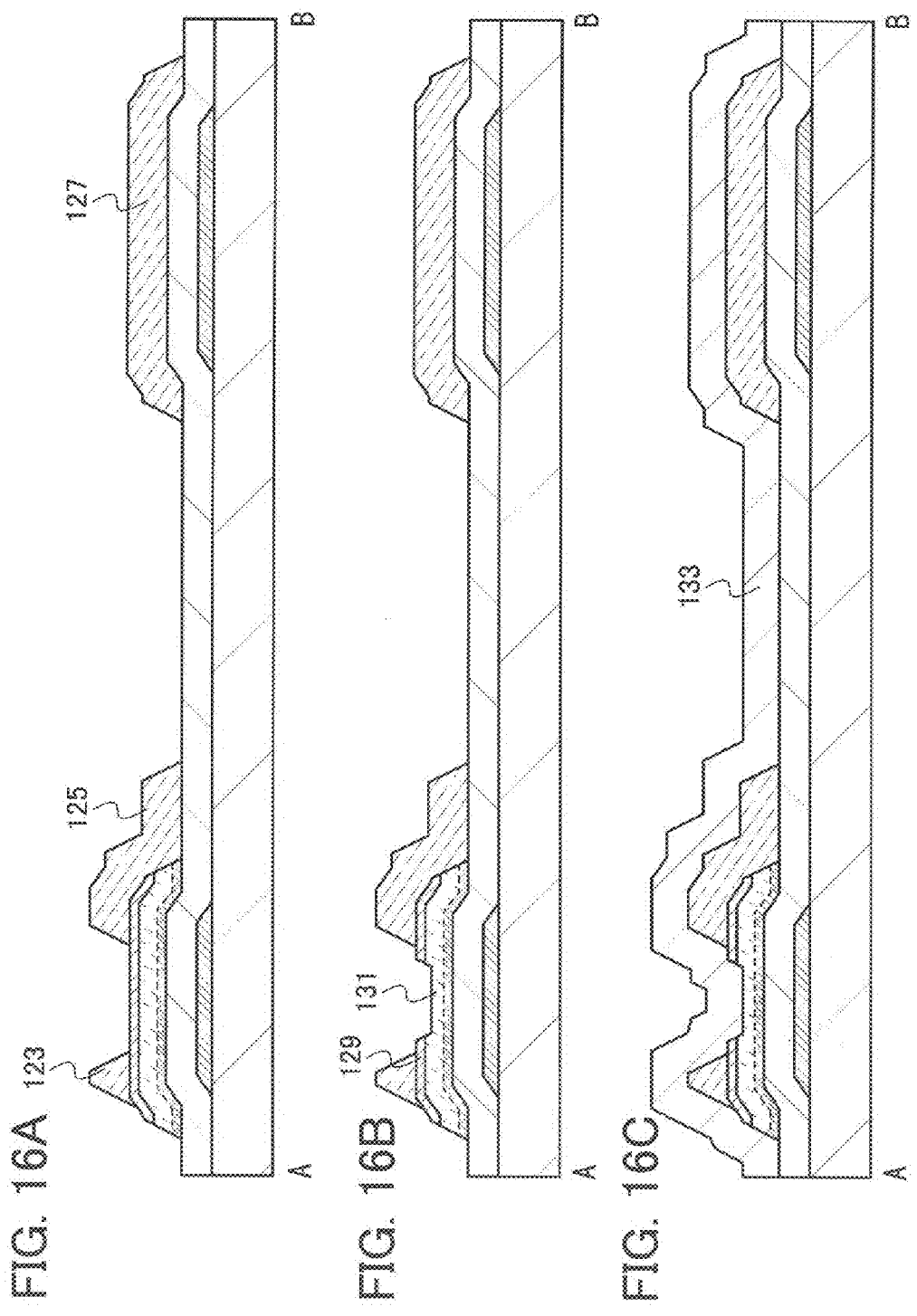

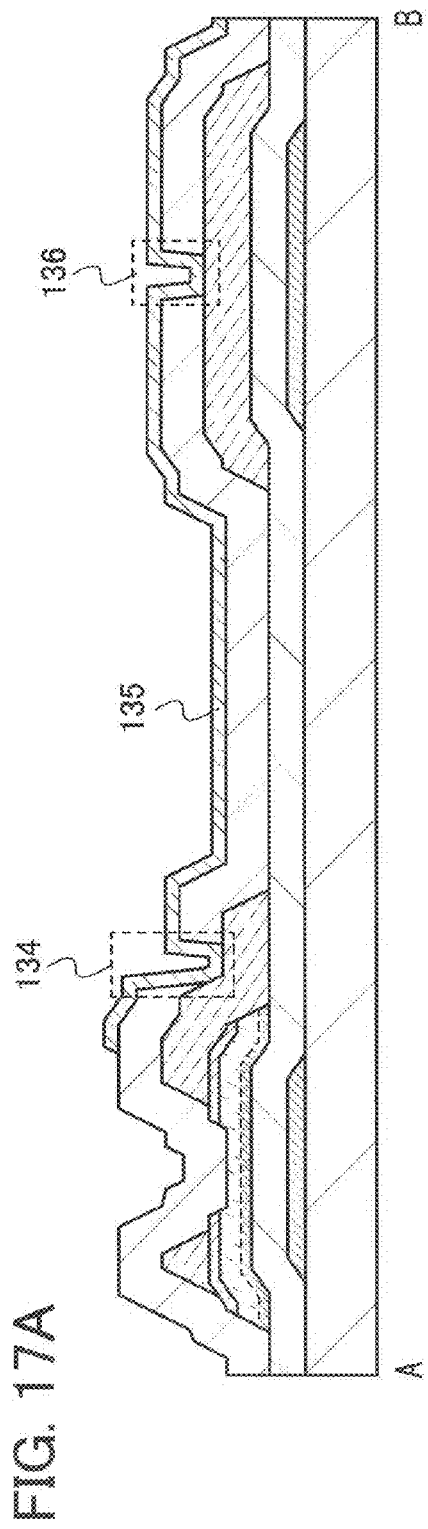
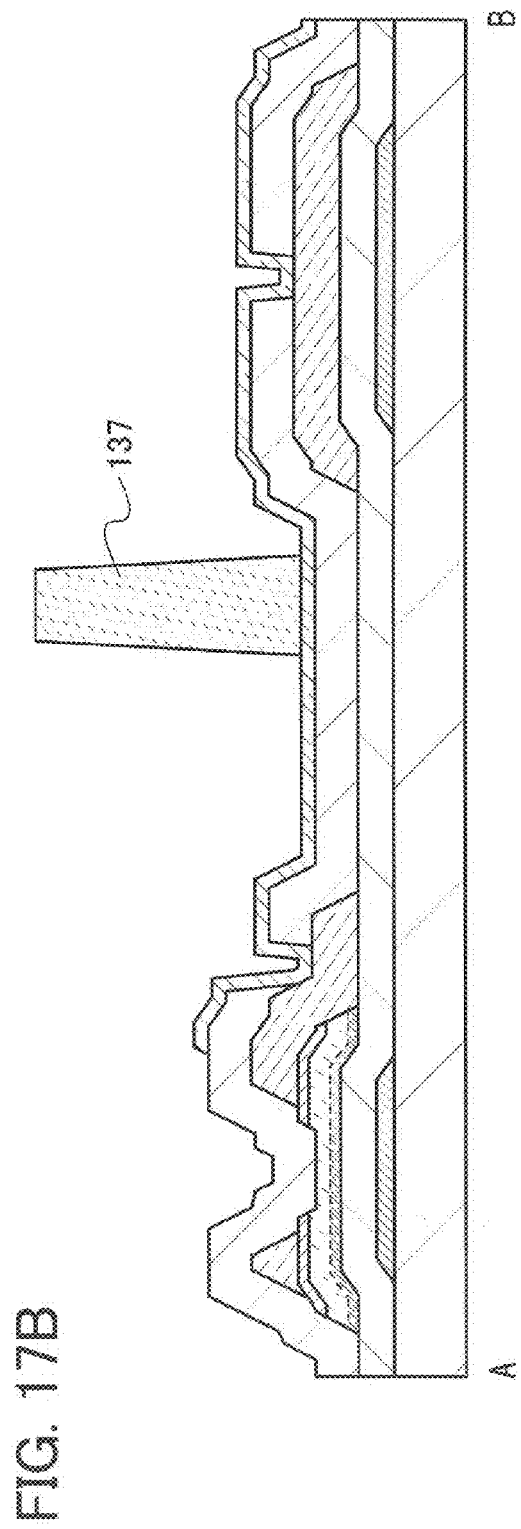
FIG. 17A
FIG. 17B

FIG. 18A
FIG. 18B
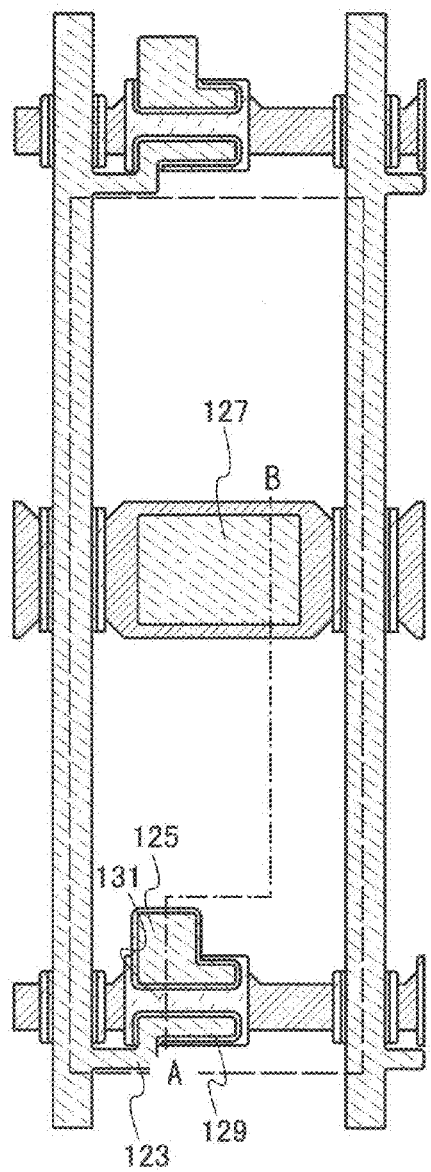
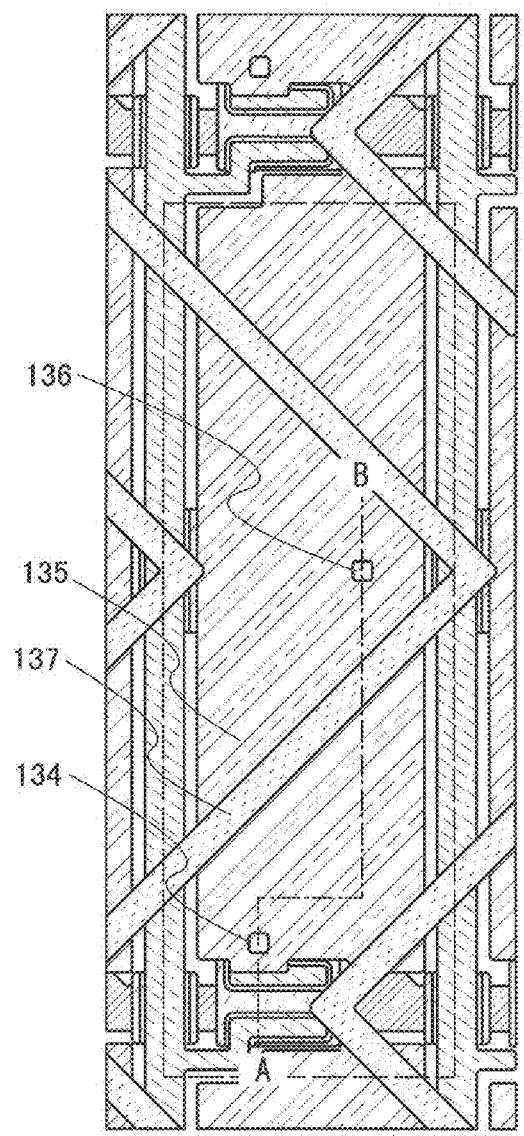

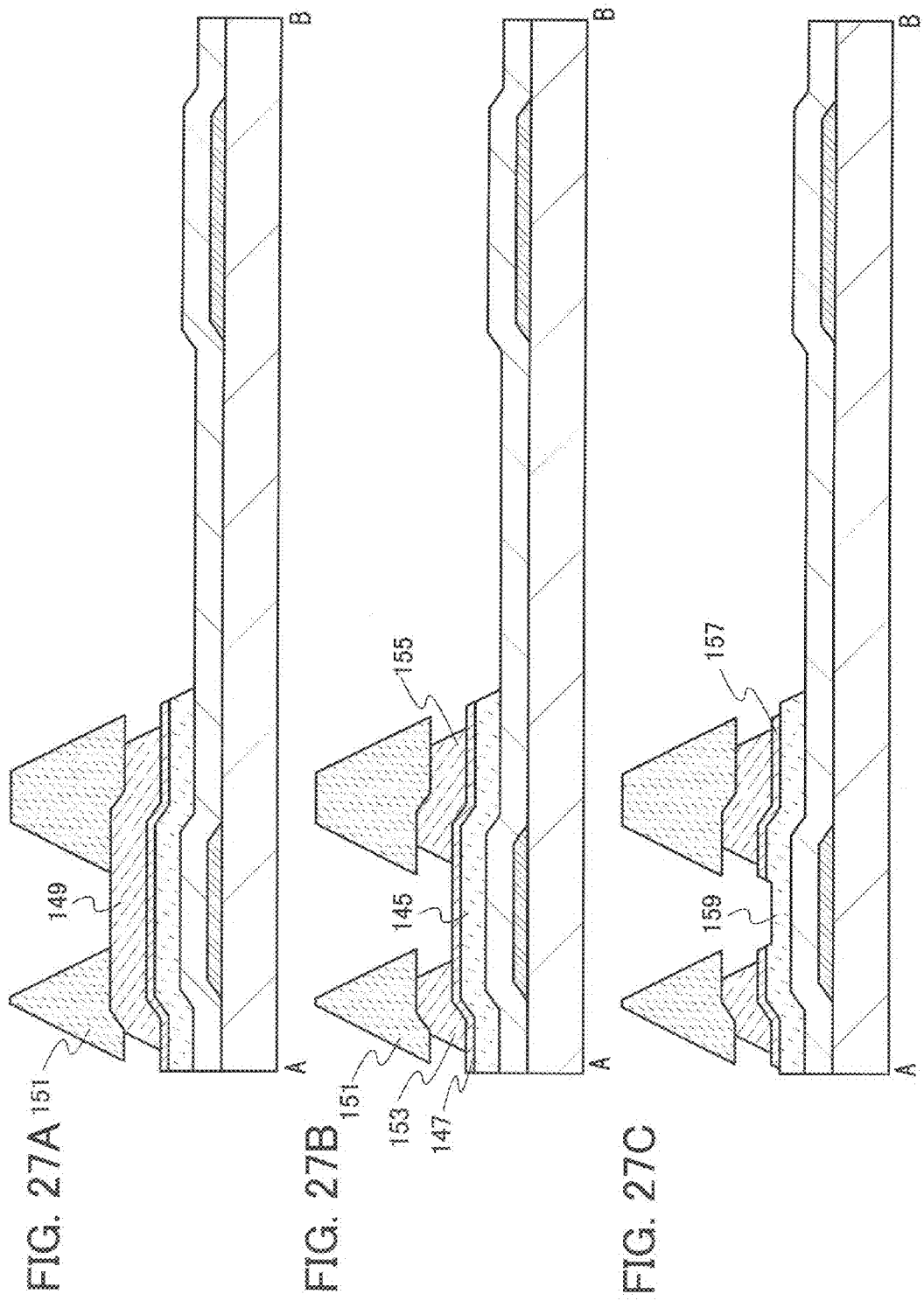

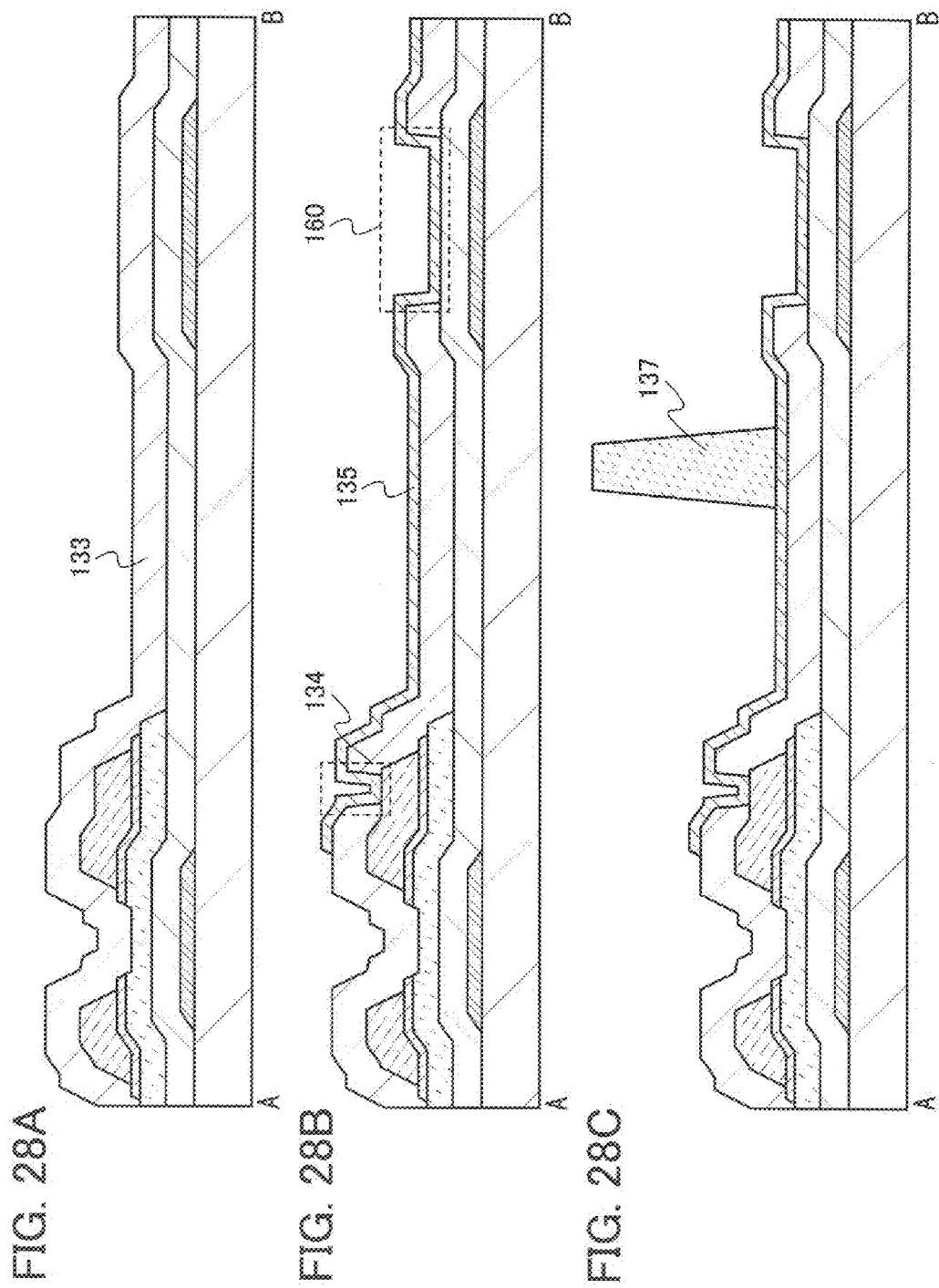

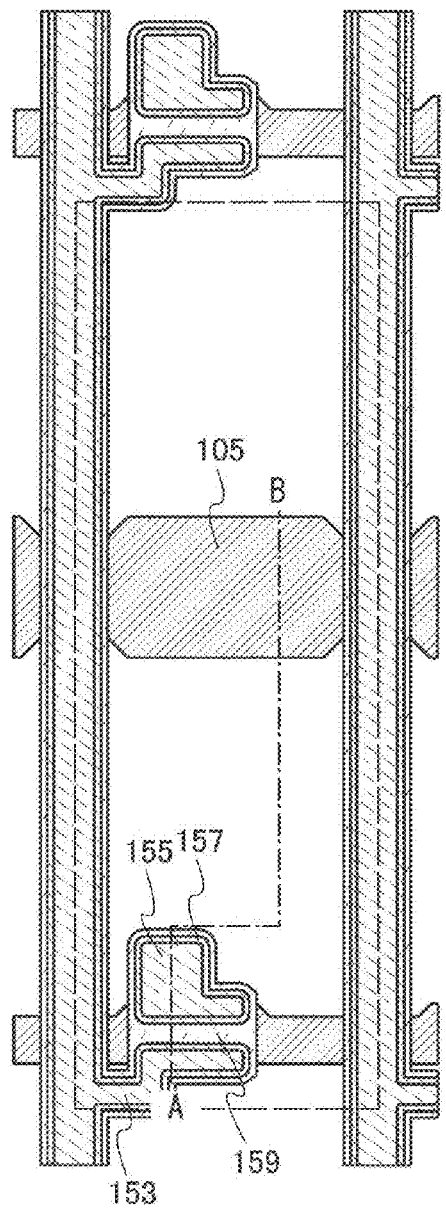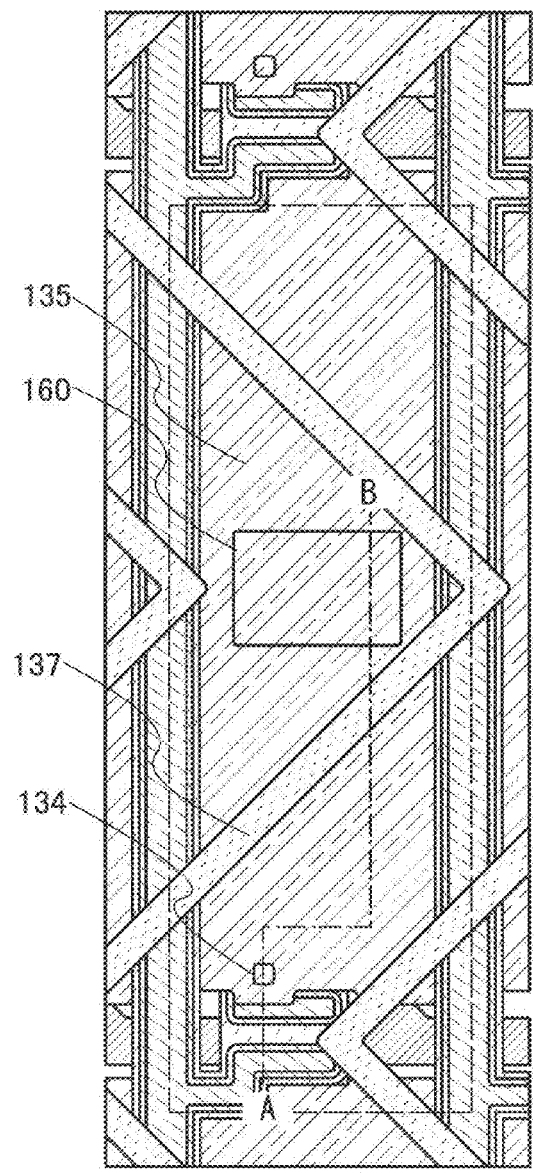

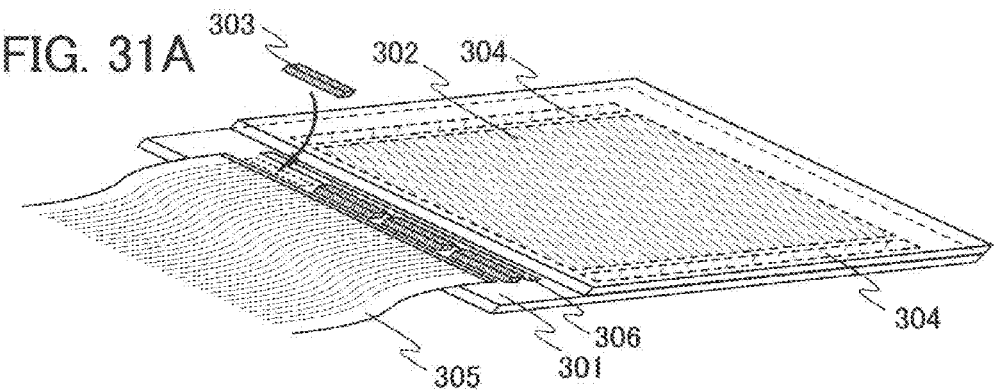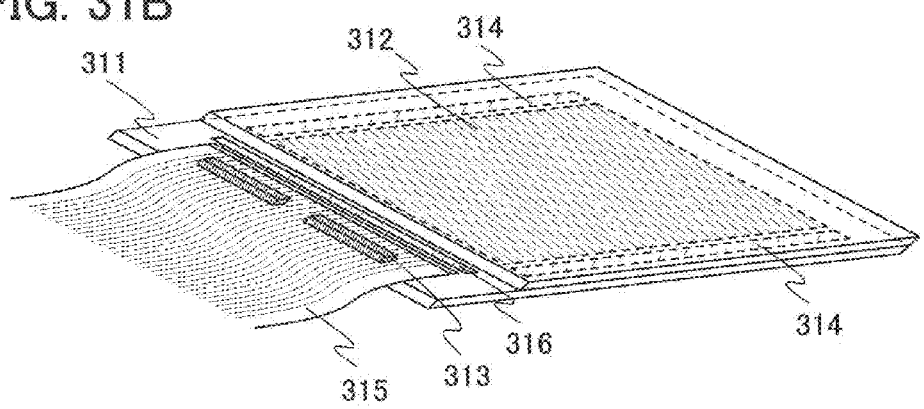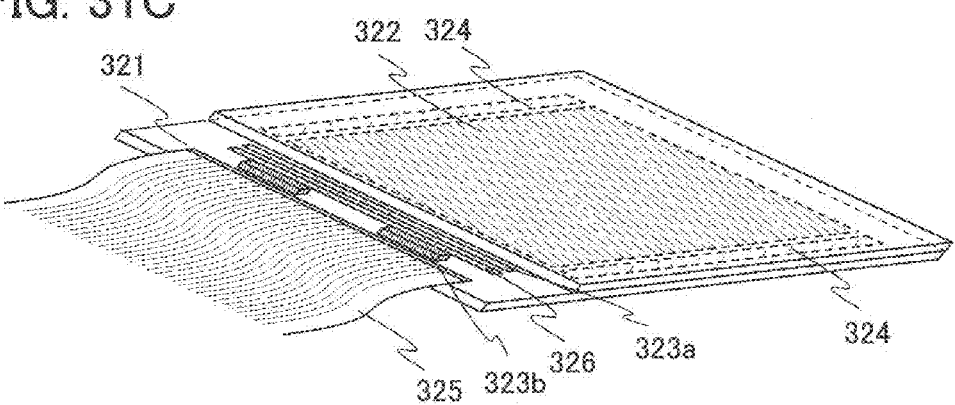

FIG. 32A
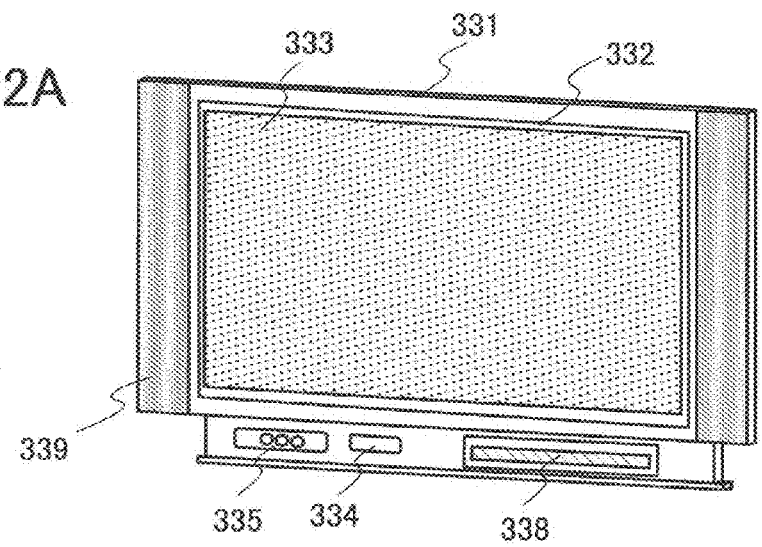
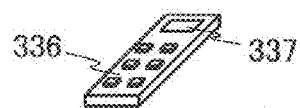
FIG. 32B  FIG. 32C
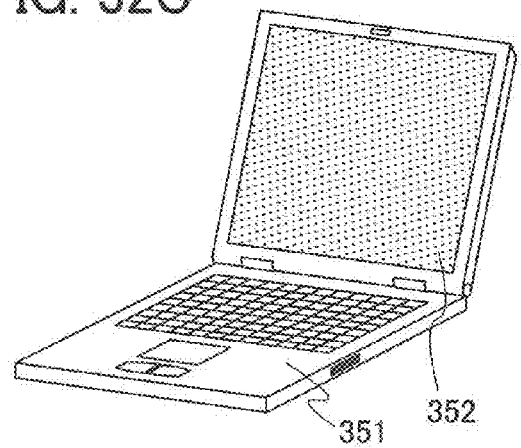
FIG. 32D
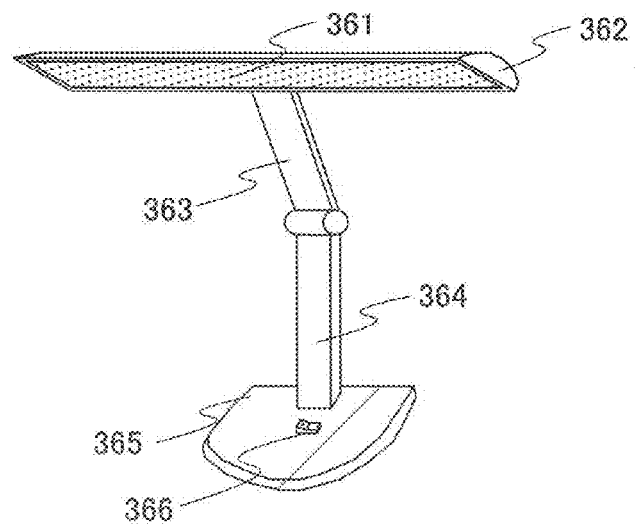

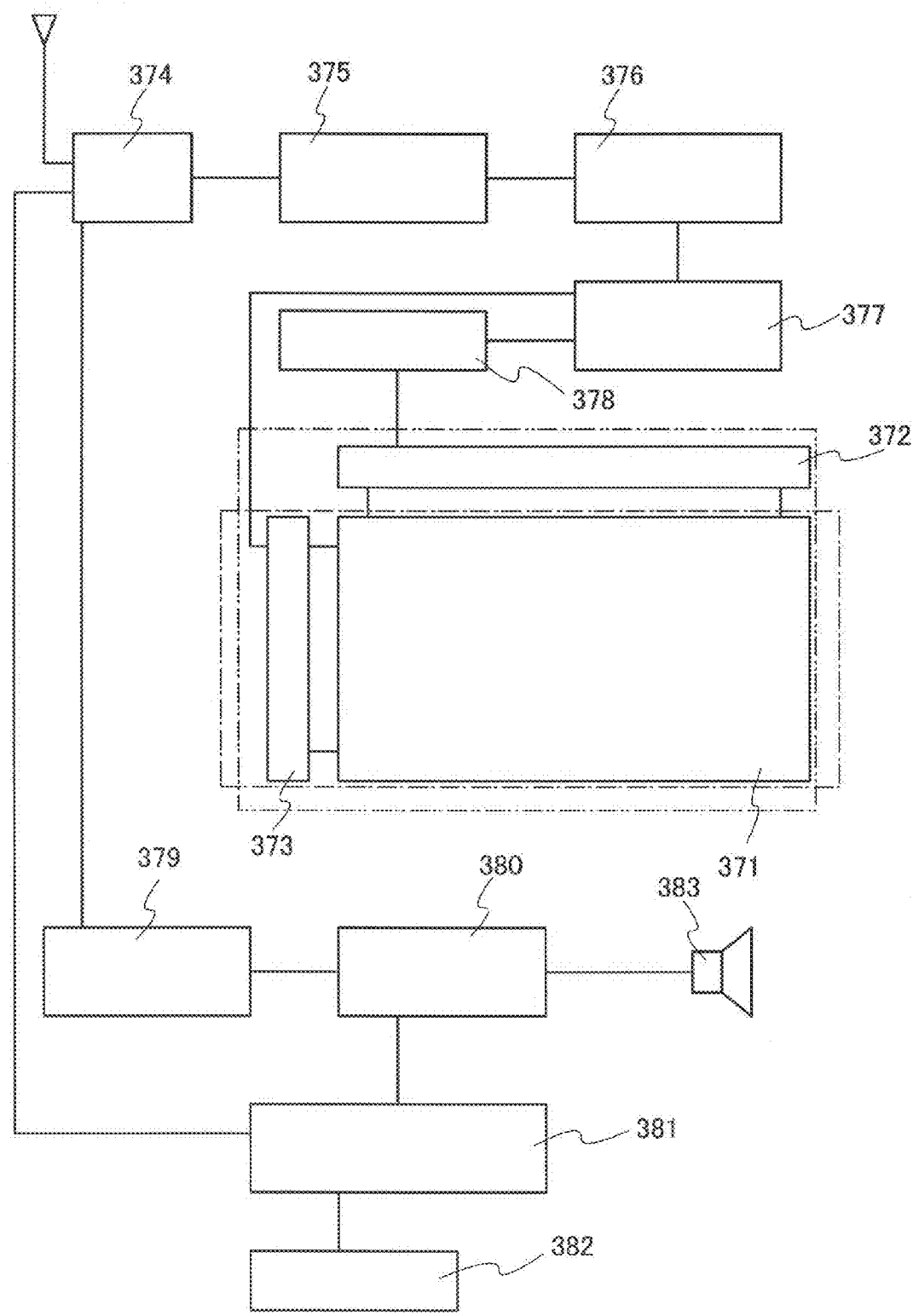

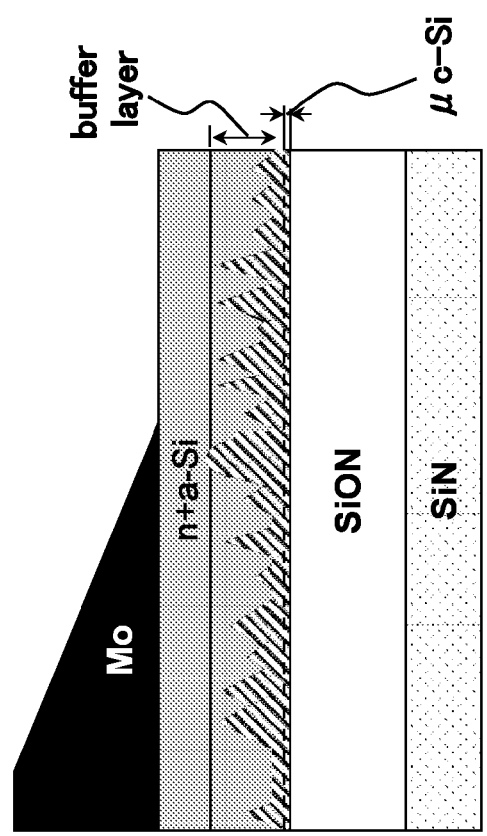
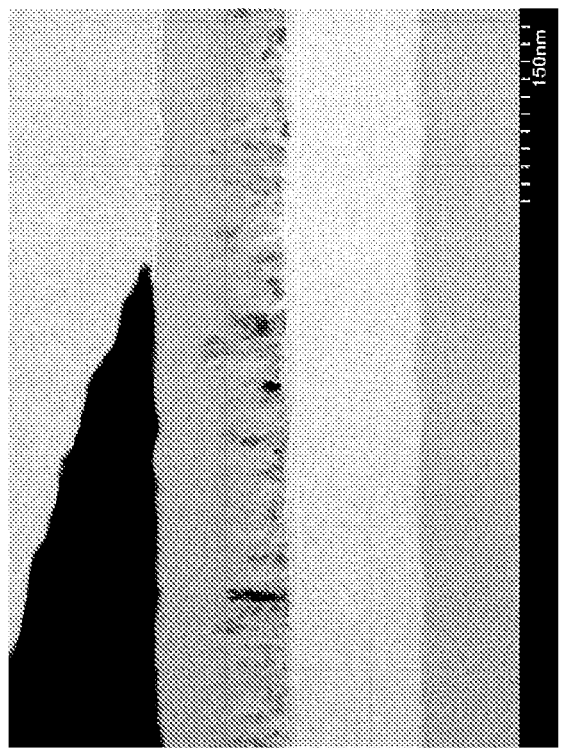
FIG. 35A
FIG. 35B

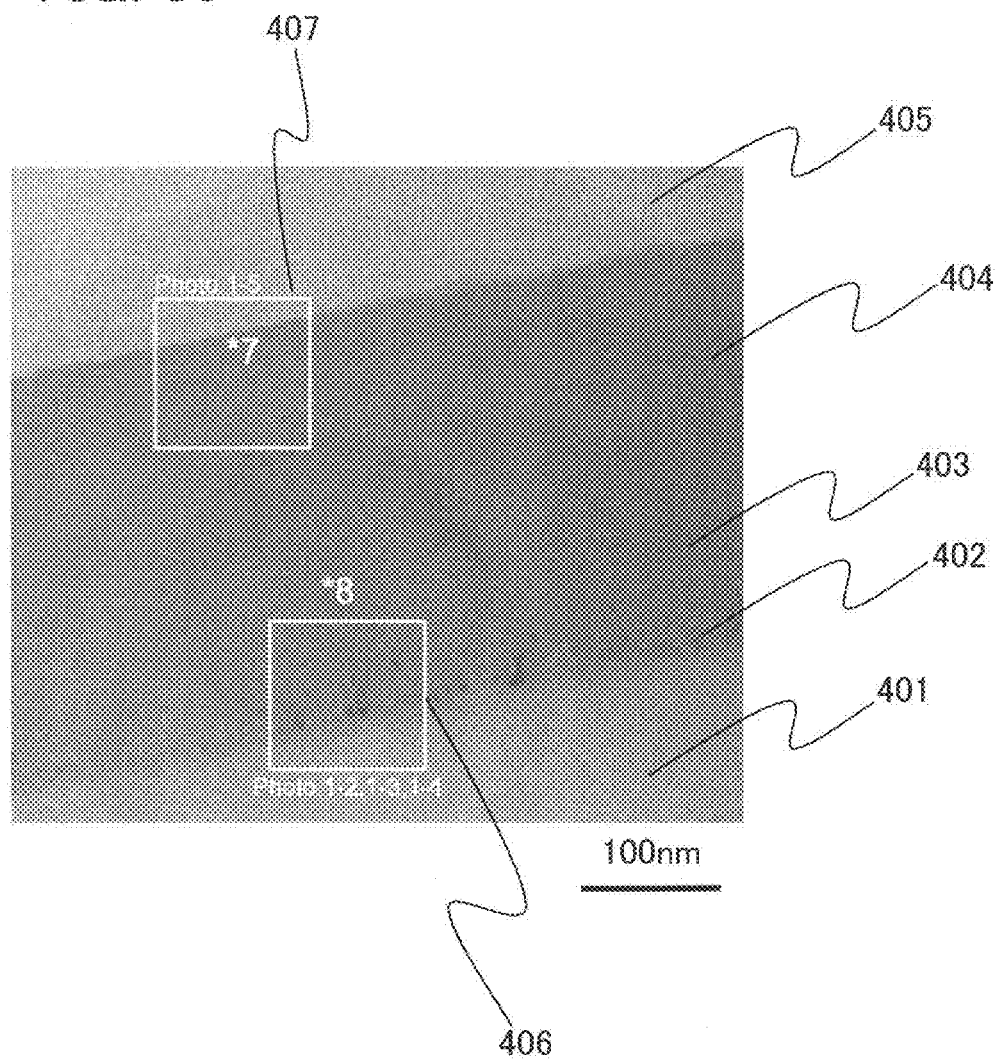

10nm

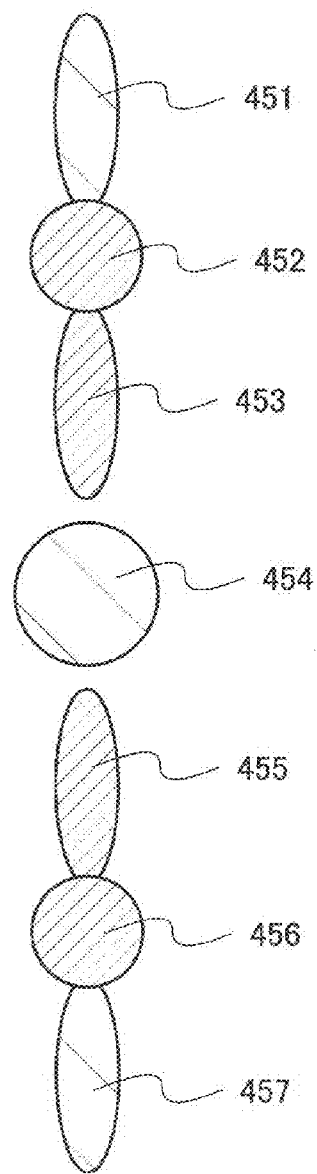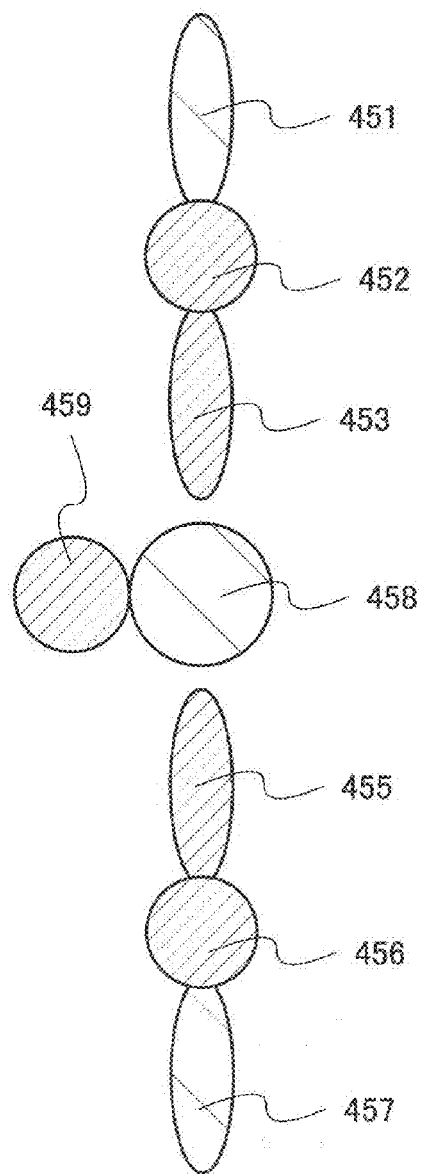

Antibonding orbital

Bonding orbital

○ H atom    ○ Si atom    ● N atom

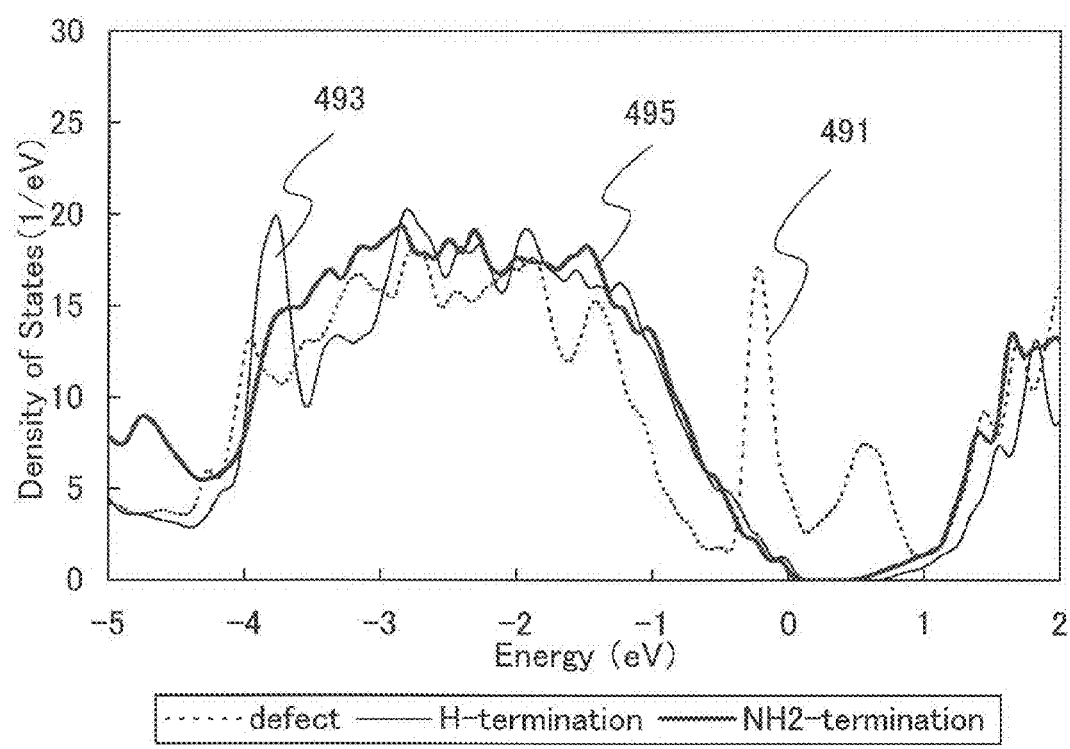

○ H atom    ○ Si atom

THIN FILM TRANSISTOR

TECHNICAL FIELD

The present invention relates to a thin film transistor and a method for manufacturing the thin film transistor, and a semiconductor device and a display device using the thin film transistor.

BACKGROUND ART

As a kind of field-effect transistor, a thin film transistor in which a channel formation region is formed in a semiconductor layer formed over a substrate having an insulating surface is known. Techniques in which amorphous silicon, microcrystalline silicon, or polycrystalline silicon is used for the semiconductor layer used in the thin film transistor have been disclosed (Patent Documents 1 to 5). A typical application of a thin film transistor is a liquid crystal television device, and the thin film transistor has been put to the practical use as a switching transistor for each pixel included in a display screen.

REFERENCE

[Patent Document]
[Patent Document 1] Japanese Published Patent Application No. 2001-053283
[Patent Document 2] Japanese Published Patent Application No. H05-129608
[Patent Document 3] Japanese Published Patent Application No. 2005-049832
[Patent Document 4] Japanese Published Patent Application No. H07-131030
[Patent Document 5] Japanese Published Patent Application No. 2005-191546

DISCLOSURE OF INVENTION

A thin film transistor in which a channel formation region is formed using an amorphous silicon layer has problems such as low field-effect mobility and low on-current. On the other hand, a thin film transistor in which a channel formation region is formed using a microcrystalline silicon layer has a problem in that, whereas the field-effect mobility is higher than that of the thin film transistor in which a channel formation region is formed using an amorphous silicon layer, the off-current is high, and thus sufficient switching characteristics cannot be obtained.

A thin film transistor in which a channel formation region is formed using a polycrystalline silicon layer has characteristics in that the field-effect mobility is far higher than those of the above-described two kinds of thin-film transistors, and high on-current can be obtained. Because of such characteristics, this thin film transistor can be used not only as a switching transistor provided in a pixel but also in a driver circuit for which high-speed operation is required.

However, the thin film transistor in which a channel formation region is formed using a polycrystalline silicon layer requires a crystallization step for a semiconductor layer and has a problem of higher manufacturing cost, as compared to the thin film transistor in which a channel formation region is formed using an amorphous silicon layer. For example, a laser annealing technique involved in the process for forming a polycrystalline silicon layer has a problem in that large-screen liquid crystal panels cannot be produced efficiently because the laser beam irradiation area is small.

A glass substrate for manufacturing display panels has been grown in size from year to year as follows: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), and the 8th generation (2200 mm×2400 mm). From now on, the size of the glass substrate is expected to grow to the 9th generation (2400 mm×2800 mm or 2450 mm×3050 mm) and the 10th generation (2950 mm×3400 mm). The increase in size of the glass substrate is based on the minimum-cost design concept.

However, a technique that thin film transistors capable of high-speed operation can be manufactured over a large-area mother glass substrate such as the 10th generation (2950 mm×3400 mm) mother glass substrate with high productivity has not been established yet, which is a problem in industry.

In view of the foregoing, it is an object of an embodiment of the present invention to solve the aforementioned problems related to on-current and off-current of a thin film transistor.

According to an embodiment of the present invention, a thin film transistor includes, as a buffer layer, a semiconductor layer including crystal regions in an amorphous structure between a gate insulating layer and source and drain regions, at least on the source and drain regions side.

According to another embodiment of the present invention, a thin film transistor includes a gate insulating layer, a semiconductor layer in contact with the gate insulating layer, and a buffer layer between the semiconductor layer and source and drain regions. The buffer layer includes crystal regions in an amorphous structure.

According to another embodiment of the present invention, a thin film transistor includes a gate insulating layer, a buffer layer which is in contact with the gate insulating layer, and source and drain regions which are partly in contact with the buffer layer. The buffer layer includes crystal grains (also referred to as minute crystal grains) each having a diameter of at least 1 to 10 nm inclusive in an amorphous structure.

According to another embodiment of the present invention, a thin film transistor includes a gate insulating layer covering a gate electrode; a semiconductor layer in contact with the gate insulating layer; and impurity semiconductor layers forming source and drain regions, which are in contact with part of the semiconductor layer. In the semiconductor layer, a microcrystalline semiconductor is formed on the gate insulating layer side and crystal regions exist discretely in an amorphous structure on the impurity semiconductor layer side.

The buffer layer is provided on a side opposite to the side in contact with the gate insulating layer, that is, on a so-called back channel side.

The semiconductor layer including crystal regions in an amorphous structure contains nitrogen. The nitrogen concentration at this time which is measured by secondary ion mass spectrometry is $1\times10^{20}$ to $1\times10^{21}$ cm$^{-3}$, preferably $2\times10^{20}$ to $1\times10^{21}$ cm$^{-3}$, more preferably $3\times10^{20}$ to $1\times10^{21}$ cm$^{-3}$.

In addition, a peak region of a spectrum which is obtained by performing low-temperature photoluminescence spectroscopy on the semiconductor layer including crystal regions in an amorphous structure is 1.31 to 1.39 eV inclusive.

In addition, in the semiconductor layer including crystal regions in an amorphous structure, the slope of a band tail of a band gap is steeper than that of an amorphous semiconductor, typically, amorphous silicon. Therefore, the band gap gets wider, and tunneling current does not easily flow, as compared to a conventional amorphous semiconductor layer.

The semiconductor layer including crystal regions in an amorphous structure is formed using, as a reaction gas, a gas in which a semiconductor source gas (e.g., a silicon hydride gas, a silicon fluoride gas, a silicon chloride gas, a germanium hydride gas, a germanium fluoride gas, a germanium chloride gas, or the like) and a dilution gas are mixed at a mixture ratio at which a microcrystalline semiconductor can be generated. The reaction gas is introduced to an ultrahigh vacuum reaction chamber where an oxygen concentration is reduced, and a predetermined pressure is maintained therein to generate glow discharge plasma. Accordingly, a film is deposited over a substrate which is placed in the reaction chamber. An impurity element which hinders generation or growth of crystal nuclei is supplied to the reaction chamber and the concentration of the impurity element is controlled, whereby conical or pyramidal crystal regions and/or minute crystal grains are formed as the crystal regions in the amorphous structure.

During deposition of the film over the substrate, crystal nuclei are generated while controlling the concentration of the impurity element so as to reduce generation of crystal nuclei, and inverted conical or pyramidal crystal regions are formed using the crystal nuclei. In addition, during deposition of the film over the substrate, by controlling the concentration of the impurity element so as to suppress generation of crystal nuclei, generation of crystal nuclei is suppressed and minute crystal grains are formed. In the case where a base layer of the film is a semiconductor layer having crystallinity, an amorphous structure is deposited while crystal growth is reduced by controlling the concentration of the impurity element so as to reduce crystal growth, whereby regular conical or pyramidal crystal regions are formed.

It is preferable to use nitrogen or a nitride as the impurity element which reduces or suppresses generation of crystal nuclei and crystal growth.

In the semiconductor layer including crystal regions in an amorphous structure, by controlling the nitrogen concentration which is measured by secondary ion mass spectrometry to $3\times10^{20}$ to $1\times10^{21}$ cm$^{-3}$, generation of crystal nuclei is controlled so as not to generate crystal nuclei, and thus, minute crystal grains are formed.

In the semiconductor layer including crystal regions in an amorphous structure, by controlling the nitrogen concentration which is measured by secondary ion mass spectrometry to $1\times10^{20}$ to $1\times10^{21}$ cm$^{-3}$ inclusive, preferably $2\times10^{20}$ to $1\times10^{21}$ cm$^{-3}$ inclusive, crystal nuclei generation positions, from which the conical or pyramidal crystal regions start to grow, and crystal nuclei generation density are controlled, or growth of conical or pyramidal crystal regions is controlled.

As a conical or pyramidal crystal region which is one form of a crystal region, in the case of a bottom gate thin film transistor, there is a conical or pyramidal crystal region (hereinafter also referred to as a regular conical or pyramidal crystal region) whose width is narrowed from a gate insulating layer toward source and drain regions. In addition, there is an inverted conical or pyramidal crystal region which has grown from the interface between a gate insulating layer or a semiconductor layer in contact with the gate insulating layer and a semiconductor layer including crystal regions toward source and drain regions in a substantially radial manner.

A "regular conical or pyramidal shape" here refers to a three-dimensional shape which is constructed by (i) a base including a plurality of planes, and (ii) lines linking the periphery of the base and a vertex which is located outside the base, wherein the vertex exists between the base and source and drain regions. In other words, the "regular conical or pyramidal shape" refers to a shape obtained by reduction in width of a crystal region in a deposition direction of a semiconductor layer including crystal regions in an amorphous structure. When a semiconductor layer serving as a base of the semiconductor layer including crystal regions in an amorphous structure is a microcrystalline semiconductor layer or a crystalline semiconductor layer, by depositing the semiconductor layer including crystal regions in an amorphous structure under the condition in which part of the crystal region grows with the semiconductor layer as a seed crystal, the crystal region grows so that its width is narrowed.

An "inverted conical or pyramidal shape" here refers to a three-dimensional shape which is constructed by (i) a base including a plurality of planes, and (ii) lines linking the periphery of the base and a vertex which is located outside the base, wherein the vertex exists between the base and a substrate. In other words, the "inverted conical or pyramidal shape" refers to a shape obtained by the growth of a crystal region in a substantially radial manner in a deposition direction of a semiconductor layer including crystal regions in an amorphous structure. Each of crystal nuclei generated discretely grows along its crystallographic direction during the formation of the film, so that the crystal regions grow from the crystal nuclei so as to spread in a direction of a plane perpendicular to the deposition direction of the semiconductor layer including crystal regions in an amorphous structure.

In addition, the conical or pyramidal crystal regions include a single crystal or a twin crystal. Further, the conical or pyramidal crystal regions exist discretely in the amorphous structure; thus, there are few crystal grain boundaries. Note that the "twin crystal" means that two different crystal grains are bonded to each other with highly favorable consistency at a crystal grain boundary. In other words, the "twin crystal" has a structure in which crystal lattices are continuously arranged at a crystal grain boundary so that a trap level due to crystal defects or the like is difficult to be formed. Thus, it can be considered that a crystal grain boundary does not substantially exist in a region having such a crystal structure.

The minute crystal grain which is one form of the crystal region is a crystal grain having a diameter of 1 to 10 nm inclusive, preferably 1 to 5 nm inclusive. When a deposition source gas contains nitrogen, generation of crystal nuclei can be hindered, and minute crystal grains which do not become crystal nuclei can be formed. Further, a proportion of crystalline components is increased by increasing density of the minute crystal grains in the semiconductor layer.

In the above manner, in the thin film transistor, the semiconductor layer including crystal regions in an amorphous structure is provided as the buffer layer between the channel formation region and the source and drain regions, whereby resistance of the buffer layer in a thickness direction of when voltage is applied to the source region or the drain region can be lowered. In particular, by providing the semiconductor layer including crystal regions in an amorphous structure directly under the source region and the drain region as the buffer layer, on-current of the thin film transistor can be increased as compared to a thin film transistor in which an amorphous semiconductor layer is provided between a gate insulating layer and source and drain regions.

In addition, in the semiconductor layer including crystal regions in an amorphous structure, the slope of a band tail of a band gap is steeper, the band gap gets wider, and tunneling current does not easily flow, as compared to an amorphous semiconductor, typically, amorphous silicon. Accordingly, by providing the semiconductor layer including crystal regions in an amorphous structure as a buffer layer in a region where off-current flows, off-current can be reduced as compared to a thin film transistor in which a microcrystalline semiconductor is provided between a gate insulating layer and source and drain regions.

Note that the concentration of an impurity element in silicon which reduces the coordination number of silicon and generates dangling bonds, such as oxygen, is reduced. That is, it is preferable that the oxygen concentration which is measured by secondary ion mass spectrometry be less than or equal to $5 \times 10^{18}$ cm$^{-3}$.

Note that here, a concentration is measured by secondary ion mass spectrometry (SIMS) unless other measuring methods are mentioned.

Note that on-current refers to current which flows between a source electrode and a drain electrode when a transistor is turned on. For example, in the case of an n-channel transistor, the on-current refers to current which flows between the source electrode and the drain electrode when a gate voltage of the transistor is higher than a threshold voltage thereof.

Further, off-current is current which flows between a source electrode and a drain electrode when a transistor is turned off. For example, in the case of an n-channel transistor, the off-current refers to current which flows between the source electrode and the drain electrode when a gate voltage of the transistor is lower than a threshold voltage thereof.

As described above, as compared to a thin film transistor in which an amorphous semiconductor is included in a channel formation region, on-current of a thin film transistor can be increased. In addition, as compared to a thin film transistor in which a microcrystalline semiconductor is included in a channel formation region, off-current of a thin film transistor can be reduced.

BRIEF DESCRIPTION OF DRAWINGS

FIG. 11 is an explanatory view of an example of a thin film transistor according to an embodiment of the present invention.

FIGS. 15A to 15C are explanatory views of an example of a method for manufacturing a thin film transistor according to an embodiment of the present invention.

FIGS. 16A to 16C are explanatory views of an example of a method for manufacturing a thin film transistor according to an embodiment of the present invention.

FIGS. 17A and 17B are explanatory views of an example of a method for manufacturing a thin film transistor according to an embodiment of the present invention.

FIGS. 18A and 18B are explanatory views of an example of a method for manufacturing a thin film transistor according to an embodiment of the present invention.

FIGS. 27A to 27C are explanatory views of an example of a method for manufacturing a thin Film transistor according to an embodiment of the present invention.

FIGS. 28A to 28C are explanatory views of an example of a method for manufacturing a thin film transistor according to an embodiment of the present invention.

FIGS. 29A and 29B are explanatory views of an example of a method for manufacturing a thin film transistor according to an embodiment of the present invention.

FIGS. 31A to 31C are explanatory views of a display panel to which a thin film transistor according to an embodiment of the present invention can be applied.

FIGS. 32A to 32D are explanatory views of an electronic device to which a thin film transistor according to an embodiment of the present invention can be applied.

FIG. 33 is an explanatory view of an electronic device to which a thin film transistor according to an embodiment of the present invention can be applied.

FIGS. 35A and 35B are explanatory views of a cross-sectional structure of a thin film transistor manufactured in Example 1.

FIG. 39 is an explanatory view of a cross-sectional TEM image described in Example 4.

FIGS. 43A and 43B are explanatory diagrams of an atomic orbital of a semiconductor layer.

FIG. 50 is a graph for explaining a semiconductor layer included in a thin film transistor according to an embodiment of the present invention.

FIGS. 52A and 52B3 are explanatory diagrams of a semiconductor layer included in a thin film transistor according to an embodiment of the present invention.

BEST MODE FOR CARRYING OUT THE INVENTION

Figure 1A:
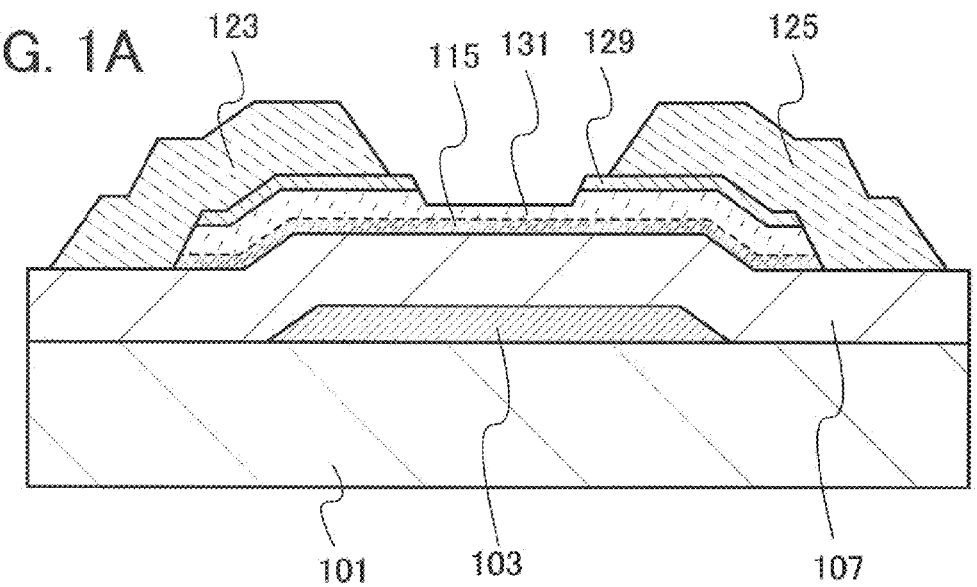
FIGS. 1A and 1B are explanatory views of an example of a thin film transistor according to an embodiment of the present invention.

Hereinafter, embodiments will be described with reference to the drawings. Note that the present invention is not limited to the following description. It is easily understood by those skilled in the art that modes and details thereof can be variously changed unless departing from the spirit and the scope of the present invention. Therefore, the present invention should not be interpreted as being limited to the description of the embodiments to be given below. Note that as structures of the present invention are described with reference to the drawings, like portions are denoted by common reference numerals in different drawings. The same hatching pattern is applied to like portions, and the like portions are not especially denoted by reference numerals in some cases.

Embodiment 1

In Embodiment 1, an example of a mode of a thin film transistor will be described with reference to the drawings.

Figure 1B:
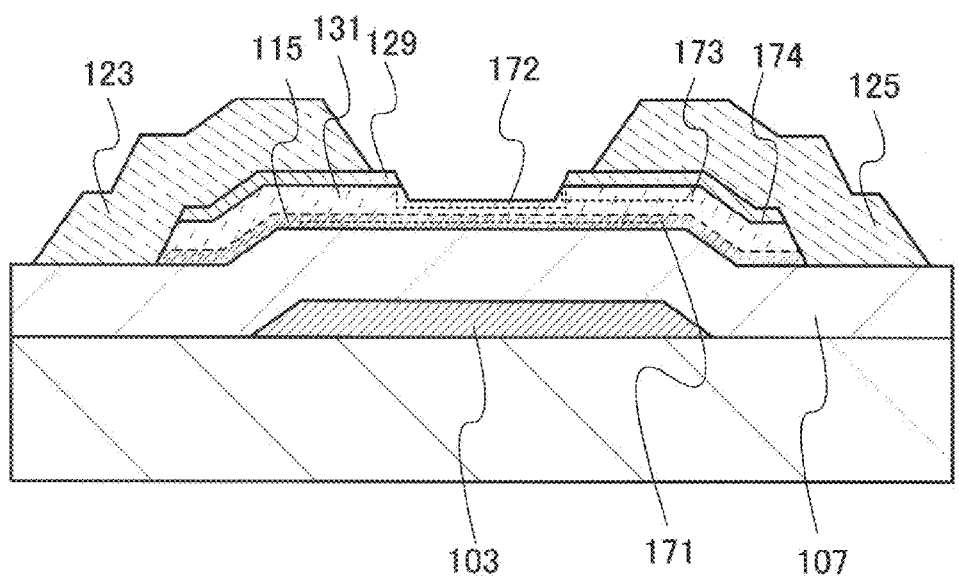

FIGS. 1A and 1B are cross-sectional views of a thin film transistor according to this embodiment. A thin film transistor illustrated in FIG. 1A includes a gate electrode layer 103 over a substrate 101; a gate insulating layer 107 covering the gate electrode layer 103; a semiconductor layer 115 which is provided over and in contact with the gate insulating layer 107 and serves as a channel formation region; a buffer layer 131 over the semiconductor layer 115; and source and drain regions 129 which are provided over and in contact with part of the buffer layer 131. In addition, the thin film transistor includes a wiring layer 123 and a wiring layer 125 which are provided over and in contact with the source and drain regions 129. The wiring layer 123 and the wiring layer 125 form a source electrode and a drain electrode. Further, each layer is patterned into a desired shape. In this embodiment, the buffer layer 131 is formed using a semiconductor layer including crystal regions in an amorphous structure.

As illustrated in FIG. 1B, in the semiconductor layer 115, a region 171 which overlaps with the gate electrode layer 103 and is provided on the gate insulating layer 107 side serves as a channel. Further, in the buffer layer 131, a region 172 which is provided on a side opposite to the gate insulating layer 107 and is not in contact with the source and drain regions 129 serves as a back channel. Further, in the buffer layer 131, a region 173 on a side which is in contact with the drain region becomes a depletion layer. Further, a region 174 where the buffer layer 131 and the source or drain region is in contact with each other is a bond region.

As the substrate 101, in addition to a glass substrate and a ceramic substrate, a plastic substrate or the like with heat resistance which can withstand a process temperature in this manufacturing process can be used. In the case where the substrate does not need a light-transmitting property, a substrate obtained by providing an insulating layer on a surface of a substrate of a metal such as a stainless steel alloy may be used. As a glass substrate, for example, an alkali-free glass substrate of barium borosilicate glass, aluminoborosilicate glass, aluminosilicate glass, or the like may be used.

The gate electrode layer 103 can be formed as a single layer or a stacked layer using a metal material such as molybdenum, titanium, chromium, tantalum, tungsten, aluminum, copper, neodymium, or scandium or an alloy material which contains any of these materials as its main component. In addition, a semiconductor layer typified by polycrystalline silicon doped with an impurity element such as phosphorus, or an AgPdCu alloy may be used.

For example, as a two-layer structure of the gate electrode layer 103, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferable. As a three-layer structure, a structure in which a tungsten layer or a tungsten nitride layer, a layer of an alloy of aluminum and silicon or an alloy of aluminum and titanium, and a titanium nitride layer or a titanium layer are stacked is preferable. When a metal layer serving as a barrier layer is stacked over a layer with low electric resistance, a metal element can be prevented from diffusing from the layer with low electric resistance into the semiconductor layer.

The gate insulating layer 107 can be formed as a single layer or a stacked layer using any of a silicon oxide layer, a silicon nitride layer, a silicon oxynitride layer, and a silicon nitride oxide layer by a CVD method, a sputtering method, or the like. By forming the gate insulating layer 107 using a silicon oxynitride layer, in the case of forming a microcrystalline semiconductor layer as the semiconductor layer 115, fluctuation in threshold voltage of the thin film transistor can be reduced.

Note that in this specification, silicon oxynitride contains more oxygen than nitrogen and, in the case where measurements are performed using Rutherford backscattering spectrometry (RBS) and hydrogen forward scattering (HFS), contains oxygen, nitrogen, silicon, and hydrogen at concentrations ranging from 50 to 70 at. %, 0.5 to 15 at. %, 25 to 35 at. %, and 0.1 to 10 at. %, respectively. Further, silicon nitride oxide contains more nitrogen than oxygen and, in the case where measurements are performed using RBS and HFS, contains oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The semiconductor layer 115 is formed using a microcrystalline semiconductor layer, an amorphous semiconductor layer, or a semiconductor layer including crystal regions in an amorphous structure. As a microcrystalline semiconductor layer, an amorphous semiconductor layer, or a semiconductor layer including crystal regions in an amorphous structure, silicon, germanium, or silicon germanium can be used. Note that phosphorus imparting n-type conductivity or boron imparting p-type conductivity may be added to the semiconductor layer 115. A metal element which reacts with silicon to form a silicide, such as titanium, zirconium, hafnium, vanadium, niobium, tantalum, chromium, molybdenum, tungsten, cobalt, nickel, or platinum, may also be added to the semiconductor layer 115. When phosphorus imparting n-type conductivity, boron imparting p-type conductivity, a metal element which reacts with silicon to form a silicide, or the like is added to the semiconductor layer 115, the carrier mobility of the semiconductor layer can be increased. Thus, the field-effect mobility of a thin film transistor in which the above semiconductor layer serves as a channel formation region can be increased. The thickness of the semiconductor layer 115 is preferably 3 to 100 nm, more preferably 5 to 50 nm.

Figure 2A:
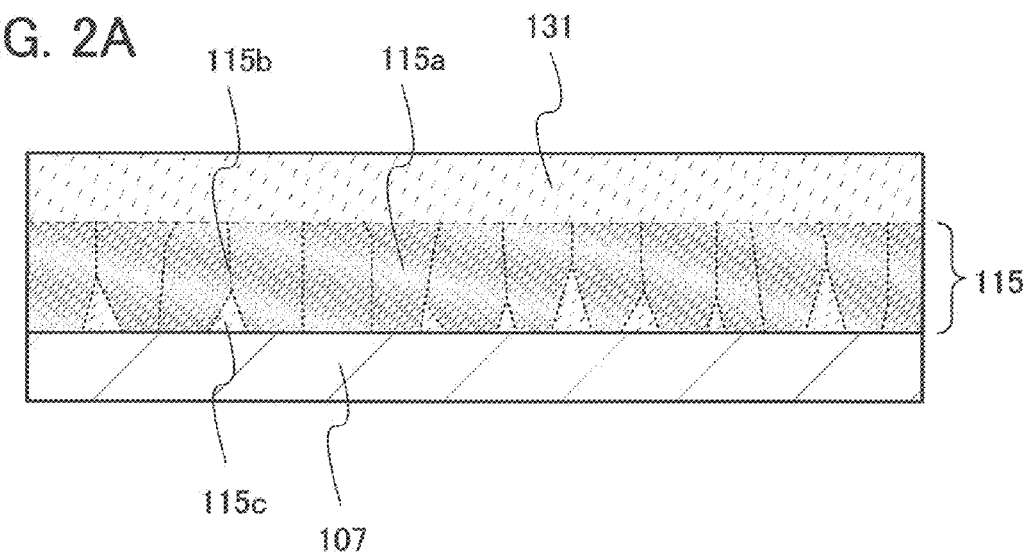
FIGS. 2A to 2C are explanatory views of a semiconductor layer included in a thin film transistor according to an embodiment of the present invention.

A microcrystalline semiconductor layer is a layer including a semiconductor having an intermediate structure between amorphous and crystalline (including single crystal and polycrystalline) structures. A microcrystalline semiconductor is a semiconductor having a third state that is stable in terms of free energy and a crystalline semiconductor having short-range order and lattice distortion, in which columnar or needle-like crystals 115a having a crystal grain diameter of 2 to 200 nm inclusive, preferably 10 to 80 nm inclusive, more preferably 20 to 50 nm inclusive have grown in a direction normal to the substrate surface. Therefore, a crystal grain boundary 115b is formed at the interface between the columnar or needle-like crystals 115a. Further, an amorphous structure 115c exists between the columnar or needle-like crystals 115a (FIG. 2A).

Further, the concentrations of oxygen and nitrogen contained in the microcrystalline semiconductor layer, which are measured by secondary ion mass spectrometry, are preferably less than $1\times10^{18}$ atoms/cm$^3$.

Figure 2B:
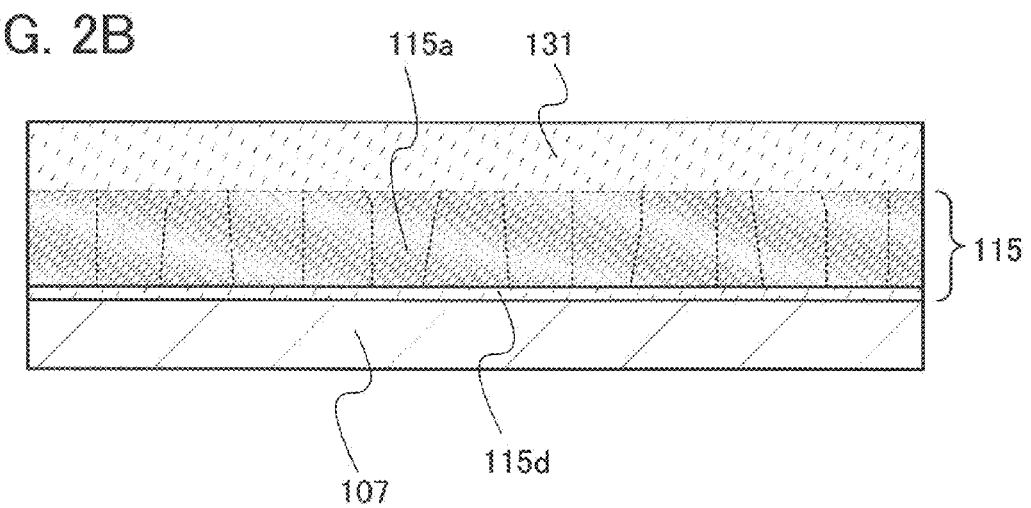

In addition, in the microcrystalline semiconductor layer, an amorphous layer 115d may be formed at the interface with the gate insulating layer 107, and the columnar or needle-like crystals 115a may be formed thereover (FIG. 2B).

Figure 2C:
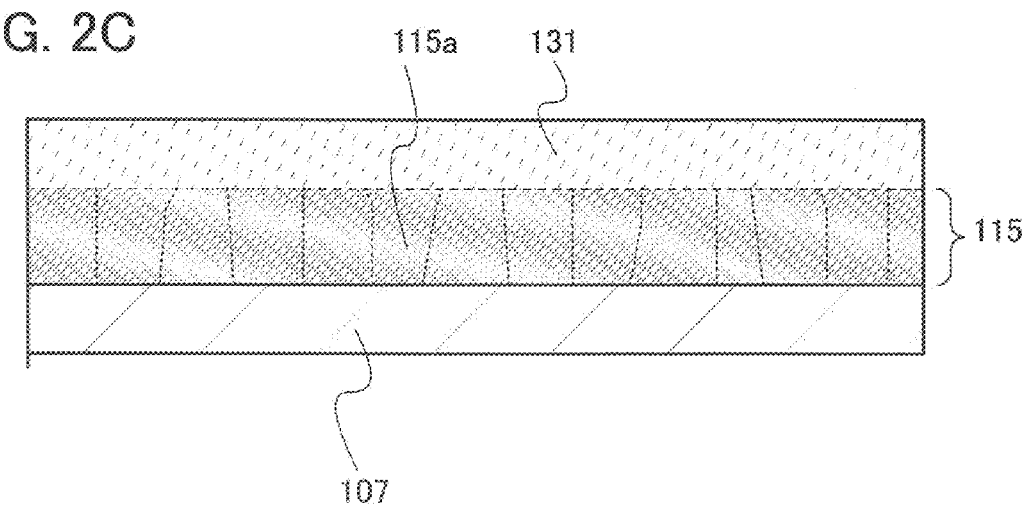

Further alternatively, as illustrated in FIG. 2C, the columnar or needle-like crystals 115a may be formed on the surface of the gate insulating layer 107 without an amorphous structure at the interface between the gate insulating layer 107 and the semiconductor layer 115. When an amorphous structure does not exist at the interface between the gate insulating layer 107 and the semiconductor layer 115, carriers flow in the columnar or needle-like crystals 115a with high crystallinity; therefore, on-current and field-effect mobility of the thin film transistor can be increased.

Microcrystalline silicon, which is a typical example of a microcrystalline semiconductor, has a Raman spectrum which is shifted to a lower wave number side than 520 cm$^{-1}$ that represents single crystal silicon. That is, the peak of the Raman spectrum of the microcrystalline silicon exists between 520 cm$^{-1}$ which represents single crystal silicon and 480 cm$^{-1}$ which represents amorphous silicon. The microcrystalline semiconductor contains hydrogen or halogen of at least 1 at. % to terminate a dangling bond. Moreover, a rare gas element such as helium, argon, krypton, or neon may be contained to further promote lattice distortion, so that stability of the structure of minute crystals is enhanced and a favorable microcrystalline semiconductor can be obtained. Such a microcrystalline semiconductor is disclosed in, for example, U.S. Pat. No. 4,409,134.

FIGS. 3A to 3D each illustrate a structure of the buffer layer 131, which is one of major features of this embodiment. The buffer layer 131 includes crystal regions in an amorphous structure. The crystal regions are conical or pyramidal crystal regions and/or minute crystal grains. In addition, the crystal regions are dispersed, that is, exist discretely. The thickness of the buffer layer 131 is preferably 50 to 350 nm, more preferably 120 to 250 nm.

In the buffer layer 131, a nitrogen concentration which is measured by secondary ion mass spectrometry is $1\times10^{20}$ to $1\times10^{21}$ cm$^{-3}$, preferably $2\times10^{20}$ to $1\times10^{21}$ cm$^{-3}$, more preferably $3\times10^{20}$ to $1\times10^{21}$ cm$^{-3}$.

A peak region of a spectrum obtained by performing low-temperature photoluminescence spectroscopy on the buffer layer 131 is 1.31 to 1.39 eV inclusive. Note that a peak region of a spectrum obtained by performing low-temperature photoluminescence spectroscopy on a microcrystalline semiconductor layer, typically a microcrystalline silicon layer is 0.98 to 1.02 eV inclusive. Therefore, the semiconductor layer including crystal regions in an amorphous structure is different from a microcrystalline semiconductor layer.

As the shapes of the conical or pyramidal crystal regions, there are a conical or pyramidal shape (inverted conical or pyramidal shape) in which the crystal region grows in a substantially radial manner from the interface between the semiconductor layer 115 and the buffer layer 131 in a deposition direction of the buffer layer 131, and a conical or pyramidal shape (regular conical or pyramidal shape) in which the width of the crystal region is narrowed from the interface between the semiconductor layer 115 and the buffer layer 131 in a deposition direction of the buffer layer 131.

First, the inverted conical or pyramidal shape will be described with reference to FIGS. 3A to 3D.

Figure 3A:
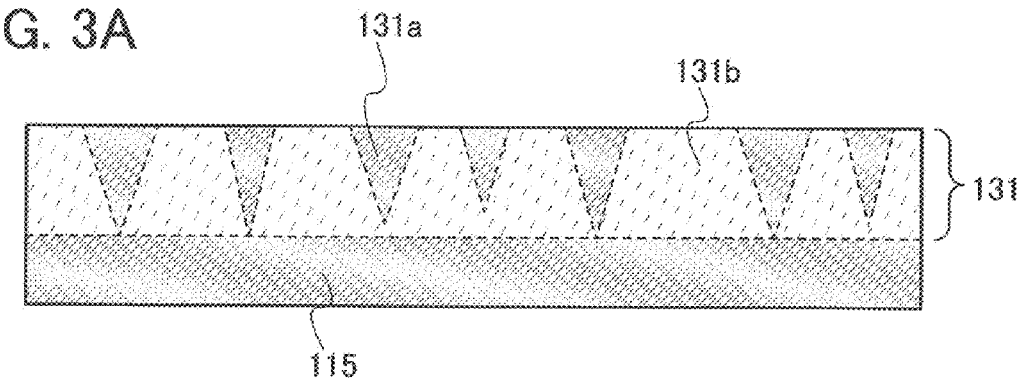
FIGS. 3A to 3D are explanatory views of a semiconductor layer included in a thin film transistor according to an embodiment of the present invention.

As illustrated in FIG. 3A, in the buffer layer 131, crystal regions 131a are dispersed, that is, exist discretely, in an amorphous structure 131b.

Each of the crystal regions 131a illustrated in FIGS. 3A to 3D has an inverted conical or pyramidal shape. The "inverted conical or pyramidal shape" here refers to a three-dimensional shape which is constructed by (i) a base including a plurality of planes, and (ii) lines linking the periphery of the base and a vertex which is located outside the base, wherein the vertex exists between the base and the substrate 101. In other words, the "inverted conical or pyramidal shape" refers to a shape obtained by the growth of the crystal region in a substantially radial manner in the deposition direction of the buffer layer 131. Each of crystal nuclei generated discretely grows along its crystallographic direction during the formation of the buffer layer, so that the crystal regions grow from the crystal nuclei so as to spread in a direction of a plane perpendicular to the deposition direction of the buffer layer 131. Further, the crystal regions 131a include a single crystal or a twin crystal.

Figures 1, 2, 3, 3B, 4:
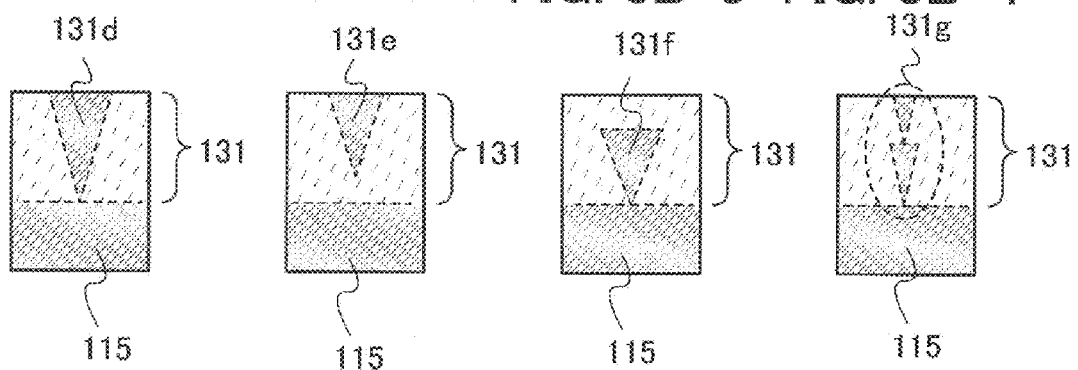
FIGS. 13A to 13B-3 are explanatory views of a semiconductor layer included in a thin film transistor according to an embodiment of the present invention.
FIGS. 30A-1 to 30B-2 are explanatory views of multi-tone masks applicable to an embodiment of the present invention.

One mode of the crystal region included in the buffer layer is illustrated in FIG. 3B-1. A crystal region 131d is formed so that the vertex thereof is in contact with the semiconductor layer 115 and grows continuously in a deposition direction of the buffer layer.

Such a crystal region can be formed in such a manner that the nitrogen concentration at the early stage of the deposition of the buffer layer is set to be $1\times10^{20}$ to $1\times10^{21}$ cm$^{-3}$ inclusive, preferably $2\times10^{20}$ to $1\times10^{21}$ cm$^{-3}$ inclusive and decreased gradually in the deposition direction. When the buffer layer contains nitrogen at a concentration in the above range, the height of the crystal region can be controlled, and variation in heights of the crystal regions can be reduced. As a result, variation in characteristics of a plurality of thin film transistors can be reduced.

Another mode of the crystal region included in the buffer layer is illustrated in FIG. 3B-2. A crystal region 131e is formed so that the vertex thereof is formed with a given distance from the semiconductor layer 115 without being in contact with the semiconductor layer 115 and grows continuously in the deposition direction of the buffer layer.

Such a crystal region can be formed in such a manner that the nitrogen concentration at the early stage of the deposition of the buffer layer is set to be $3\times10^{20}$ to $1\times10^{21}$ cm$^{-3}$ inclusive and decreased gradually in the deposition direction.

Another mode of the crystal region included in the buffer layer is illustrated in FIG. 3B-3. A crystal region 131f is formed so that the vertex thereof is in contact with the semiconductor layer 115, and the growth of the crystal region 131f stops at a given point in the deposition direction of the buffer layer. The amorphous structure is formed on the crystal region 131f.

Such a crystal region can be formed in such a manner that the nitrogen concentration at the early stage of the deposition of the buffer layer is set to be $1\times10^{20}$ to $1\times10^{21}$ cm$^{-3}$ inclusive, preferably $2\times10^{20}$ to $1\times10^{21}$ cm$^{-3}$ inclusive and decreased gradually in the deposition direction to grow the crystal regions and then increased to $3\times10^{20}$ to $1\times10^{21}$ cm$^{-3}$ inclusive.

Note that the vertex of the crystal region is in contact with the semiconductor layer 115 in FIG. 3B-3; however, under a condition similar to that of FIG. 3B-2, a crystal region can be obtained in which the vertex of the crystal region is not in contact with the semiconductor layer 115 and the growth of the crystal region stops at a given point in the deposition direction.

Another mode of the crystal region included in the buffer layer is illustrated in FIG. 3B-4. A structure 131g can be obtained in which a plurality of inverted conical or pyramidal crystal regions are stacked in the deposition direction.

Such a crystal region can be formed in such a manner that the nitrogen concentration at the early stage of the deposition of the buffer layer is set to be $1\times10^{20}$ to $1\times10^{21}$ cm$^{-3}$ inclusive, preferably $2\times10^{20}$ to $1\times10^{21}$ cm$^{-3}$ inclusive and decreased gradually in the deposition direction to grow the crystal region, and then increased to $3\times10^{20}$ to $1\times10^{21}$ cm$^{-3}$ inclusive and then decreased again.

Note that the vertex of the crystal region is in contact with the semiconductor layer 115 in FIG. 3B-4; however, under a condition similar to that of FIG. 3B-2, a structure can be obtained in which the vertex of the crystal region is not in contact with the semiconductor layer 115.

Note that the crystal regions 131a and 131d to 131g contain nitrogen. In some cases, the crystal regions 131a and 131d to 131g contain an NH group or an NH$_2$ group. In addition, the amorphous structure 131b contains nitrogen. In some cases, the amorphous structure 131b contains an NH group or an NH$_2$ group.

Figure 3C:
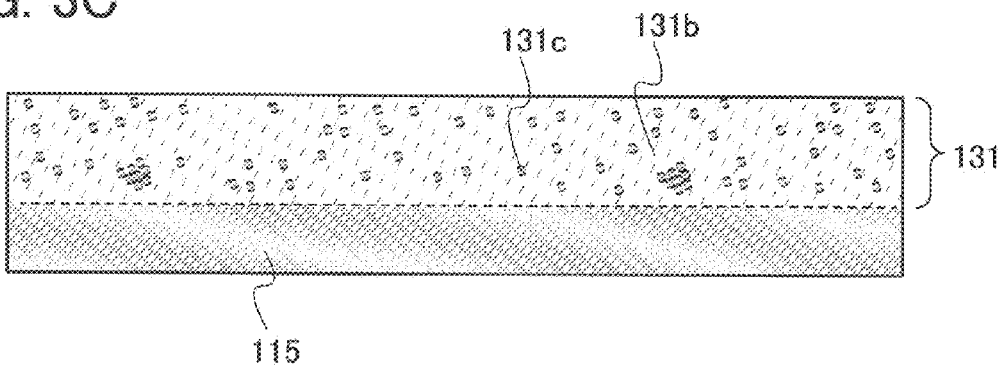

In addition, the buffer layer 131 has a mode in which minute crystal grains 131c are dispersed in the amorphous structure 131b as illustrated in FIG. 3C. The minute crystal grain 131c is a crystal grain having a minute size which cannot be a crystal nucleus for the crystal region. The size of the minute crystal grain 131c is typically 1 to 10 nm inclusive, preferably 1 to 5 nm inclusive. The minute crystal grain can be formed by controlling the nitrogen concentration in the buffer layer 131. A large amount of nitrogen is likely to be segregated on the outer side of the minute crystal grain, that is, on the side which is in contact with the amorphous structure 131b. Therefore, a large amount of nitrogen, preferably an NH group or an NH$_2$ group exists at the interface between the minute crystal grain 131c and the amorphous structure 131b in some cases.

Note that the minute crystal grains 131c may be dispersed in the buffer layer 131. Alternatively, the minute crystal grains 131c may be aggregated in the buffer layer 131. Further alternatively, the dispersed minute crystal grains 131c and the aggregated minute crystal grains 131c may both exist.

Figure 3D:
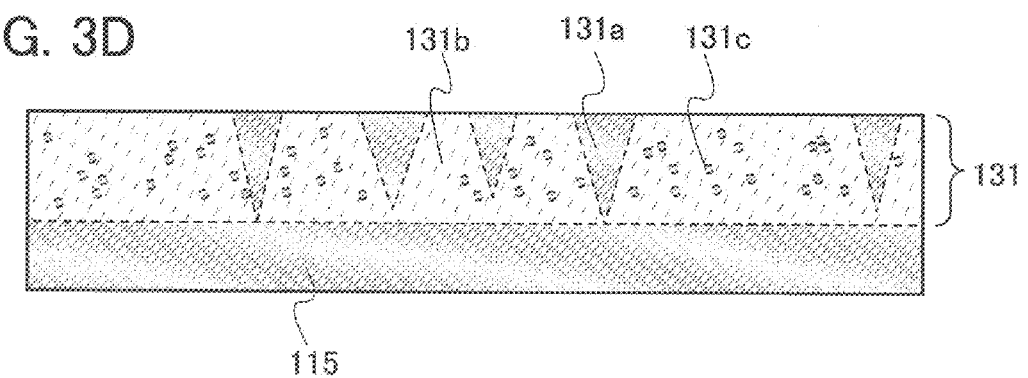

In addition, as illustrated in FIG. 3D, the buffer layer 131 has a mode in which the crystal regions 131a and the minute crystal grains 131c are dispersed in the amorphous structure 131b.

Note that the minute crystal grain 131c contains nitrogen. In some cases, the minute crystal grain 131c contains an NH group or an NH$_2$ group.

Next, a crystal region having the regular conical or pyramidal shape will be described with reference to FIGS. 4A to 4D.

Figure 4A:
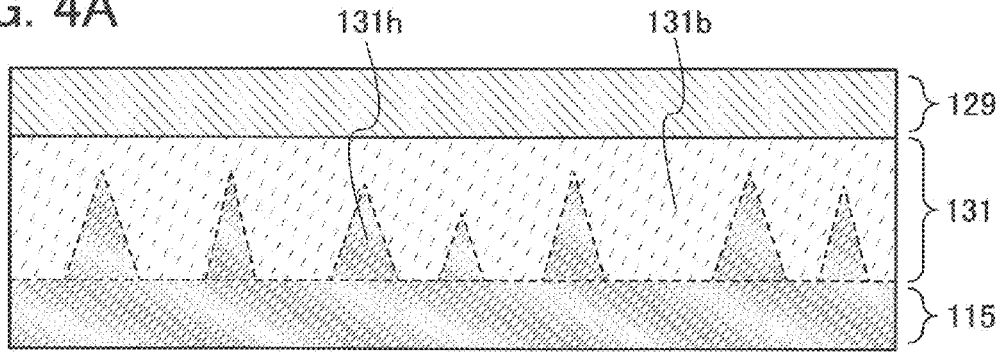
FIGS. 4A to 4D are explanatory views of a semiconductor layer included in a thin film transistor according to an embodiment of the present invention.

As illustrated in FIG. 4A, the buffer layer 131 including regular conical or pyramidal crystal regions 131h in an amorphous structure 131b is formed over the semiconductor layer 115. In the buffer layer 131, the crystal regions 131h are dispersed, that is, exist discretely, in the amorphous structure 131b.

Figure 4B:
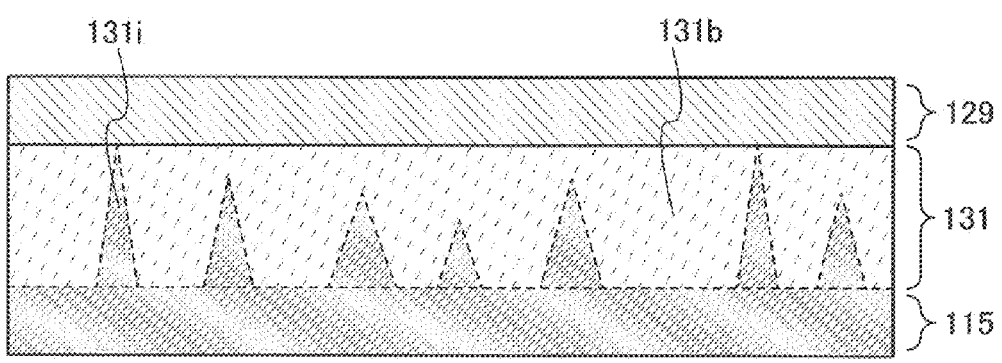
Figure 4C:
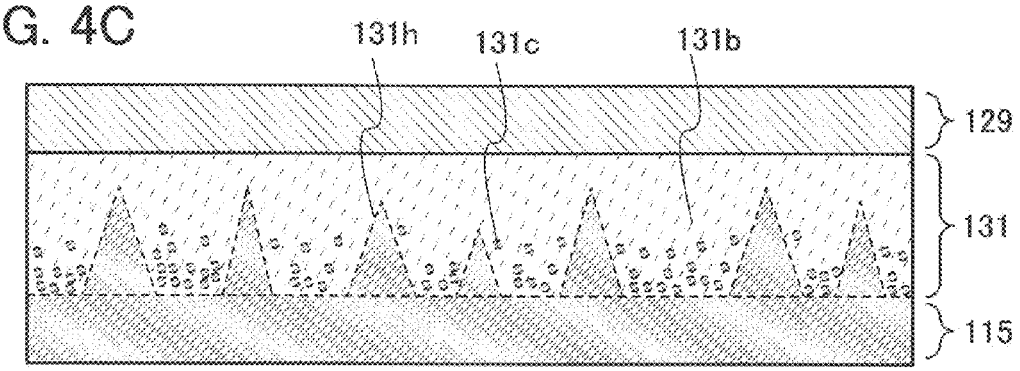

Each of the crystal regions 131h illustrated in FIGS. 4A to 4D has a regular conical or pyramidal shape. The "regular conical or pyramidal shape" here refers to a three-dimensional shape which is constructed by (i) a base including a plurality of planes, and (ii) lines linking the periphery of the base and a vertex which is located outside the base, wherein the vertex exists between the base and the source and drain regions 129. In other words, the "regular conical or pyramidal shape" refers to a shape obtained by reduction in width of the crystal region in the deposition direction of the buffer layer 131. When the semiconductor layer 115 is a microcrystalline semiconductor layer or a crystalline semiconductor layer, by depositing the buffer layer 131 under the condition in which part of the crystal region grows with the semiconductor layer 115 as a seed crystal, the crystal region 131h grows so that its width is narrowed. In FIGS. 4A to 4C, the semiconductor layer 115 and the crystal regions 131h are illustrated to be in contact with each other as denoted by dashed lines, but part of the semiconductor layer 115 grows to be the crystal region 131*h*. Further, the crystal regions 131*h* include a single crystal or a twin crystal.

One mode of the crystal region included in the buffer layer is illustrated in FIG. 4A. The bottom of the crystal region 131*h* is in contact with the semiconductor layer 115 and the vertex of the crystal region 131*h* is in the amorphous structure 131*b*.

Such a crystal region can be formed in such a manner that the nitrogen concentration during the deposition of the buffer layer is set to be $1\times10^{20}$ to $1\times10^{21}$ cm$^{-3}$ inclusive, preferably $2\times10^{20}$ to $1\times10^{21}$ cm$^{-3}$ inclusive.

Another mode of the crystal region included in the buffer layer is illustrated in FIG. 4B. The vertex of a crystal region 131*i* is in contact with the source region or the drain region 129. In such a case, it is preferable that the proportion of the crystal regions 131*i* be low in the amorphous structure 131*b*. Accordingly, off-current of the thin film transistor can be reduced.

Such a crystal region can be formed in such a manner that the nitrogen concentration during the deposition of the buffer layer is set to be preferably $1\times10^{20}$ to $1\times10^{21}$ cm$^{-3}$ inclusive, more preferably $2\times10^{20}$ to $1\times10^{21}$ cm$^{-3}$ inclusive.

Note that the crystal regions 131*h* and 131*i* contain nitrogen. In some cases, the crystal regions 131*h* and 131*i* contain an NH group or an NH$_2$ group. In addition, the amorphous structure 131*b* contains nitrogen. In some cases, the amorphous structure 131*b* contains an NH group or an NH$_2$ group.

Another mode of the crystal region included in the buffer layer is illustrated in FIG. 4C. The crystal regions 131*h* or the crystal regions 131*i* and minute crystal grains 131*c* are dispersed in the amorphous structure 131*b*.

With any of the above structures, resistance of the buffer layer 131 in a vertical direction of when voltage is applied to the source region or the drain region, that is, resistance between the semiconductor layer and the source region or the drain region, can be reduced, whereby on-current of the thin film transistor can be increased. In particular, by providing the semiconductor layer including crystal regions in an amorphous structure as the buffer layer directly under the source region and the drain region, on-current of the thin film transistor can be increased.

Figure 4D:
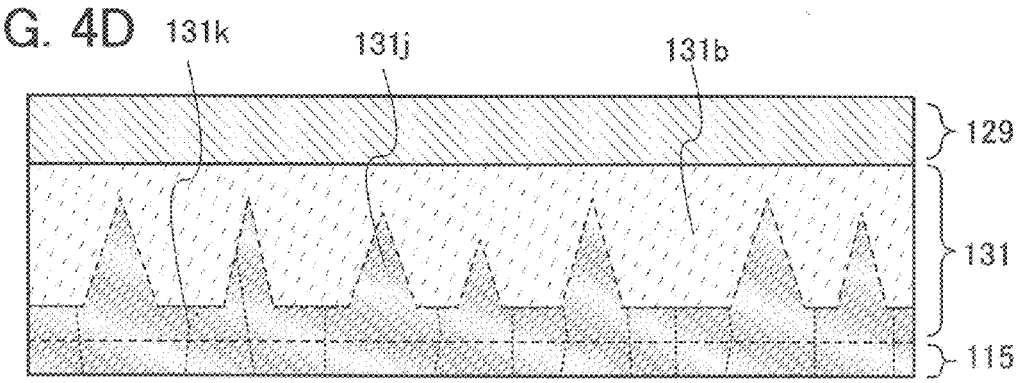

In addition, in FIGS. 4A to 4C, the interface between the semiconductor layer 115 and the buffer layer 131 is formed with the crystal regions 131*h* and the amorphous structure 131*b*. However, when the semiconductor layer 115 is a microcrystalline semiconductor layer, the interface between the semiconductor layer 115 and the buffer layer 131 is a crystal region in some cases as illustrated in FIG. 4D. This is because, when the buffer layer 131 is formed, the microcrystalline semiconductor layer which is the semiconductor layer 115 serves as a seed crystal so that the crystal regions grow at the early stage of the deposition of the buffer layer 131, whereby the crystal regions grow at the entire surface of the semiconductor layer 115. After that, the crystallinity is gradually controlled, and a crystal region 131*j* which has a regular conical or pyramidal shape is formed.

In this case, the crystal region 131*j* contains nitrogen. In some cases, the crystal region 131*j* contains an NH group or an NH$_2$ group. In addition, the amorphous structure 131*b* contains nitrogen. In some cases, the amorphous structure 131*b* contains an NH group or an NH$_2$ group.

Note that in FIGS. 4A to 4D, the distance from the interface between the gate insulating layer 107 and the semiconductor layer 115 to the vertex of the crystal regions 131*h* to 131*j* is preferably 3 to 410 nm, more preferably 20 to 100 nm. As an impurity element which reduces or suppresses generation of crystal nuclei, oxygen and nitrogen can be given, and an impurity element (e.g., nitrogen) in silicon which does not trap carriers is selected. On the other hand, the concentration of an impurity element (e.g., oxygen) which reduces the coordination number of silicon and generates dangling bonds is reduced. Therefore it is preferable to reduce the oxygen concentration without reducing the nitrogen concentration. Specifically, it is preferable that the oxygen concentration which is measured by secondary ion mass spectrometry be less than or equal to $5\times10^{18}$ cm$^{-3}$.

Further, it is preferable that the nitrogen concentration be a concentration at which the buffer layer maintains a semiconductor property, dangling bonds are reduced, and carrier mobility is increased. When the nitrogen concentration is too high, a semiconductor property is lowered, resulting in increase in insulating property, and thus on-current is reduced. In addition, when the nitrogen concentration is too low, similarly to a conventional amorphous semiconductor layer, the carrier mobility is not increased and the defect levels of the buffer layer are increased.

As described above, the conical or pyramidal crystal regions exist discretely. Control of density of crystal nucleation is necessary so that the crystal regions exist discretely. Control of the nitrogen concentration enables the density of crystal nucleation in the crystal regions to be controlled and enables the crystal regions to exist discretely. In addition, since the crystal regions exist discretely in a direction of the source and drain regions in the buffer layer, that is, in the channel length direction, off-current can be reduced. In particular, since the crystal regions exist discretely in the buffer layer in the channel length direction between the source region and the drain region, off-current can be reduced.

As the source and drain regions 129, a semiconductor layer to which an impurity element imparting one conductivity type is added (hereinafter referred to as an impurity semiconductor layer) is formed. In the case of forming an n-channel thin film transistor, phosphorus may be used as an impurity element imparting one conductivity type. The thin film transistor is typically formed using amorphous silicon or microcrystalline silicon which contains phosphorus. In the case of forming a p-channel thin film transistor, boron may be used as an impurity element imparting one conductivity type. The thin film transistor is formed typically using amorphous silicon or microcrystalline silicon which contains boron.

By setting the concentration of an impurity element imparting one conductivity type, here, phosphorus or boron, to $1\times10^{19}$ to $1\times10^{21}$ cm$^{-3}$, an ohmic contact with the wiring layers 123 and 125 can be obtained, and the impurity semiconductor layer serves as the source and drain regions.

The source and drain regions 129 are formed to have a thickness of 10 to 100 nm inclusive, preferably, 30 to 50 nm inclusive. When the thickness of the source and drain regions 129 is made small, throughput can be increased.

The wiring layers 123 and 125 can be formed as a single layer or a stacked layer using any of aluminum, copper, titanium, neodymium, scandium, molybdenum, chromium, tantalum, tungsten, and the like. An aluminum alloy to which an element to prevent a hillock is added (e.g., an aluminum-neodymium alloy which can be used for the gate electrode layer 103) may also be used. Alternatively, crystalline silicon to which an impurity element serving as a donor is added may be used. The wiring layers 123 and 125 may have a stacked-layer structure in which a layer on the side which is in contact with the crystalline silicon to which an impurity element serving as a donor is added is formed using titanium, tantalum, molybdenum, tungsten, or a nitride of any of these elements and aluminum or an aluminum alloy is formed thereover. Alternatively, another stacked-layer structure may be employed in which an upper surface and a lower surface of a layer of aluminum or an aluminum alloy are sandwiched between titanium, tantalum, molybdenum, tungsten, or a nitride of any of these elements. For example, the wiring layers 123 and 125 preferably have a three-layer structure in which an aluminum layer is sandwiched between molybdenum layers.

According to this embodiment, as compared to a thin film transistor in which an amorphous semiconductor is included in a channel formation region, on-current of a thin film transistor can be increased. In addition, as compared to a thin film transistor in which a microcrystalline semiconductor is included in a channel formation region, off-current of a thin film transistor can be reduced.

Now, the semiconductor layer including crystal regions in an amorphous structure, which is one of major features of the present invention, will be described.

The semiconductor layer including crystal regions in an amorphous structure contains an NH group with which dangling bonds of a Si atom are cross-linked in some cases. Alternatively, the semiconductor layer including crystal regions in an amorphous structure contains an $NH_2$ group with which dangling bonds of a Si atom are terminated in some cases. These cases are described below.

A conventional amorphous semiconductor has no constantly repeated patterns in the structure like a crystal lattice. Therefore, many dangling bonds are included and regions including the dangling bonds become defects. The regions are portions where carriers are trapped, and the carrier mobility is reduced. However, in the semiconductor layer including crystal regions in an amorphous structure described in this embodiment, the dangling bonds are cross-linked with an NH group, or dangling bonds of a Si atom are terminated with an $NH_2$ group, so that the number of dangling bonds is reduced in the semiconductor layer including crystal regions in an amorphous structure, in some cases. That is, defect levels are reduced. Further, when dangling bonds are cross-linked with an NH group, the bonding portion can be a carrier path, and thus carrier mobility is increased as compared to a conventional amorphous semiconductor layer. As a result, in the case of using the semiconductor layer including crystal regions in an amorphous structure as the buffer layer of the thin film transistor, on-current and field-effect mobility of the thin film transistor can be increased and off-current thereof can be reduced.

Note that "dangling bonds of a Si atom in a semiconductor layer are cross-linked with an NH group" means that different bonds of the NH group are used for bonding with different semiconductor elements in the semiconductor layer. Therefore, a first bond of an N atom is used for bonding with an H atom, a second bond of the N atom is used for bonding with a first semiconductor atom, and a third bond of the N atom is used for bonding with a second semiconductor atom. In addition, "dangling bonds of a Si atom in a semiconductor layer are terminated with an $NH_2$ group" means that an $NH_2$ group is bonded to the Si atom in the semiconductor layer. Therefore, the first bond and the second bond of the N atom are used for bonding with different H atoms and the third bond of the N atom is used for bonding with a Si atom.

A model is described below. In the model, when an NH group is coupled to a dangling bond of a silicon atom outside the above-mentioned conical or pyramidal crystal region, i.e., at the interface between the conical or pyramidal crystal region and the amorphous structure (e.g., the interface between the crystal region 131*a* and the amorphous structure 131*b* illustrated in FIG. 3A), outside the minute crystal grain, i.e., at the interface between the minute crystal grain and the amorphous structure (e.g., the interface between the minute crystal grain 131*c* and the amorphous structure 131*b* illustrated in FIG. 3C), at the grain boundary of the minute crystal grains (e.g., the interface between the minute crystal grains 131*c* illustrated in FIG. 3C), at the interface between the semiconductor layer and the buffer layer (e.g., the interface between the semiconductor layer 115 and the buffer layer 131 illustrated in FIG. 3A), at the interface between the crystal regions included in the buffer layer (e.g., a crystal grain boundary 131*k* illustrated in FIG. 4D), and the like, defect levels disappear, and carriers easily flow.

Figure 5:
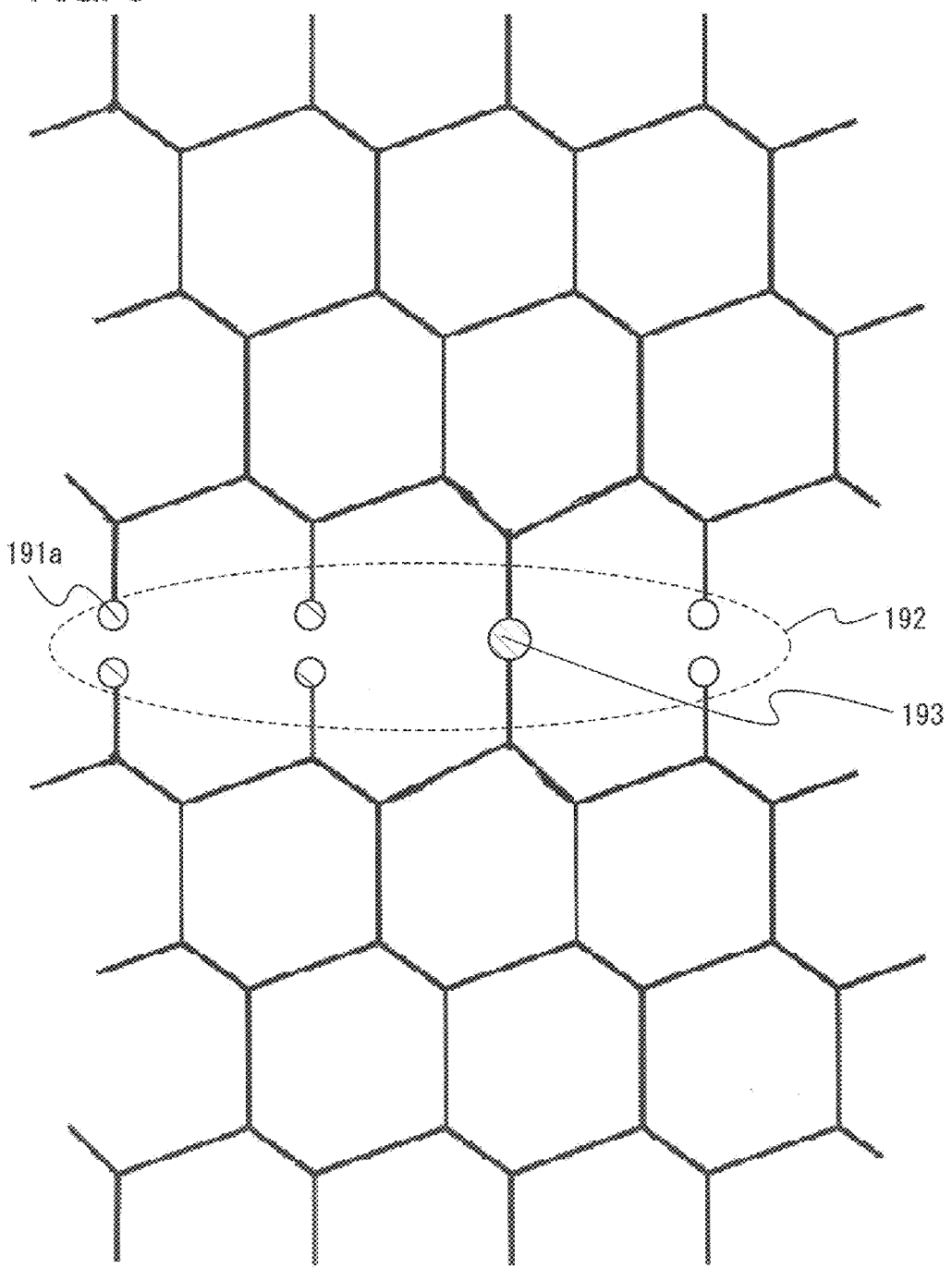
FIG. 5 is an explanatory diagram of a semiconductor layer included in a thin film transistor according to an embodiment of the present invention.
Figure 6:
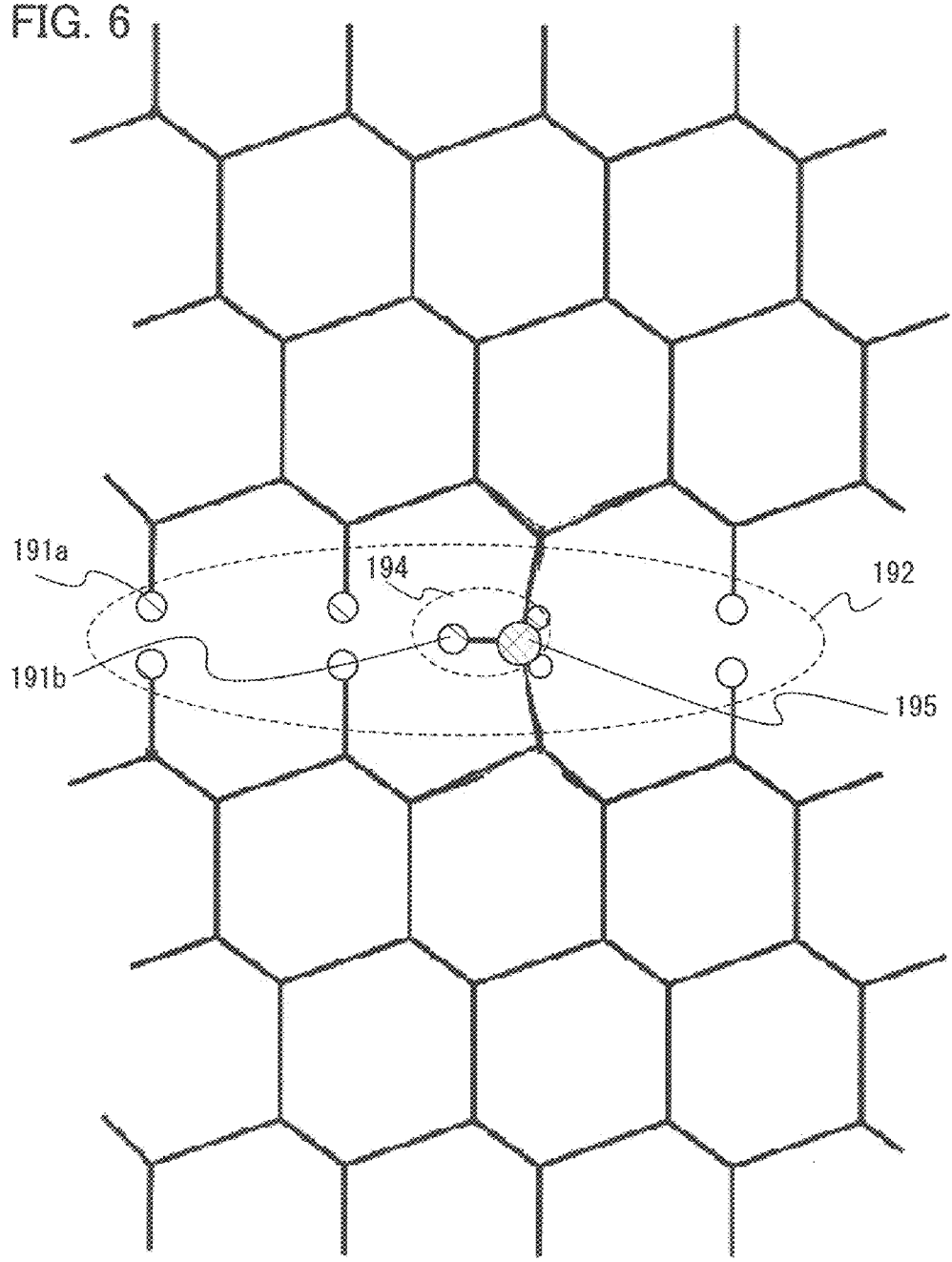
FIG. 6 is an explanatory diagram of a semiconductor layer included in a thin film transistor according to an embodiment of the present invention.

Simulation of LUMO (lowest unoccupied molecular orbital) of a silicon layer, which is a level at which n-type carriers transfer (that is, the lowest level in a conduction band), is performed in each of a model (model 1) in which one pair of dangling bonds are cross-linked with an O atom 193 in a silicon layer having a crystal grain boundary 192 in which dangling bonds of a Si atom are terminated with H atoms 191*a* as illustrated in FIG. 5, and a model (model 2) in which one pair of dangling bonds are cross-linked with an NH group 194 in a silicon layer having a crystal grain boundary 192 in which dangling bonds of a Si atom are terminated with H atoms 191*a* as illustrated in FIG. 6. As software for the simulation, first principle calculation software employing a density functional theory is used. Note that the NH group 194 is indicated by a nitrogen atom 195 and hydrogen atoms 191*b* in FIG. 6. Further, an intersection of lines indicates a silicon atom and the line indicates a bond or a dangling bond of the silicon atom. Further, in order to evaluate effectiveness of the oxygen atom and the NH group, the dangling bonds other than the dangling bond cross-linked with the oxygen atom or the NH group are all terminated with the hydrogen atoms.

Figure 7:
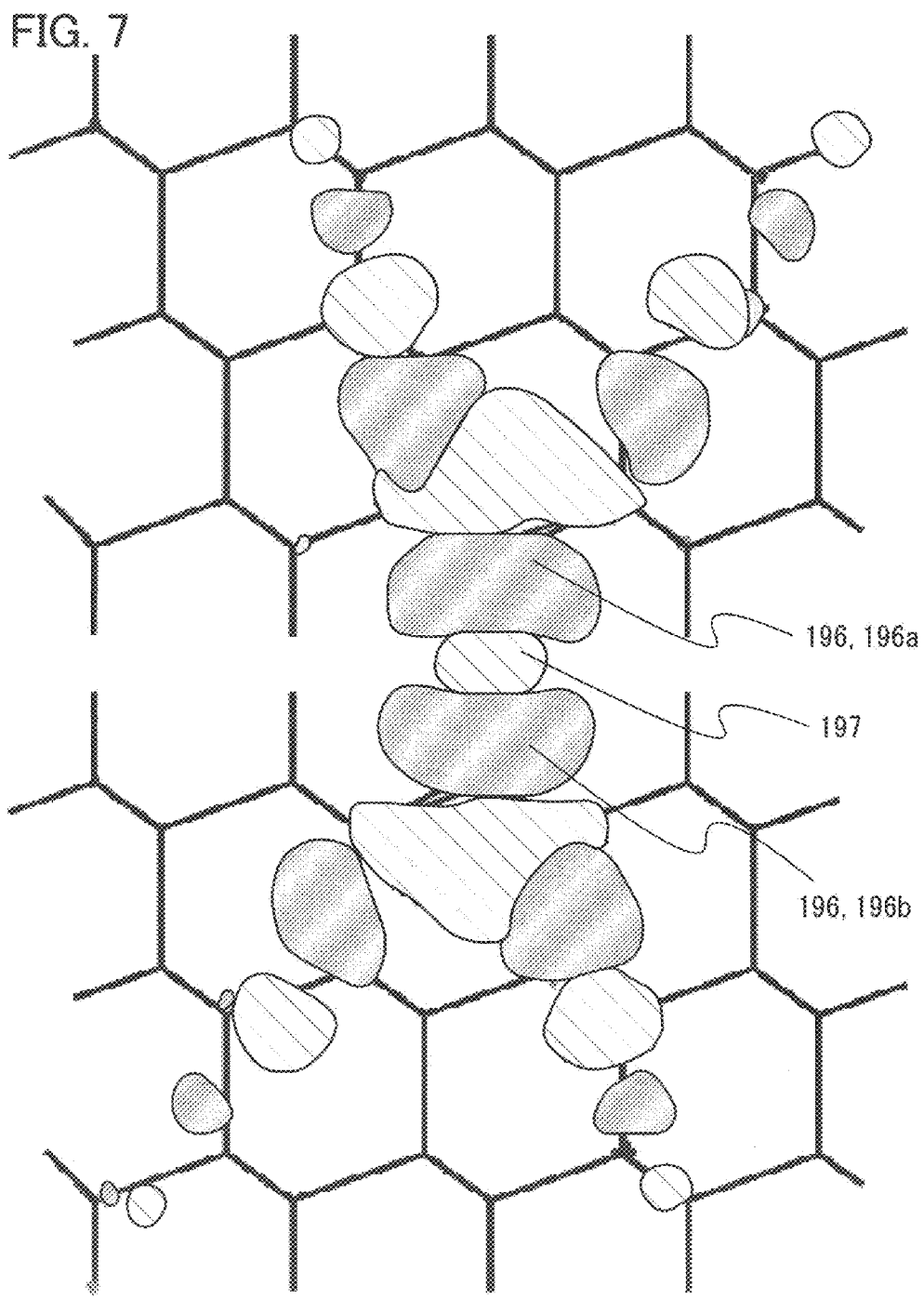
FIG. 7 is an explanatory diagram of a semiconductor layer included in a thin film transistor according to an embodiment of the present invention.
Figure 8:
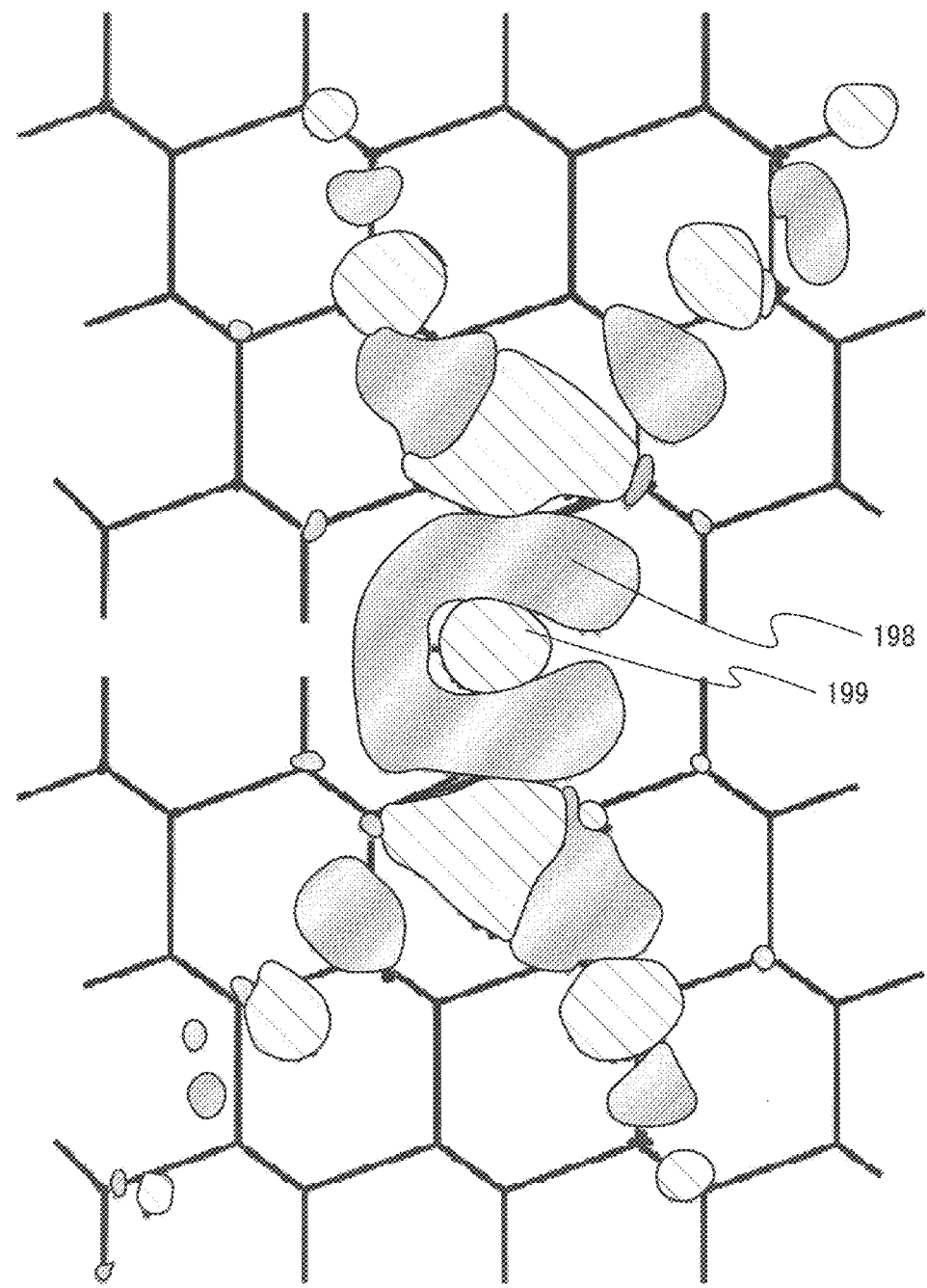
FIG. 8 is an explanatory diagram of a semiconductor layer included in a thin film transistor according to an embodiment of the present invention.

FIG. 7 illustrates a calculation result obtained by using the model 1 and FIG. 8 illustrates a calculation result obtained by using the model 2.

FIG. 7 illustrates a shape of a wave function at a region where dangling bonds of the Si atom are cross-linked with the O atom and in the periphery of the region. A wave function 196 and a wave function 197 indicate regions whose phases are positive and negative, respectively (or negative and positive, respectively) and whose absolute values are the same. FIG. 8 illustrates a shape of a wave function at a region where dangling bonds of the Si atom are cross-linked with the NH group and in the periphery of the region. A wave function 198 and a wave function 199 indicate regions whose phases are positive and negative, respectively (or negative and positive, respectively) and whose absolute values are the same.

FIG. 7 shows that in the case where the dangling bonds of the Si atoms are cross-linked with the O atom, since regions whose absolute values and whose phases of the wave function are the same (for example, wave functions 196*a* and 196*b*) are separated, carriers do not easily flow. That is, when the silicon layer contains oxygen, a bonding which interrupts carrier transfer is formed, whereby the carrier mobility of the silicon layer is reduced.

On the other hand, FIG. 8 shows that in the case where the dangling bonds of the Si atoms are cross-linked with the NH group, since the region 198 with the same absolute value and the same phase of the wave function between different Si atoms is connected to both the adjacent dangling bonds, carriers are likely to flow. That is, when the silicon layer contains the NH group, a bonding which facilitates the carrier transfer is formed in the dangling bonds, whereby the carrier mobility of the silicon layer is increased. Accordingly, it is considered that the mobility of the thin film transistor is improved. Note that as density of the minute crystal grains is increased, crystallinity of the semiconductor layer is increased; however, the crystal grain boundaries interrupting carrier transfer are also increased. However, when the silicon layer contains the NH group, and the dangling bonds of the Si atoms are cross-linked, the bonding becomes a path for carriers at the crystal grain boundary, whereby the carrier transfer is not interrupted.

Accordingly, in the buffer layer, by controlling the nitrogen concentration, preferably by inclusion of the NH group, dangling bonds at the interface between the crystal region and the amorphous structure, at the interface between the minute crystal grain and the amorphous structure, at the interface between the minute crystal grains, at the interface between the semiconductor layer and the buffer layer, and at the crystal grain boundary of the crystal regions included in the buffer layer, and the like are cross-linked with nitrogen or the NH group, whereby the defect levels in the buffer layer can be reduced. With the cross-linking, a bonding through which carriers can transfer is formed. In addition, since density of nuclei for the inverted conical or pyramidal crystal regions can be controlled by controlling the nitrogen concentration, the semiconductor layer can be formed, in which the inverted conical or pyramidal crystal regions exist discretely. Also, since the crystal growth can be controlled by controlling the nitrogen concentration, the semiconductor layer including regular conical or pyramidal crystal regions can be formed. Further, by increasing the density of the minute crystal grains, crystallinity of the buffer layer can be improved. Accordingly, the carrier mobility of the buffer layer can be improved.

Further, by reducing the oxygen concentration in the semiconductor layer and the buffer layer, a bonding which interrupts carrier transfer can be reduced in the defects at the interface between the crystal region and the amorphous structure at the interface between the minute crystal grain and the amorphous structure, at the interface between the minute crystal grains, at the interface between the semiconductor layer and the buffer layer, at the crystal grain boundary of the crystal regions included in the buffer layer, or at the crystal grain boundary included in the semiconductor layer.

In this manner, by reducing the oxygen concentration, controlling the nitrogen concentration, and further inclusion of the NH group in the semiconductor layer, dangling bonds at the interface between the crystal region and the amorphous structure, at the interface between the minute crystal grain and the amorphous structure, at the interface between the minute crystal grains, at the interface between the semiconductor layer and the buffer layer, at the crystal grain boundary of the crystal regions included in the buffer layer, or the like are reduced. Therefore, as compared to a thin film transistor in which an amorphous semiconductor layer is provided between a gate insulating layer and source and drain regions, on-current and field-effect mobility can be increased. Further, as compared to a thin film transistor in which a microcrystalline semiconductor layer is provided between a gate insulating layer and source and drain regions, off-current can be reduced.

A space between the adjacent crystal regions is filled with the amorphous structure, that is, the crystal regions exist discretely and are not in contact with adjacent crystal regions. With such a structure, resistance of the buffer layer in a vertical direction of when voltage is applied to the source region or the drain region, that is, resistance between the semiconductor layer and the source region or the drain region, can be reduced, whereby on-current of the thin film transistor can be increased.

In addition, since the drain withstand voltage of the thin film transistor is relieved by using the semiconductor layer including crystal regions in an amorphous structure for the buffer layer, deterioration of the thin film transistor can be reduced. Further, in the case of forming, using a microcrystalline semiconductor layer, the semiconductor layer which is in contact with the gate insulating layer, a semiconductor layer including crystal regions in an amorphous structure is used for the buffer layer, and the microcrystalline semiconductor layer and the buffer layer are formed successively, whereby the interface between the microcrystalline semiconductor and the amorphous structure in the microcrystalline semiconductor layer can be prevented from being oxidized, and thus the carrier mobility of the microcrystalline semiconductor layer can be increased.

Another mode of the semiconductor layer including crystal regions in an amorphous structure will be described below. Here, the case where the semiconductor layer including crystal regions in an amorphous structure contains an $NH_2$ group will be described.

In order to examine the mechanism of off-current reduction in a model in which dangling bonds of a Si atom were terminated with an $NH_2$ group, a defect level and bond energy were simulated using first principle calculation. As software for the simulation, CASTEP (software of first principle calculation) produced by Accelrys Software Inc. was used.
(Defect Level)

First, a defect level is described. Here, it was considered that off-current was mainly caused due to Shockley-Read-Hall current. According to Shockley-Read-Hall mechanism, the recombination probability U of carriers is expressed by the following equation (1).

$$U = \sigma v_{th} N_t \frac{pn - n_i^2}{(n + p) + 2n_i \cosh\left(\frac{E_t - E_i}{kT}\right)} \quad \text{[Equation 1]}$$

In the above equation, σ denotes a capture cross-section for an electron and a hole, $v_{th}$ denotes thermal velocity of a carrier, $N_t$ denotes trap density, $E_t$ denotes a trap level, $E_i$ denotes intrinsic Fermi energy, $n_i$ denotes intrinsic carrier density, p denotes p-type carrier density, and n denotes n-type carrier density. −U means generation probability of carriers.

In the case of pn>$n_i^2$, carriers are recombined with a probability U, and in the case of pn<$n_i^2$, carriers are generated with a probability −U. It is considered that when a device is turned off, since a channel region is a depletion layer, carries are generated with a probability −U, which causes off-current. According to the equation (1), when $N_t$ is large or $E_t$ has a value close to that of $E_i$, generation probability of carriers is increased. Since the defect level acts as a trap level, off-current can be reduced by correcting the defect and decreasing $N_t$.

Figure 48:
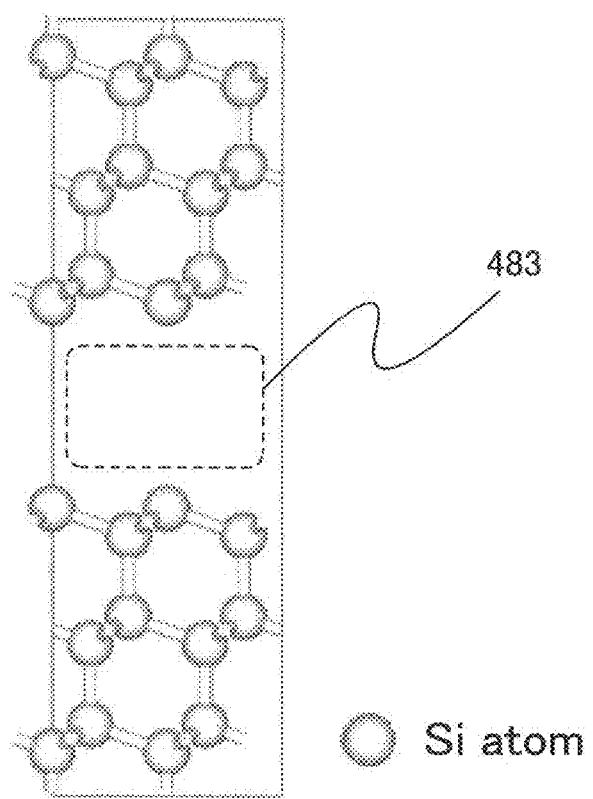
FIG. 48 is an explanatory diagram of a semiconductor layer included in a thin film transistor according to an embodiment of the present invention.

Then, a defect level of a Si crystal having a defect 483 as illustrated in FIG. 48 and correction thereof were calculated. Specifically, an atomic configuration of each of a defect structure, an H-termination structure in which a defect is terminated with an H atom, and an $NH_2$-termination structure in which a defect is terminated with an $NH_2$ group was optimized with first principle calculation, and density of states of electrons of each structure was calculated. GGA-PBE was used for a functional and an ultrasoft type was used for pseudopotential.

Figure 49A:
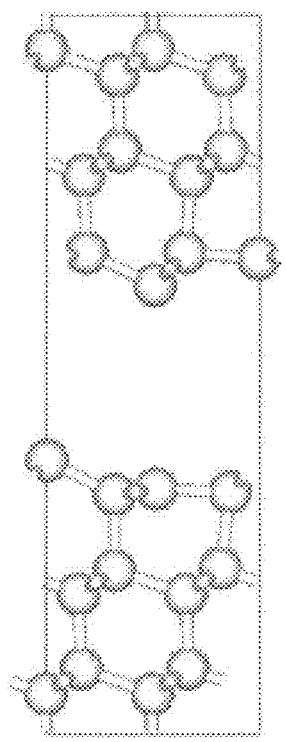
FIGS. 49A to 49C are explanatory diagrams of a semiconductor layer included in a thin film transistor according to an embodiment of the present invention.
Figure 49B:
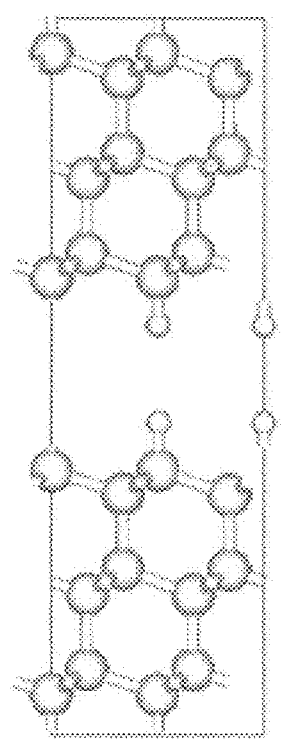
Figure 49C:
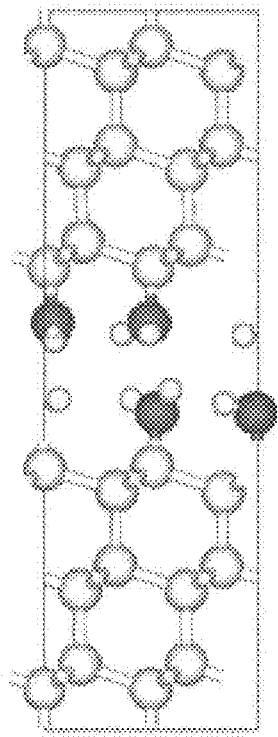

The structures after optimization are illustrated in FIGS. 49A, 49B, and 49C. FIG. 49A illustrates the defect structure, FIG. 49B illustrates the H-termination structure, and FIG. 49C illustrates the $NH_2$-termination structure. In FIG. 49A, since there are dangling bonds, atomic positions around the defect change largely for a structure which is stable in energy.

FIG. 50 shows density of states of electrons. A dashed line 491 denotes density of states of electrons in the defect structure, a narrow solid line 493 denotes density of states of electrons in the H-termination structure, and a wide solid line 495 denotes density of states of electrons in the $NH_2$-termination structure. An origin on energy is Fermi energy.

As denoted by the dashed line 491 in FIG. 50, it is found that, in the defect structure, a defect level is formed in a band gap at energy of about 0 to 1 eV. However, as denoted by the narrow solid line 493 and the wide solid line 495, the defect levels disappear in the H-termination structure and the $NH_2$-termination structure, and the defects are corrected.

That is, in the $NH_2$-termination structure, since the defects are corrected, trap levels due to the defects disappear, so that it can be said that off-current is reduced by the equation (1).
(Bond Energy)

Next, bond energy is described. According to FIG. 50, it was found that the defect levels were reduced in the $NH_2$-termination structure. However, the bond is necessary to be strong so that a state in which the defect levels are reduced is stably maintained also when a thin film transistor is driven and the thin film transistor is not deteriorated. Thus, bond energy of the $NH_2$-termination structure was calculated and stability of the bond in the $NH_2$-termination structure was compared with stability of bond in the H-termination structure.

Bond energy of termination with H in the H-termination structure illustrated in FIG. 49B can be calculated by an equation (2).

Figure 51A:
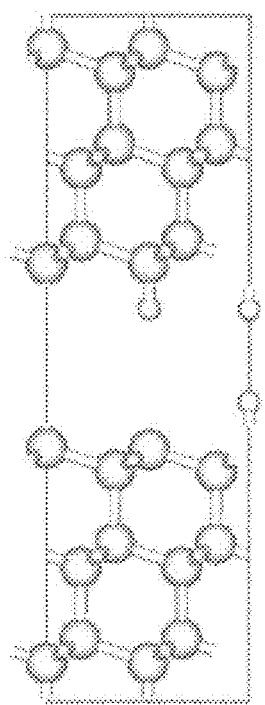
FIGS. 51A to 51D are explanatory diagrams of a semiconductor layer included in a thin film transistor according to an embodiment of the present invention.
Figure 51B:
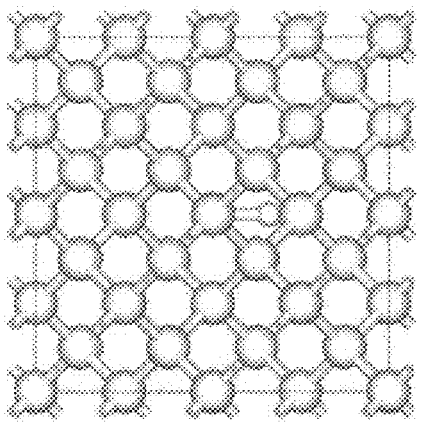

(Bond energy of termination with H)=(Energy in the optimized structure obtained by removing one H atom from the H-termination structure(FIG. 51A))+(Energy of Si:$H_{int}$(FIG. 51B))−(Energy of the H-termination structure(FIG. 51C))−(Energy of Si crystal(FIG. 51D))  (2)

Figure 51C:
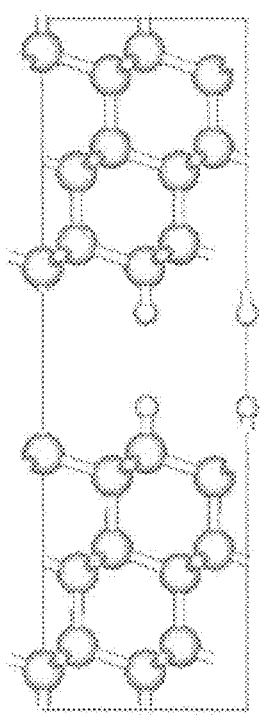
Figure 51D:
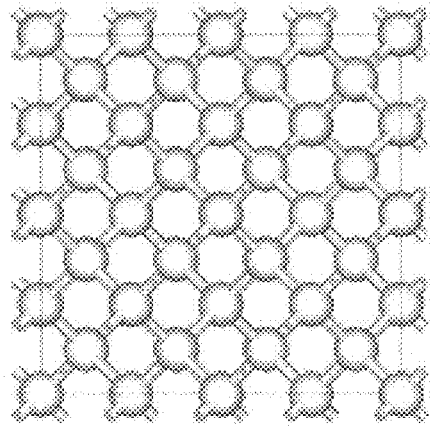

Si:$H_{int}$ indicates a state where an H atom exists between Si crystal lattices. In addition, the sum of Si atoms and H atoms in an initial state (FIG. 51A and FIG. 51B) corresponds to that in a final state (FIG. 51C and FIG. 51D).

As for bond energy of H in the $NH_2$-termination and bond energy of $NH_2$ in the $NH_2$-termination, a structure in which H or $NH_2$ exists between lattices of a Si crystal is employed as a state in which a bond is removed.

Bond energy of termination with H in the $NH_2$-termination structure illustrated in FIG. 49C can be calculated by an equation (3).

(Bond energy of termination with H)=(Energy in the optimized structure obtained by removing one H atom from the $NH_2$-termination structure)+(Energy of Si:$H_{int}$)−(Energy of the $NH_2$ termination structure)−(Energy of Si crystal)  (3)

Bond energy of termination with $NH_2$ in the $NH_2$-termination structure illustrated in FIG. 49C can be calculated by an equation (4).

(Bond energy of termination with $NH_2$)=(Energy in the optimized structure obtained by removing one $NH_2$ from the $NH_2$-termination structure)+(Energy of Si:$NH_2$)−(Energy of the $NH_2$ termination structure)−(Energy of Si crystal)  (4)

Si:$NH_2$ indicates a state where an $NH_2$ group exists between Si crystal lattices.

Each structure of terms in the equations (2) to (4) was determined by structure optimization with respect to atomic configuration, and energy was calculated. In a similar manner to the above (defect level) simulation, GGA-PBE was used for a functional and an ultrasoft type was used for pseudopotential.

Figure 52A:
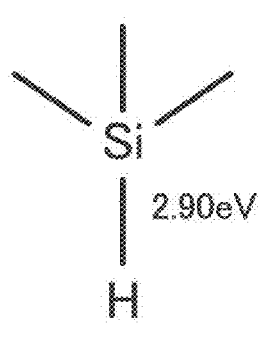
Figure 52B:
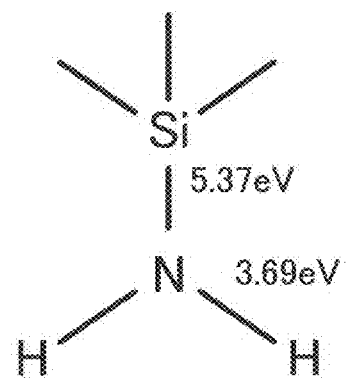

FIGS. 52A and 52B show the calculation results of bond energy along with schematic diagrams of the structures. FIG. 52A illustrates the H-termination structure in which a dangling bond of Si is terminated with H, and FIG. 52B illustrates the $NH_2$-termination structure in which a dangling bond of Si is terminated with $NH_2$. Si—H bond energy of the H-termination structure is 2.90 eV. Further, Si—N bond energy of the $NH_2$-termination structure is 5.37 eV and N—H bond energy is 3.69 eV. Two bond energies of the $NH_2$ group (Si—N bond energy and N—H bond energy) are larger than Si—H bond energy with which a dangling bond of Si is terminated with the H atom and the $NH_2$-termination structure can be said to be a stable structure. Therefore, it is found that when dangling bonds of a silicon layer are terminated with an $NH_2$ group, the $NH_2$ group bonded to Si or the H atom bonded to N is not easily dissociated, and defects are not easily generated.

According to the above (defect level) and the above (bond energy), it is found that defect levels are reduced in the silicon layer by termination of dangling bonds of the Si atom with the $NH_2$ group and off-current can be reduced. Further, it is found that since the $NH_2$ group bonded to Si has a more stable structure than the H atom bonded to Si, a thin film transistor having the silicon layer is not easily deteriorated by driving. In other words, a semiconductor layer containing an $NH_2$ group is used as the semiconductor layer including crystal regions in an amorphous structure which is used as the buffer layer, whereby off-current of the thin film transistor can be reduced.

Embodiment 2

In Embodiment 2, modes which can be used for the semiconductor layer 115 in the thin film transistor described in Embodiment 1 will be described with reference to FIG. 9 and FIGS. 10A and 10B.

Figure 9:
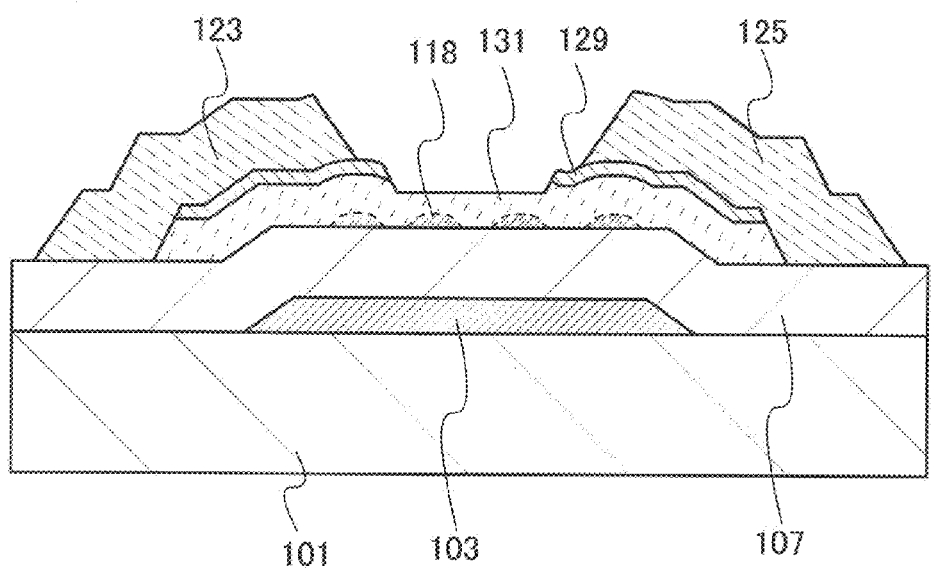
FIG. 9 is an explanatory view of an example of a thin film transistor according to an embodiment of the present invention.

In a thin film transistor described in this embodiment, dispersed microcrystalline semiconductor particles or a net-like microcrystalline semiconductor 118 are/is formed over the gate insulating layer 107 (FIG. 9).

Figure 10A:
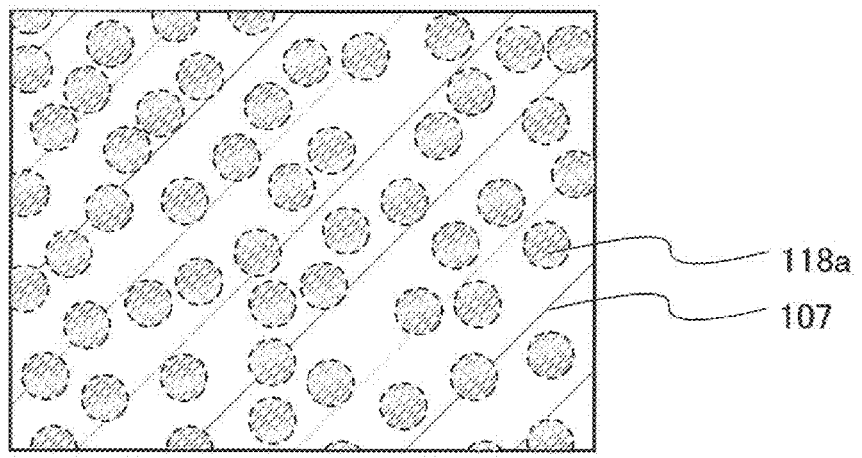
FIGS. 10A and 10B are explanatory views of a semiconductor layer included in a thin film transistor according to an embodiment of the present invention.
Figure 10B:
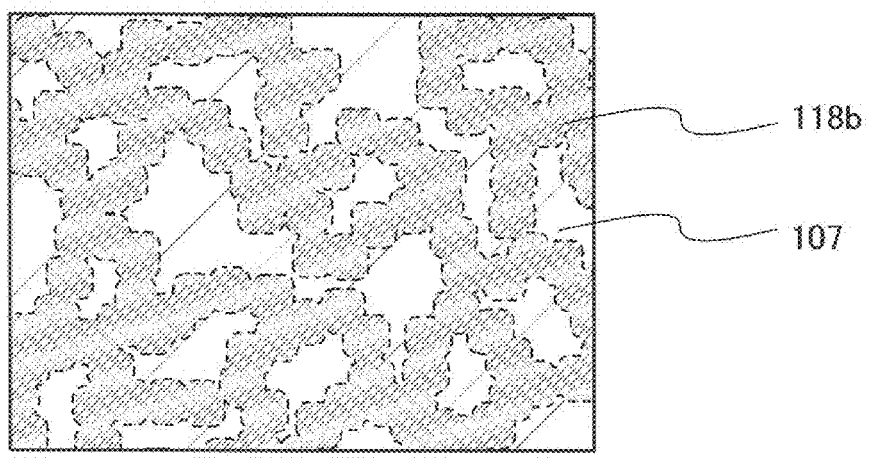

Dispersed microcrystalline semiconductor particles 118a illustrated in FIG. 10A or a net-like microcrystalline semiconductor 118b illustrated in FIG. 10B can be formed using silicon, silicon germanium ($Si_xGe_{1-x}$, 0.5<x<1) that contains more silicon than germanium, or the like. As viewed from above, each of the dispersed microcrystalline semiconductor particles 118a has a circular shape as illustrated in FIG. 10A and a cross section thereof has a hemispherical shape as illustrated in FIG. 9. When the diameter of the dispersed microcrystalline semiconductor particles viewed from above is set at 1 to 30 nm and the density thereof is set at less than $1 \times 10^{13}/cm^3$, preferably less than $1 \times 10^{10}/cm^3$, the dispersed microcrystalline semiconductor particles can be formed by only deposition.

The diameter of the dispersed microcrystalline semiconductor particles is not limited to the above and may be larger.

Further, the net-like microcrystalline semiconductor 118b has a shape in which microcrystalline semiconductors are partially continuous and portions where microcrystalline semiconductors are continuous may be arranged regularly (e.g., lattice-shape or zigzag) or irregularly. FIG. 10B illustrates a shape viewed from above in which microcrystalline semiconductors are continuous irregularly.

Such a net-like microcrystalline semiconductor 118b in which microcrystalline semiconductors are partially continuous can be formed in such a manner that an amorphous semiconductor or a microcrystalline semiconductor is formed over the gate insulating layer 107, irradiated with a laser beam having energy with such a level that the amorphous semiconductor or the microcrystalline semiconductor is melted, and melted and solidified.

The dispersed microcrystalline semiconductor particles or the net-like microcrystalline semiconductor 118 are/is formed between the gate insulating layer 107 and the buffer layer 131, whereby adhesion between the buffer layer 131 and the gate insulating layer 107 can be increased. Therefore, a yield of the thin film transistor can be enhanced.

According to this embodiment, as compared to a thin film transistor in which an amorphous semiconductor is included in a channel formation region, on-current of a thin film transistor can be increased. In addition, as compared to a thin film transistor in which a microcrystalline semiconductor is included in a channel formation region, off-current of a thin film transistor can be reduced. Further, the dispersed microcrystalline semiconductor particles or the net-like microcrystalline semiconductor are/is formed over the gate insulating layer, whereby adhesion between the gate insulating layer and the buffer layer is improved, so that the yield can be enhanced.

Embodiment 3

In Embodiment 3, a thin film transistor in which the semiconductor layer 115 of Embodiment 1 is formed using a semiconductor layer including crystal regions in an amorphous structure, that is, a thin film transistor in which the semiconductor layer including crystal regions in an amorphous structure is formed between a gate insulating layer and source and drain regions will be described with reference to FIG. 11.

FIG. 11 is a cross-sectional view of a thin film transistor according to this embodiment. A thin film transistor illustrated in FIG. 11 includes a gate electrode layer 103 over a substrate 101; a gate insulating layer 107 covering the gate electrode layer 103; a semiconductor layer 132 which is provided over and in contact with the gate insulating layer 107; and source and drain regions 129 which are in contact with part of the semiconductor layer 132. In addition, the thin film transistor includes a wiring layer 123 and a wiring layer 125 which are provided over and in contact with the source and drain regions 129. The wiring layer 123 and the wiring layer 125 form a source electrode and a drain electrode. Further, each layer is patterned into a desired shape. In this embodiment, the semiconductor layer 132 which is formed using a semiconductor layer including crystal regions in an amorphous structure is provided between the gate insulating layer 107 and the source and drain regions 129.

The semiconductor layer 132, the source and drain regions 129, and the wiring layers 123 and 125 can be formed using, as appropriate, materials similar to those of the buffer layer 131, the source and drain regions 129, and the wiring layers 123 and 125 described in Embodiment 1, respectively.

The semiconductor layer 132 which is one of major features of this embodiment will now be described. The semiconductor layer 132 in a region in contact with the gate insulating layer 107 serves as a channel formation region of the thin film transistor. Here, the semiconductor layer 132 is formed using a semiconductor layer including crystal regions in an amorphous structure. The structure of the semiconductor layer 132 is as illustrated in FIGS. 12A to 12D.

Figure 12A:
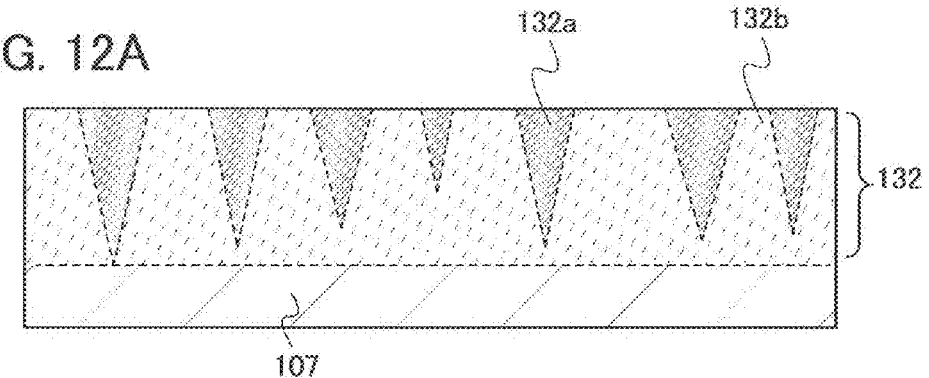
FIGS. 12A to 12D are explanatory views of a semiconductor layer included in a thin film transistor according to an embodiment of the present invention.

The semiconductor layer including crystal regions in an amorphous structure used for the semiconductor layer 132 is a layer which is formed over the gate insulating layer 107 and in which crystal regions 132a are dispersed in an amorphous structure 132b as illustrated in FIG. 12A.

The crystal region 132a has an inverted conical or pyramidal shape. In addition, the crystal regions 132a include a single crystal or a twin crystal.

Figures 1, 2, 3, 4, 12B:
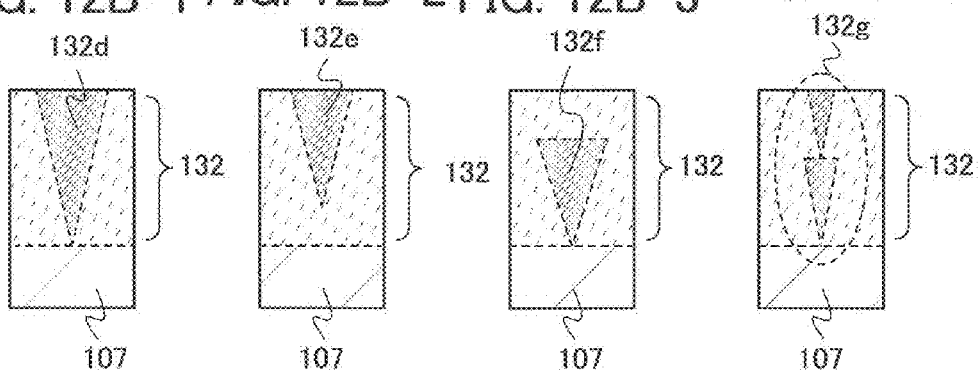

One mode of the crystal region included in the semiconductor layer including crystal regions in an amorphous structure is illustrated in FIG. 12B-1. The vertex of a crystal region 132d is in contact with the gate insulating layer 107 and the crystal region grows continuously in the deposition direction of the semiconductor layer including crystal regions in an amorphous structure.

Such a crystal region can be formed in a manner similar to that of the crystal region 131d illustrated in FIG. 3B-1.

Another mode of the crystal region included in the semiconductor layer including crystal regions in an amorphous structure is illustrated in FIG. 12B-2. The vertex of a crystal region 132e is not in contact with the gate insulating layer 107 and the crystal region grows continuously in the deposition direction of the semiconductor layer including crystal regions in an amorphous structure.

Such a crystal region can be formed in a manner similar to that of the crystal region 131e illustrated in FIG. 3B-2.

Another mode of the crystal region included in the semiconductor layer including crystal regions in an amorphous structure is illustrated in FIG. 12B-3. The vertex of a crystal region 132f is in contact with the gate insulating layer 107 and the growth of the crystal region stops at a given point in the deposition direction of the semiconductor layer including crystal regions in an amorphous structure, and the amorphous structure is formed on the crystal region 132f.

Such a crystal region can be formed in a manner similar to that of the crystal region 131f illustrated in FIG. 3B-3.

Note that the vertex of the crystal region is in contact with the gate insulating layer 107 in FIG. 12B-3; however, under the condition similar to that of FIG. 12B-2, a crystal region can be obtained in which the vertex of the crystal region is not in contact with the gate insulating layer 107 and the growth of the crystal region stops at a given point in the deposition direction.

Another mode of the crystal region included in the semiconductor layer including crystal regions in an amorphous structure is illustrated in FIG. 12B-4. A structure 132g can be obtained in which a plurality of inverted conical or pyramidal crystal regions are stacked in the deposition direction.

Such a crystal grain can be formed in a manner similar to that of the crystal region with the structure 131g illustrated in FIG. 3B-4.

Note that the vertex of the crystal region is in contact with the gate insulating layer 107 in FIG. 12B-4; however, under a condition similar to that of FIG. 12B-2, a structure can be obtained in which the vertex of the crystal region is not in contact with the gate insulating layer 107.

A space between the adjacent crystal regions 132a is filled with the amorphous structure 132b, that is, the crystal regions 132a exist discretely and are not in contact with adjacent crystal regions. With such a structure, resistance of the semiconductor layer 132 in a vertical direction of when voltage is applied to the source region or the drain region can be reduced, whereby on-current of the thin film transistor can be increased.

Figure 12C:
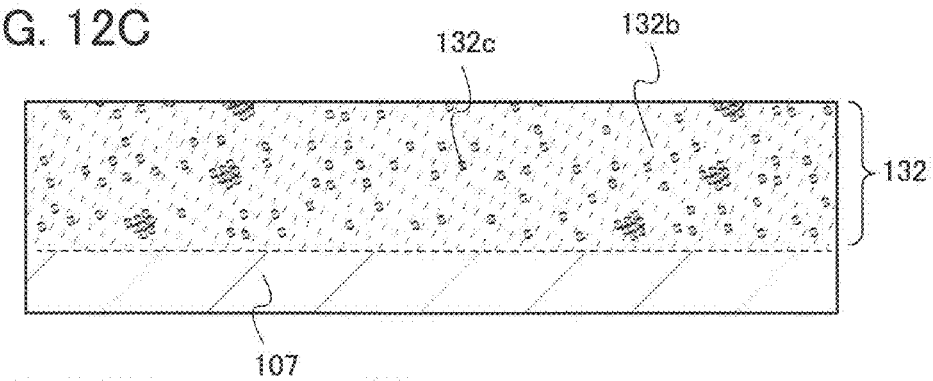

In additions as illustrated in FIG. 12C, the semiconductor layer including crystal regions in an amorphous structure which can be used for the semiconductor layer 132 has a mode in which minute crystal grains 132c are dispersed in the amorphous structure 132b. The minute crystal grain 132c is a crystal grain having a minute size which cannot be a crystal nucleus for the crystal region. The size of the minute crystal grain 132c is typically 1 to 10 nm inclusive, preferably 1 to 5 nm inclusive. By controlling the nitrogen concentration in the semiconductor layer 132, the minute crystal grains can be formed. Further, a large amount of nitrogen is likely to be segregated on the outer side of the minute crystal grain, that is, on the side which is in contact with the amorphous structure. Therefore, a large amount of nitrogen exists at the interface between the minute crystal grain and the amorphous structure.

Note that in the semiconductor layer 132, the minute crystal grains 132c may be dispersed in the amorphous structure 132b. In addition, the minute crystal grains 132c may be aggregated in the semiconductor layer 132. Furthermore, the dispersed minute crystal grains 132c and the aggregated minute crystal grains 132c may both exist in the semiconductor layer 132.

Figure 12D:
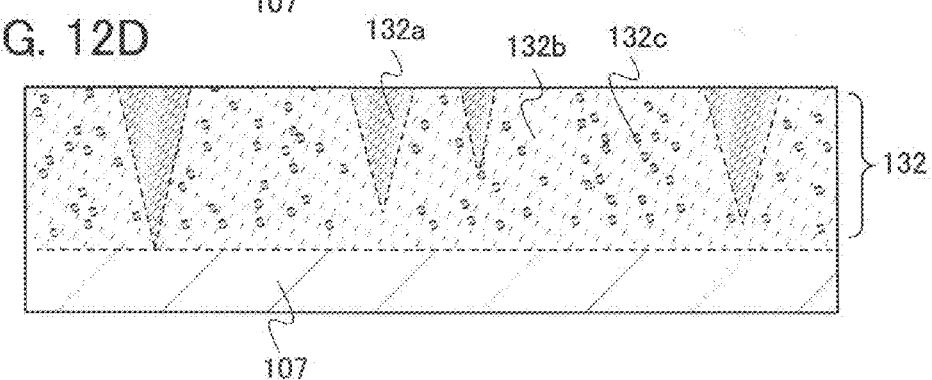

In addition, as illustrated in FIG. 12D, the semiconductor layer including crystal regions in an amorphous structure which can be used for the semiconductor layer 132 has a mode in which the crystal regions 132a and the minute crystal grains 132c are dispersed in the amorphous structure 132b. With such a structure, resistance of the semiconductor layer 132 in a vertical direction of when voltage is applied to the source region or the drain region, that is, resistance between the gate insulating layer 107 and the source region or the drain region, can be reduced, whereby on-current of the thin film transistor can be increased.

Note that here, as for an impurity element which inhibits generation of crystal nuclei such as oxygen and nitrogen, an impurity element in silicon which does not trap carriers (e.g., nitrogen) is selected. On the other hand, the concentration of an impurity element which reduces the coordination number of silicon and generates dangling bonds (e.g., oxygen) is reduced. Therefore, it is preferable to reduce the oxygen concentration without reducing the nitrogen concentration. Specifically, it is preferable that the oxygen concentration which is measured by secondary ion mass spectrometry be less than or equal to $5 \times 10^{18}$ cm$^{-3}$.

Figure 13A:
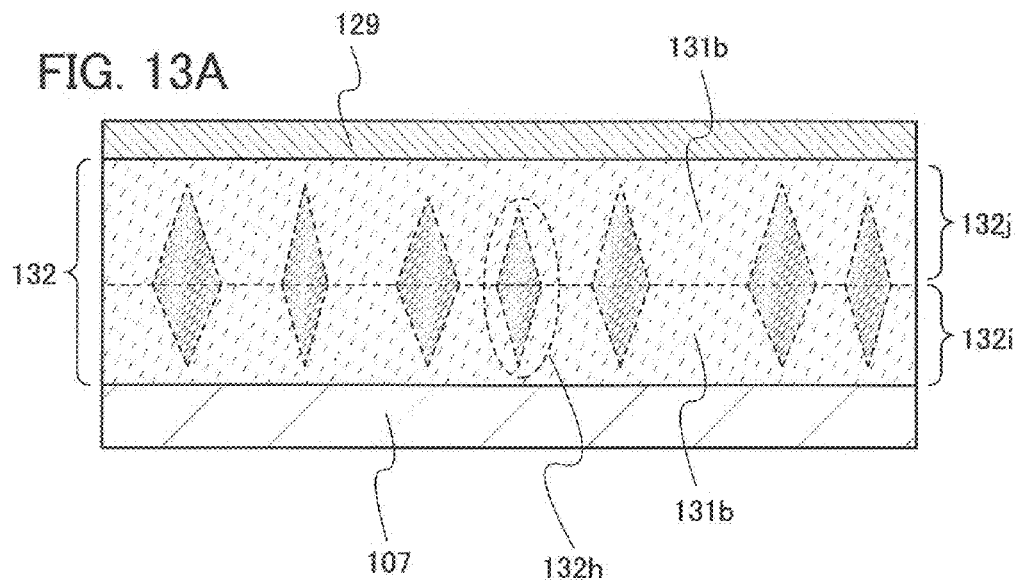

In addition, the semiconductor layer 132 of the thin film transistor illustrated in FIG. 11 can have a structure in which the amorphous structure 131b includes a crystal region 132h having a quadrangular shape each angle of which is not 90°, typically, a diamond shape as illustrated in FIG. 13A. Such a semiconductor layer 132 can be formed through two different conditions.

Typically, a semiconductor layer 132i including inverted conical or pyramidal crystal regions is formed on the gate insulating layer 107 side and a semiconductor layer 132j including regular conical or pyramidal crystal regions is formed thereon. Note that the crystal region 132h illustrated in FIGS. 13A to 13B-3 can be formed by controlling the nitrogen concentration in the semiconductor layer 132.

Figures 1, 13B:
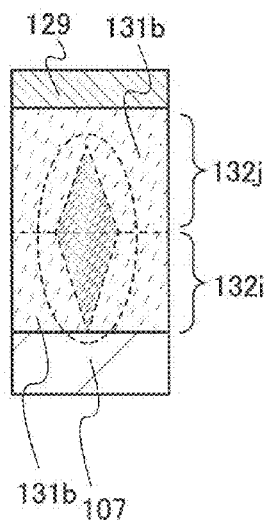
Figures 2, 13B:
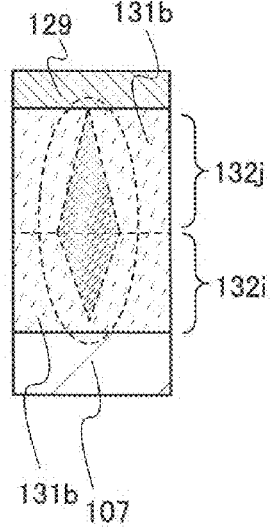
Figures 3, 13B:
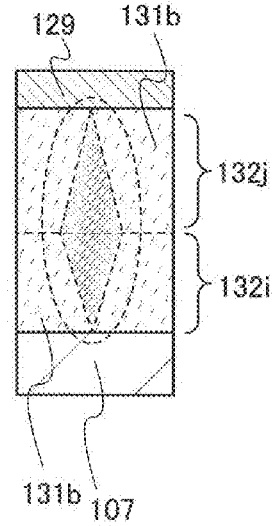

Instead of the crystal region 132h, as illustrated in FIG. 13B-1, the vertex of the crystal region included in the semiconductor layer 132i may be in contact with the gate insulating layer 107.

In addition, instead of the crystal region 132h, as illustrated in FIG. 13B-2, the vertex of the crystal region included in the semiconductor layer 132j may be in contact with the source or drain region 129.

Further, instead of the crystal region 132h, as illustrated in FIG. 13B-3, the vertex of the crystal region included in the semiconductor layer 132i may be in contact with the gate insulating layer 107, and the vertex of the crystal region included in the semiconductor layer 132j may be in contact with the source or drain region 129.

As described above, the crystal regions exist discretely. Control of density of crystal nucleation is necessary so that the crystal regions exist discretely. Control of the nitrogen concentration enables the density of crystal nucleation for the crystal regions to be controlled and enables the crystal regions to exist discretely.

According to this embodiment, as compared to a thin film transistor in which an amorphous semiconductor is included in a channel formation region, on-current and field-effect mobility of a thin film transistor can be increased. In addition, as compared to a thin film transistor in which a microcrystalline semiconductor is included in a channel formation region, off-current of a thin film transistor can be reduced.

Embodiment 4

In Embodiment 4, a mode of a thin film transistor which is different from that described in Embodiment 1 will be described with reference to FIGS. 14A and 14B.

Figure 14A:
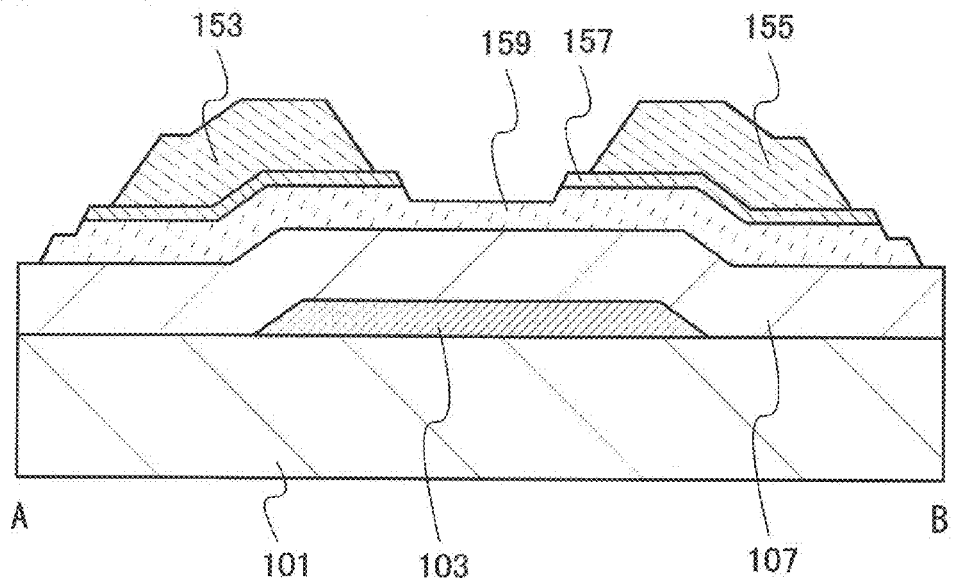
FIGS. 14A and 14B are explanatory views of an example of a thin film transistor according to an embodiment of the present invention.
Figure 14B:
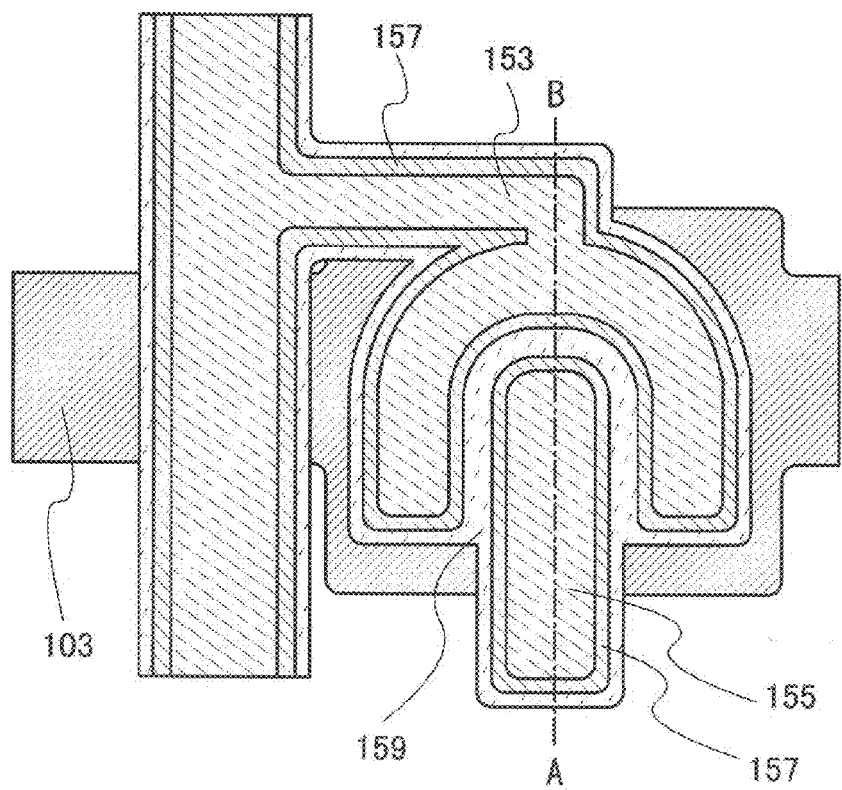

FIG. 14A is a cross-sectional view of a thin film transistor according to this embodiment along A-B in FIG. 14B. A thin film transistor illustrated in FIG. 14A includes a gate electrode layer 103 over a substrate 101; a gate insulating layer 107 covering the gate electrode layer 103; a semiconductor layer 159 including crystal regions in an amorphous structure which is provided over and in contact with the gate insulating layer 107; and source and drain regions 157 which are provided over and in contact with part of the semiconductor layer 159 including crystal regions in an amorphous structure. In addition, the thin film transistor includes a wiring layer 153 and a wiring layer 155 which are provided over and in contact with the source and drain regions 157. The wiring layer 153 and the wiring layer 155 form a source electrode and a drain electrode. Further, each layer is patterned into a desired shape.

Further, as illustrated in FIG. 14B, in the shape viewed from above of the thin film transistor of this embodiment, the source and drain regions 157 are exposed at outer edges of the wiring layer 153 and the wiring layer 155. Such a structure is formed by a photolithography process using a multi-tone mask.

The semiconductor layer 159 including crystal regions in an amorphous structure, the source and drain regions 157, and the wiring layers 153 and 155 can be formed using, as appropriate, materials similar to those of the buffer layer 131, the source and drain regions 129, and the wiring layers 123 and 125 described in Embodiment 1, respectively.

In this embodiment, one of the source electrode and the drain electrode is formed so as to have a U shape (a reversed C shape or a horseshoe shape), and partially surrounds the other of the source electrode and the drain electrode. The distance between the source and drain electrodes is kept substantially constant (FIG. 14B).

One of the source electrode and the drain electrode has the above-described shape, whereby a channel width of the thin film transistor can be increased, and thus the amount of current is increased. In addition, variation in electric characteristics can be reduced. Further, decrease in reliability due to misalignment of a mask pattern in a manufacturing process can be suppressed. However, this embodiment is not limited thereto, and one of the source electrode and the drain electrode does not necessarily have a U shape, and the source electrode and the drain electrode may be face each other in a linear manner. Further, the shapes of the thin film transistors viewed from above in Embodiments 1 to 3 can have the same structure as that in this embodiment.

Although the semiconductor layer including crystal regions in an amorphous structure is provided between the gate insulating layer and the source and drain regions in this embodiment, the semiconductor layer and the buffer layer may be stacked in a manner similar to those of Embodiments 1 and 2.

According to this embodiment, as compared to a thin film transistor in which an amorphous semiconductor is included in a channel formation region, on-current of a thin film transistor can be increased. In addition, as compared to a thin film transistor in which a microcrystalline semiconductor is included in a channel formation region, off-current of a thin film transistor can be reduced.

Embodiment 5

In Embodiment 5, a method for manufacturing a thin film transistor and a pixel portion of a display device will be described below. Here, a liquid crystal display device is described as a display device. An n-channel thin film transistor has higher carrier mobility than a p-channel thin film transistor, and it is preferable that all thin film transistors formed over the same substrate have the same polarity because the number of manufacturing steps can be reduced. Therefore, in this embodiment, a method for manufacturing an n-channel thin film transistor will be described.

First, a gate electrode layer 103 and a capacitor wiring 105 are formed over a substrate 101 (FIG. 15A).

As the substrate 101, the substrate 101 described in Embodiment 1 can be used as appropriate.

The gate electrode layer 103 and the capacitor wiring 105 are formed using a material used for the gate electrode layer 103 described in Embodiment 1 as appropriate. The gate electrode layer 103 and the capacitor wiring 105 can be formed in such a manner that a conductive layer is formed over the substrate 101 using the above material by a sputtering method or a vacuum evaporation method, a mask is formed over the conductive layer by a photolithography method, an inkjet method, or the like, and the conductive layer is etched using the mask. Alternatively, the gate electrode layer 103 and the capacitor wiring 105 can be formed by discharging a conductive nanopaste of silver, gold, copper, or the like over the substrate by an ink-jet method and baking the conductive nanopaste. Note that a nitride layer of any of the above metal materials may be provided between the substrate 101 and the gate electrode layer 103 and the capacitor wiring 105. Here, a conductive layer is formed over the substrate 101 and then etched using a resist mask which is formed through a first a photolithography process, thereby forming the gate electrode layer 103 and the capacitor wiring 105.

When side surfaces of the gate electrode layer 103 and the capacitor wiring 105 have a tapered shape, disconnection of the semiconductor layer and the wiring layer formed over the gate electrode layer 103 and the capacitor wiring 105 at a step portion can be prevented. In order to form the side surfaces of the gate electrode layer 103 and the capacitor wiring 105 into a tapered shape, etching may be performed while the resist mask is made to recede. For example, by using an etching gas containing an oxygen gas, etching can be performed while the resist mask is made to recede.

Through the step of forming the gate electrode layer 103, a gate wiring (a scanning line) and the capacitor wiring 105 can also be formed at the same time. Note that a "scanning line" means a wiring which selects a pixel, while a "capacitor wiring" means a wiring which is connected to one of electrodes of a storage capacitor in a pixel. However, without limitation thereto, the gate electrode layer 103 and one or both of a gate wiring and a capacitor wiring may be formed separately.

Next, a gate insulating layer 107, a semiconductor layer 109, a buffer layer 111, and an impurity semiconductor layer 113 are formed so as to cover the gate electrode layer 103.

The gate insulating layer 107 can be formed using any of the materials for the gate insulating layer 107 described in Embodiment 1 as appropriate. The gate insulating layer 107 can be formed by a CVD method, a sputtering method, or the like. In the process of forming the gate insulating layer 107 by a CVD method, glow discharge plasma is generated by applying high-frequency power with a frequency of 3 MHz to 30 MHz, typically 13.56 MHz or 27.12 MHz, or high-frequency power in the VHF band with a frequency of 30 MHz to about 300 MHz, typically 60 MHz. Further, the gate insulating layer 107 may be formed using a microwave plasma CVD apparatus with a high frequency (greater than or equal to 1 GHz). When the gate insulating layer 107 is formed by a microwave plasma CVD apparatus, the withstand voltage between a gate electrode and drain and source electrodes can be improved; therefore, a highly reliable thin film transistor can be obtained.

It is preferable that the semiconductor layer 109 be formed to have a thickness of 3 nm to 100 nm inclusive, preferably 5 nm to 50 nm inclusive.

In a reaction chamber of the plasma CVD apparatus, a deposition gas containing silicon or germanium is mixed with hydrogen, and a microcrystalline semiconductor layer is formed as the semiconductor layer 109 by glow discharge plasma. The microcrystalline semiconductor layer is formed using mixture of the deposition gas containing silicon or germanium and hydrogen, which is obtained by diluting the deposition gas with hydrogen whose flow rate is 10 to 2000 times, preferably 50 to 200 times that of the deposition gas.

As a typical example of the deposition gas containing silicon or germanium, $SiH_4$, $Si_2H_6$, $Ge_2H_6$, $Ge_2H_6$, or the like can be given.

Next, a method for forming the buffer layer 111 will be described.

The buffer layer 111 includes minute crystal grains and/or conical or pyramidal crystal regions in an amorphous structure as described in the above embodiments. The minute crystal grains and the conical or pyramidal crystal regions can be formed, for example, in such a manner that the oxygen concentration in the buffer layer 111 is set low and the nitrogen concentration is set higher than the oxygen concentration and controlled. Thus, the minute crystal grains and the conical or pyramidal crystal regions can be formed while controlling generation of nuclei for the crystal regions. Here, it is preferable that the nitrogen concentration be one or more digits higher than the oxygen concentration. More specifically, the oxygen concentration which is measured by secondary ion mass spectrometry is less than or equal to $5 \times 10^{18}$ $cm^{-3}$. Further, the nitrogen concentration is $1 \times 10^{20}$ to $1 \times 10^{21}$ $cm^{-3}$ inclusive, preferably $2 \times 10^{20}$ to $1 \times 10^{21}$ $cm^{-3}$ inclusive. The thickness of the buffer layer 131 is preferably 50 nm to 350 nm, more preferably 120 nm to 250 nm.

In this embodiment, the gate insulating layer 107 has a stacked-layer structure in which a silicon oxynitride layer is formed over a silicon nitride layer, and as the semiconductor layer 109, a microcrystalline silicon layer is formed and the microcrystalline semiconductor layer is exposed to ammonia, whereby nitrogen is supplied to the surface of the semiconductor layer 109 to control the nitrogen concentration of the buffer layer.

Figure 19:
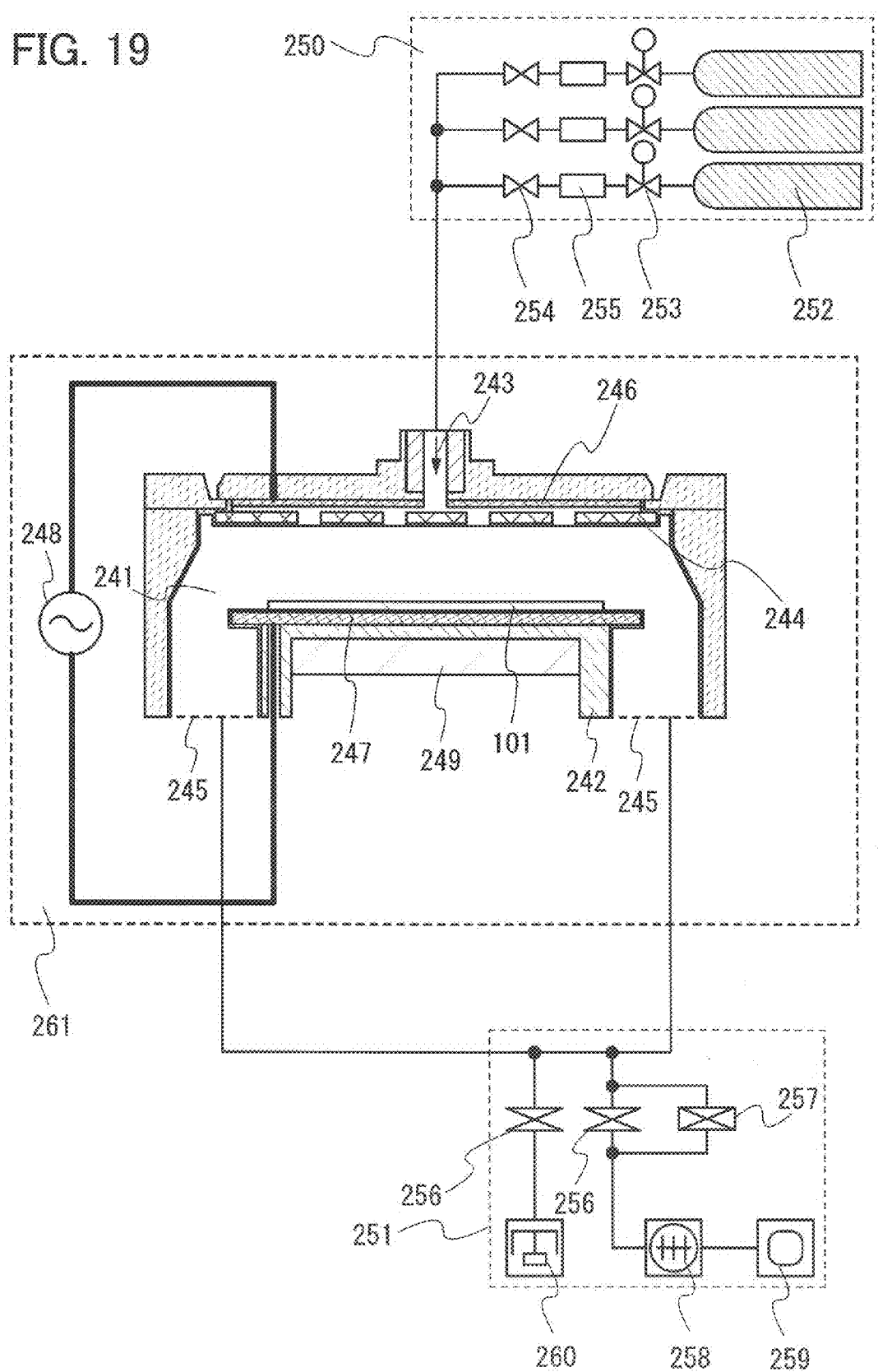
FIG. 19 is an explanatory view of an apparatus applicable to a method for manufacturing a thin film transistor according to an embodiment of the present invention.

Here, an example of forming the gate insulating layer 107, the semiconductor layer 109, the buffer layer 111, and the impurity semiconductor layer 113 will be described in detail. These layers are formed by a CVD method or the like. Further, the gate insulating layer 107 has a stacked-layer structure in which a silicon oxynitride layer is formed over a silicon nitride layer. By employing such a structure, the silicon nitride layer can prevent an element included in the substrate which adversely affects electric characteristics (an element such as sodium in the case where the substrate is a glass substrate) from entering the semiconductor layer 109 or the like. FIG. 19 is a schematic view illustrating a CVD apparatus which is used for forming these layers.

A plasma CVD apparatus 261 illustrated in FIG. 19 is connected to a gas supply means 250 and an exhaust means 251.

The plasma CVD apparatus 261 illustrated in FIG. 19 includes a treatment chamber 241, a stage 242, a gas supply portion 243, a shower plate 244, an exhaust port 245, an upper electrode 246, a lower electrode 247, an alternate-current power source 248, and a temperature control portion 249.

The treatment chamber 241 is formed using a material having rigidity and the inside thereof can be evacuated to vacuum. The treatment chamber 241 is provided with the upper electrode 246 and the lower electrode 247. Note that in FIG. 19, a structure of a capacitive coupling type (a parallel plate type) is illustrated; however, another structure such as an inductive coupling type can be used, as long as plasma can be generated in the treatment chamber 241 by applying two or more different high-frequency powers.

When treatment is performed with the plasma CVD apparatus illustrated in FIG. 19, a predetermined gas is supplied through the gas Supply portion 243 to the treatment chamber 241. The supplied gas is introduced to the treatment chamber 241 through the shower plate 244. High-frequency power is applied with the alternate-current power source 248 connected to the upper electrode 246 and the lower electrode 247 to excite the gas in the treatment chamber 241, whereby plasma is generated. Further, the gas in the treatment chamber 241 is exhausted through the exhaust port 245 which is connected to a vacuum pump. Further, the temperature control portion 249 makes it possible to perform plasma treatment while an object to be processed is being heated.

The gas supply means 250 includes a cylinder 252 which is filled with a reaction gas, a pressure adjusting valve 253, a stop valve 254, a mass flow controller 255, and the like. The treatment chamber 241 includes the shower plate 244 which is processed in a plate-like shape and provided with a plurality of pores, between the upper electrode 246 and the substrate 101. A reaction gas supplied to the upper electrode 246 is supplied to the treatment chamber 241 through pores in the shower plate 244 having a hollow structure.

The exhaust means 251 which is connected to the treatment chamber 241 has a function of vacuum evacuation and a function of controlling the pressure inside the treatment chamber 241 to be maintained at a predetermined level when a reaction gas is made to flow. The exhaust means 251 includes in its structure a butterfly valve 256, a conductance valve 257, a turbo molecular pump 258, a dry pump 259, and the like. In the case of arranging the butterfly valve 256 and the conductance valve 257 in parallel, the butterfly valve 256 is closed and the conductance valve 257 is operated, so that the evacuation speed of the reaction gas is controlled and thus the pressure in the treatment chamber 241 can be kept in a predetermined range. Moreover, the butterfly valve 256 having higher conductance is opened, so that high-vacuum evacuation can be performed.

In the ease of performing ultra-high vacuum evacuation to a pressure lower than $10^{-5}$ Pa on the treatment chamber 241, a cryopump 260 is preferably used together. In addition, when exhaust is performed to ultra-high vacuum as ultimate vacuum, the inner wall of the treatment chamber 241 may be polished into a mirror surface, and the treatment chamber 241 may be provided with a heater for baking in order to reduce a gas discharged from the inner wall.

Note that as illustrated in FIG. 19, when precoating treatment is performed so that a layer is formed (deposited) so as to cover the entire inner wall of treatment chamber 241, it is possible to prevent an impurity element attached to the inner wall of the treatment chamber or an impurity element for forming the inner wall of the treatment chamber from mixing into an element. In this embodiment, as precoating treatment, a layer containing silicon as its main component may be formed. For example, an amorphous silicon layer or the like may be formed. Note that it is preferable that this layer should not contain oxygen.

A series of steps from a step of forming the gate insulating layer 107 to a step of forming the impurity semiconductor layer will be described with reference to FIG. 20. Note that the gate insulating layer 107 is formed in such a manner that a silicon oxynitride layer is stacked over a silicon nitride layer.

Figure 20:
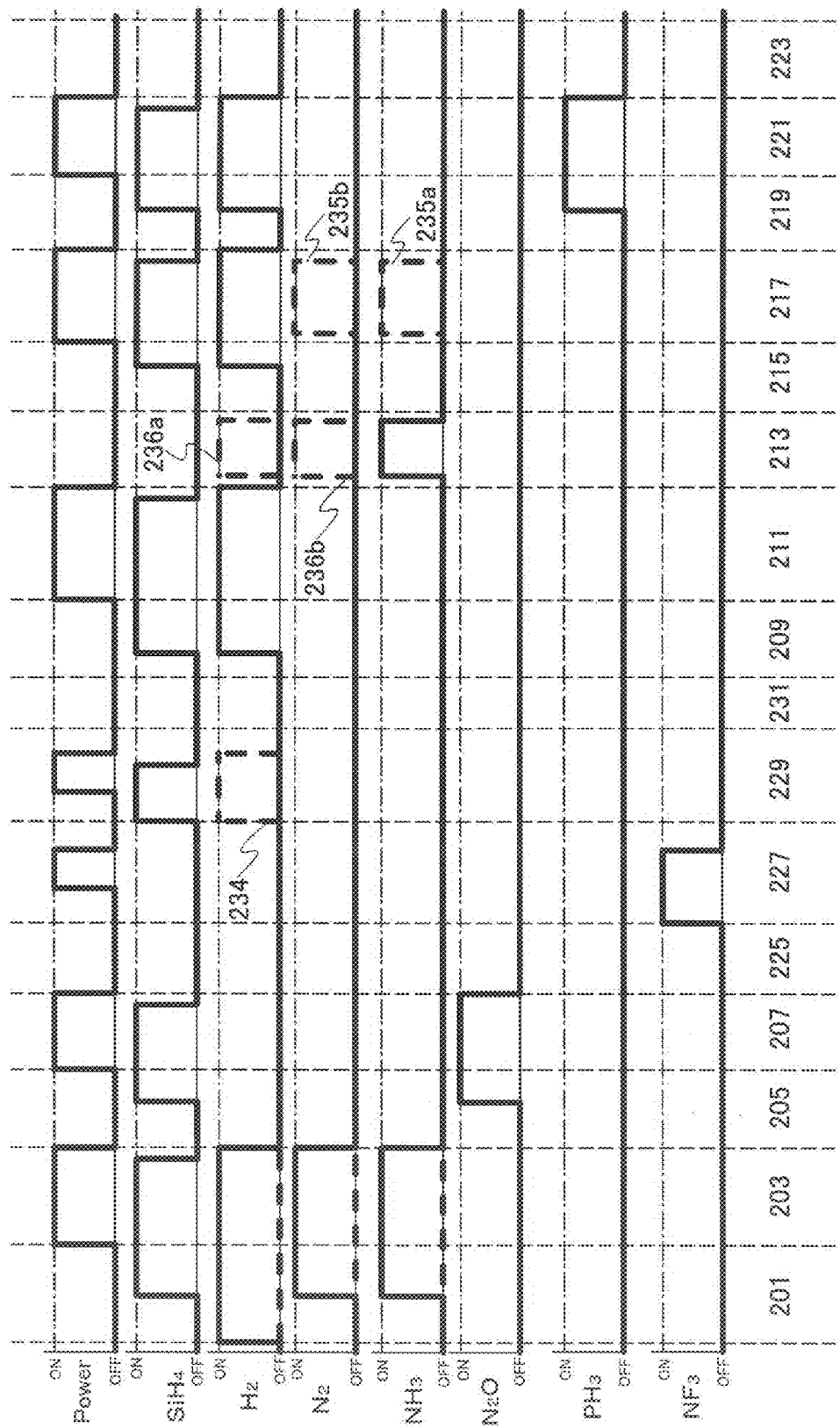
FIG. 20 is an example of a timing chart of a method for manufacturing a thin film transistor according to an embodiment of the present invention.

First, the substrate over which the gate electrode layer 103 is formed is heated in the treatment chamber 241 of the CVD apparatus, and in order to form a silicon nitride layer, source gases used for depositing a silicon nitride layer are introduced into the treatment chamber 241 (pretreatment 201 in FIG. 20). First, a silicon nitride layer with a thickness of 110 nm is formed by a plasma CVD method. The deposition condition at this time is as follows: as for the source gases, the flow rate of $SiH_4$ is 40 sccm, the flow rate of $H_2$ is 500 sccm, the flow rate of $N_2$ is 550 sccm, and the flow rate of $NH_3$ is 140 sccm, the pressure in the treatment chamber is 100 Pa, the temperature of the substrate is 280° C., the RE power source frequency is 13.56 MHz, and the power of the RF power source is 370 W; plasma discharge is performed under this condition. After that, only the supply of $SiH_4$ is stopped, and after several seconds, the plasma discharge is stopped (formation of SiN 203 in FIG. 20). This is because if plasma discharge is stopped in a state where $SiH_4$ is present in the treatment chamber, grains or particles containing silicon as its main component are formed, which causes reduction in yield.

Next, the source gases used for depositing the silicon nitride layer are exhausted and source gases used for depositing a silicon oxynitride layer are introduced to the treatment chamber 241 (replacement of gases 205 in FIG. 20). In this embodiment, a silicon oxynitride layer with a thickness of 110 nm is formed. The deposition condition at this time is as follows: as for the source gases, the flow rate of $SiH_4$ is 30 sccm and the flow rate of $N_2O$ is 1200 sccm, the pressure in the treatment chamber is 40 Pa, the temperature of the substrate is 280° C., the RF power source frequency is 13.56 MHz, and the power of the RF power source is 50 W; plasma discharge is performed under this condition. After that, in a manner similar to that of the silicon nitride layer, only the introduction of $SiH_4$ is stopped, and after several seconds, the plasma discharge is stopped (formation of SiON 207 in FIG. 20).

Through the above steps, the gate insulating layer 107 can be formed. After the gate insulating layer 107 is formed, the substrate 101 is carried out of the treatment chamber 241 (unload 225 in FIG. 20).

After the substrate 101 is carried out of the treatment chamber 241, for example, an $NF_3$ gas is introduced into the treatment chamber 241 and the inside of the treatment chamber 241 is cleaned (cleaning treatment 227 in FIG. 20). After that, treatment for forming an amorphous silicon layer in the treatment chamber 241 is performed (precoating treatment 229 in FIG. 20). Although the amorphous silicon layer is formed in a manner similar to formation of the buffer layer 111, which will be described later, hydrogen may be introduced into the treatment chamber 241 as indicated by a dashed line 234 or may not be introduced into the treatment chamber 241. By this treatment, the amorphous silicon layer is formed on the inner wall of the treatment chamber 241. After that, the substrate 101 is carried into the treatment chamber 241 (load 231 in FIG. 20).

Next, source gases used for depositing the semiconductor layer 109 are introduced to the treatment chamber 241 (replacement of gases 209 in FIG. 20). Next, the semiconductor layer 109 is formed over the gate insulating layer 107. In a later step, the semiconductor layer 109 is patterned into the semiconductor layer 115. In this embodiment, a microcrystalline silicon layer with a thickness of 50 nm is formed as the semiconductor layer 109. The deposition condition at this time is as follows: as for the source gases, the flow rate of $SiH_4$ is 10 sccm and the flow rate of $H_2$ is 1500 sccm, the pressure in the treatment chamber is 280 Pa, the temperature of the substrate is 280° C., the RF power source frequency is 13.56 MHz, and the power of the RF power source is 50 W; plasma discharge is performed under this condition. After that, in a manner similar to formation of the silicon nitride layer or the like described above, only the supply of $SiH_4$ is stopped, and after several seconds, the plasma discharge is stopped (formation of semiconductor layer 211 in FIG. 20).

Next, nitrogen is supplied to the surface of the semiconductor layer 109. Here, by exposing the surface of the semiconductor layer 109 to an ammonia gas, nitrogen is supplied (here, referred to as "flush treatment") (flush treatment 213 in FIG. 20). Further, hydrogen may be contained in the ammonia gas as indicated by a dashed line 236a. Instead of an ammonia gas, a nitrogen gas may be used as indicated by a dashed line 236b or a hydrogen gas may be used as indicated by a dashed line 236a. Alternatively, an ammonia gas and a nitrogen as may both be used. Here, as an example, preferably, the pressure in the treatment chamber 241 is about 20 to 30 Pa, the substrate temperature is 280° C., and the treatment time is 60 seconds. Further alternatively, after the flush treatment, the pressure in the treatment chamber may be controlled to be reduced or increased, so that the amount of nitrogen in the treatment chamber 241 may be controlled. Note that in the treatment of this step, the substrate 101 is only exposed to an ammonia gas, however plasma treatment may also be performed. After that, these gases are exhausted and gases used for depositing the buffer layer 111 are introduced (replacement of gases 215 in FIG. 20).

Next, the buffer layer 111 is formed over the semiconductor layer 109. In a later step, the buffer layer 111 is patterned into the buffer layer 131. Here, the buffer layer is formed using a semiconductor layer including crystal regions in an amorphous structure with a thickness of 55 nm. The deposition condition at this time is as follows: as for the source gases, the flow rate of $SiH_4$ is 20 sccm and the flow rate of $H_2$ is 1500 sccm, the pressure in the treatment chamber is 280 Pa, the temperature of the substrate is 280° C., and the output power is 50 W; plasma discharge is performed under this condition. In this step, the ammonia gas introduced to the reaction chamber by the flush treatment is decomposed by plasma discharge, so that nitrogen can be added to the buffer layer 111. After that, in a manner similar to formation of the silicon nitride layer or the like described above, only the supply of $SiH_4$ is stopped, and after several seconds, the plasma discharge is stopped (formation of buffer layer 217 in FIG. 20). After that, these gases are exhausted and gases used for depositing the impurity semiconductor layer 113 are introduced (replacement of gases 219 in FIG. 20).

Note that the ammonia introduced to the reaction chamber by the flush treatment is decomposed by plasma discharge, so that an NH group or an $NH_2$ group is generated. Further, when the buffer layer is deposited, different dangling bonds in the semiconductor layer including crystal regions in an amorphous structure are cross-linked to each other in some cases. Further, dangling bonds included in the semiconductor layer including crystal regions in an amorphous structure are terminated in some cases. Note that in the case of introducing a nitrogen gas as a gas containing nitrogen to the reaction chamber, a hydrogen gas which is a source gas of the semiconductor layer including crystal regions in an amorphous structure and the nitrogen gas are reacted with each other by plasma discharge, so that an NH group or an $NH_2$ group is generated. Different dangling bonds in the semiconductor layer including crystal regions in an amorphous structure are cross-linked to each other with the NH group in some cases. Further, dangling bonds included in the semiconductor layer including crystal regions in an amorphous structure are terminated in some cases.

In the above example, with regard to the source gases for forming the buffer layer 111, the flow rate of $H_2$ is 150 times that of $SiH_4$; therefore, silicon is deposited gradually.

Nitrogen is supplied to the surface of the semiconductor layer 109 in this embodiment. As described above, nitrogen inhibits generation of silicon crystal nuclei. Therefore, nuclei of silicon crystals are not likely to be generated at the early stage of the deposition. The buffer layer 111 is deposited while the nitrogen concentration is reduced. When the nitrogen concentration is less than or equal to a given value, crystal nuclei are generated. After that, the crystal nuclei grow, so that the conical or pyramidal crystal grains or the minute crystal grains are formed.

In the buffer layer 111 formed by such a method, the nitrogen concentration which is measured by secondary ion mass spectrometry has a peak at the interface between the semiconductor layer 109 and the buffer layer 111 and is gradually reduced in a direction in which the semiconductor layer 109 is deposited.

Note that as indicated by a dashed line 235a in FIG. 20 an ammonia gas may be supplied to the reaction chamber in formation of buffer layer 217. Alternatively, as indicated by a dashed line 235b, a nitrogen gas may be supplied to the reaction chamber, instead of an ammonia gas. Further alternatively, both an ammonia gas and a nitrogen gas may be supplied to the reaction chamber. As a result, the nitrogen concentration in the buffer layer 111 is increased and minute crystal grains or inverted conical or pyramidal crystal regions are formed as the crystal regions. In this process, regular conical or pyramidal crystal regions may also be formed.

In the buffer layer 111 formed by such a method, the nitrogen concentration which is measured by secondary ion mass spectrometry has a peak at the interface between the semiconductor layer 109 and the buffer layer 111 and is constant in the direction in which the semiconductor layer 109 is deposited.

Next, the impurity semiconductor layer 113 is formed over the buffer layer 111. In a later step, the impurity semiconductor layer 113 is patterned into the source and drain regions 129. In this embodiment, an amorphous silicon layer to which phosphorus is added with a thickness of 50 nm is formed as the impurity semiconductor layer 113. The deposition condition at this time is as follows: as for source gases, the flow rate of $SiH_4$ is 100 sccm and the flow rate of 0.5% phosphine (diluted with hydrogen) is 170 sccm, the deposition temperature is 280° C., the pressure is 170 Pa, the RF power source frequency is 13.56 MHz, and the power of the RF power source is 60 W; plasma discharge is performed under this condition. After that, in a manner similar to formation of the silicon nitride layer or the like, only the supply of $SiH_4$ is stopped, and after several seconds, the plasma discharge is stopped (formation of impurity semiconductor layer 221 in FIG. 20). After that, these gases are exhausted (exhaust of gas 223 in FIG. 20).

As described above, steps of forming components up to the impurity semiconductor layer 113 can be performed (FIG. 15A).

Next, with use of a resist mask formed by a second photolithography process, the semiconductor layer 109, the buffer layer 111, and the impurity semiconductor layer 113 are etched to form the semiconductor layer 115, a buffer layer 117, and an impurity semiconductor layer 119 (FIG. 15B). After that, the resist mask is removed.

Next, a conductive layer 121 is formed so as to cover the semiconductor layer 115, the buffer layer 117, and the impurity semiconductor layer 119 (FIG. 15C).

The conductive layer 121 can be formed using a material and a stacked-layer structure of the wiring layers 123 and 125 described in Embodiment 1 as appropriate. The conductive layer 121 is formed by a CVD method, a sputtering method, or a vacuum evaporation method. Alternatively, the conductive layer 121 may be formed by discharging a conductive nanopaste of silver, gold, copper, or the like by a screen printing method, an ink-jet method, or the like and baking the conductive nanopaste. After that, a resist mask is formed over the conductive layer 121.

Next, with use of a resist mask formed by a third photolithography process, the conductive layer 121 is etched to form a wiring layer 123, a wiring layer 125, and a capacitor electrode 127 (FIG. 16A). The wiring layer 123 and the wiring layer 125 form the source electrode and the drain electrode. The conductive layer 121 is preferably etched by wet etching. By wet etching, the conductive layer is etched isotropically. As a result, the conductive layer recedes to an inner side than that of the resist mask, and thus the wiring layer 123 and the wiring layer 125 are formed. Accordingly, the side surfaces of the wiring layer 123 and the wiring layer 125 are not aligned with the side surfaces of the etched source and drain regions 129, and the side surfaces of the source and drain regions are formed outside the side surfaces of the wiring layer 123 and the wiring layer 125. The wiring layer 123 and the wiring layer 125 serve not only as a source electrode and a drain electrode but also as a signal line. However, without limitation thereto, a signal line may be provided separately from the wiring layer 123 and the wiring layer 125.

Next, with use of a resist mask formed by a third photolithography process, part of the buffer layer 117 and the impurity semiconductor layer 119 obtained by etching are etched (FIG. 16B). The semiconductor layer 115, the buffer layer 131, and the source and drain regions 129 are formed through the process up to this step. After that, the resist mask is removed. FIG. 18A is a top view of FIG. 16B.

Next, dry etching is preferably performed. A condition of dry etching is set so that the exposed region of the buffer layer 131 is not damaged and the etching rate with respect to the buffer layer 131 is low. In other words, a condition which gives almost no damages to the exposed surface of the buffer layer 131 and hardly reduces the thickness of the exposed region of the buffer layer 131 is applied. As an etching gas, a chlorine-based gas is used; typically, a $Cl_2$ gas is used. There is no particular limitation on an etching method and an inductively coupled plasma (ICP) method, a capacitively coupled plasma (CCP) method, an electron cyclotron resonance (ECR) method, or a reactive ion etching (RIE) method, or the like can be used.

An example of a condition of dry etching which can be used here is as follows: the flow rate of a $Cl_2$ gas is 100 sccm; the pressure in the chamber is 0.67 Pa; the temperature of the lower electrode is −10° C.; an RF power (13.56 MHz) of 2000 W is applied to the coil of the upper electrode to generate plasma; no power, 0 V, is applied to the substrate 101 side (i.e., as non-bias); and etching is performed for 30 seconds. The temperature of the inner wall of the chamber is preferably about 80° C.

Next, the surface of the buffer layer 131 may be irradiated with water plasma, ammonia plasma, nitrogen plasma, or the like.

Water plasma treatment can be performed in such a manner that a gas containing water as its main component typified by water vapor ($H_2O$ vapor) is introduced to a reaction space to generate plasma.

As described above, after the pair of source and drain regions 129 are formed, dry etching is further performed under such a condition that the buffer layer 131 is not damaged, whereby an impurity element such as a residue existing on the exposed region of the buffer layer 131 can be removed. Further, after dry etching, water plasma treatment is performed, whereby a residue of the resist mask can also be removed. By water plasma treatment, insulation between the source region and the drain region can be secured, and thus, in a thin film transistor which is completed, the off-current can be reduced, the on-current can be increased, and variation in the electric characteristics can be reduced.

Note that the order of steps of plasma treatment and the like are not limited to the above. Before the resist mask is removed, etching with non-bias applied or plasma treatment may be performed.

Through the steps described above, a thin film transistor according to this embodiment can be manufactured. Like the thin film transistor described in Embodiment 1, the thin film transistor according to this embodiment can also be applied to a switching transistor in a pixel of a display device typified by a liquid crystal display device. Therefore, an insulating layer 133 is formed so as to cover this thin film transistor.

Next, an opening 134 and an opening 136 are formed in the insulating layer 133. The opening 134 and the opening 136 can be formed in such a manner that the insulating layer is partly etched by using a resist mask formed by a fourth photolithography process. Note that when the insulating layer 133 is formed using a photosensitive resin, the insulating layer 133 can be formed by the fourth photolithography process. After that, a pixel electrode layer 135 is provided over the insulating layer 133 so that connection is obtained through the opening 134 and the opening 136. In such a manner, a switching transistor in a pixel of a display device which is illustrated in FIG. 17A can be manufactured.

Note that the insulating layer 133 can be formed in a manner similar to that of the gate insulating layer 107. Further, a dense silicon nitride layer is preferably used as the insulating layer 133 such that entry of a contaminant impurity element such as an organic substance, a metal, or water vapor in the atmosphere can be prevented.

Note that the pixel electrode layer 135 can be formed using a conductive composition containing a conductive high molecule (also referred to as a conductive polymer) having a light-transmitting property. The pixel electrode layer 135 preferably has a sheet resistance of less than or equal to 10000 Ω/square and a light transmittance of greater than or equal to 70% at a wavelength of 550 nm. Further, the resistivity of the conductive high molecule contained in the conductive composition is preferably less than or equal to 0.1 Ω·cm.

As a conductive high molecule, a so-called π electron conjugated conductive high molecule can be used. For example, polyaniline or a derivative thereof polypyrrole or a derivative thereof, polythiophene or a derivative thereof, a copolymer of two or more kinds of those materials and the like can be given.

The pixel electrode layer 135 can be formed using, for example, indium oxide containing tungsten oxide, indium zinc oxide containing tungsten oxide, indium oxide containing titanium oxide, indium tin oxide containing titanium oxide, indium tin oxide (hereinafter also referred to as ITO), indium zinc oxide, indium tin oxide to which silicon oxide is added, or the like.

The pixel electrode layer 135 may be etched using a resist mask formed by a fifth photolithography process to be patterned in a manner similar to that of the wiring layers 123 and 125 or the like.

Note that although not illustrated, an insulating layer formed using an organic resin by a spin coating method or the like may be formed between the insulating layer 133 and the pixel electrode layer 135. The insulating layer formed using an organic resin is formed using a photosensitive resin, whereby the number of steps can be reduced.

After that, in a vertical alignment (VA) liquid crystal display device, in the case of employing a multi-domain vertical alignment mode (so-called MVA mode) in which a pixel is divided into a plurality of portions and the alignment of liquid crystal molecules is made different depending on each portion of the pixel for viewing angle expansion, a protrusion 137 is preferably formed over the pixel electrode layer 135. The protrusion 137 is formed using an insulating layer. FIG. 18B is a top view of FIG. 17B.

Here, after a composition containing a photosensitive acrylic is applied to form a composition layer with a thickness of 0.9 to 1.0 μm, heating is performed at 90° C. for 120 seconds, so that the composition layer is dried. Next, the composition layer is exposed to light with use of a photomask and developed, to have a predetermined shape. Next, heating is performed at 230° C. for one hour to form the protrusion 137 formed of an acrylic resin layer.

When the protrusion 137 is formed over the pixel electrode layer, in the case where voltage is not applied to the pixel electrode, liquid crystal molecules are aligned perpendicularly to a surface of an alignment film; however, liquid crystal molecules in the vicinity of the protrusion are aligned to be inclined slightly to the substrate surface. When the voltage is applied to the pixel electrode layer, first, the liquid crystal molecules in the vicinity of the protrusion which are aligned to be inclined slightly are inclined. Further, the liquid crystal molecules other than those in the vicinity of the protrusion are also affected by the liquid crystal molecules in the vicinity of the protrusion to be sequentially aligned in the same direction. As a result, stable alignment can be obtained in all the pixels. That is, alignment of the liquid crystal molecules in the entire display portion is controlled based on the protrusion.

Instead of the protrusion provided over the pixel electrode layer, a slit may also be provided for the pixel electrode. In this case, when voltage is applied to the pixel electrode layer, electric field distortion is generated near the slit and an electric field distribution and alignment of the liquid crystal molecules can be controlled similarly to the case where the protrusion is provided over the pixel electrode layer.

Through the steps described above, an element substrate which can be used for a liquid crystal display device and which has a thin film transistor with high on-current as compared to a thin film transistor in which an amorphous semiconductor is included in a channel formation region and with low off-current as compared to a thin film transistor in which a microcrystalline semiconductor is included in a channel formation region can be manufactured.

Embodiment 6

In Embodiment 6, a process for forming a buffer layer which can be applied to Embodiment 5 will be described.

In this embodiment, the inside of the treatment chamber is cleaned before deposition of the buffer layer 111. Then, the inner wall of the chamber is covered with a silicon nitride layer, whereby the buffer layer 111 is made to contain nitrogen. Thus, the oxygen concentration is controlled to be low, and the nitrogen concentration is made higher than the oxygen concentration in the buffer layer 111. A series of steps from a step of forming the gate insulating layer 107 to a step of forming the semiconductor layer 109 are the same as those in Embodiment 5; thus, a series of steps from a step of forming the semiconductor layer 109 to a step of forming the impurity semiconductor layer 113 are described below with reference to FIG. 21.

The semiconductor layer 109 is formed over the gate insulating layer 107. In a later step, the semiconductor layer 109 is patterned into the semiconductor layer 115. First, source gases used for depositing the semiconductor layer 109 are introduced to the treatment chamber. Here, as an example, in a manner similar to that of Embodiment 5, a microcrystalline semiconductor layer with a thickness of about 50 nm is formed as the semiconductor layer 109. After that, the plasma discharge is stopped (formation of semiconductor layer 211 in FIG. 21). After that, the substrate 101 is carried out of the treatment chamber 241 (unload 225 in FIG. 21).

Figure 21:
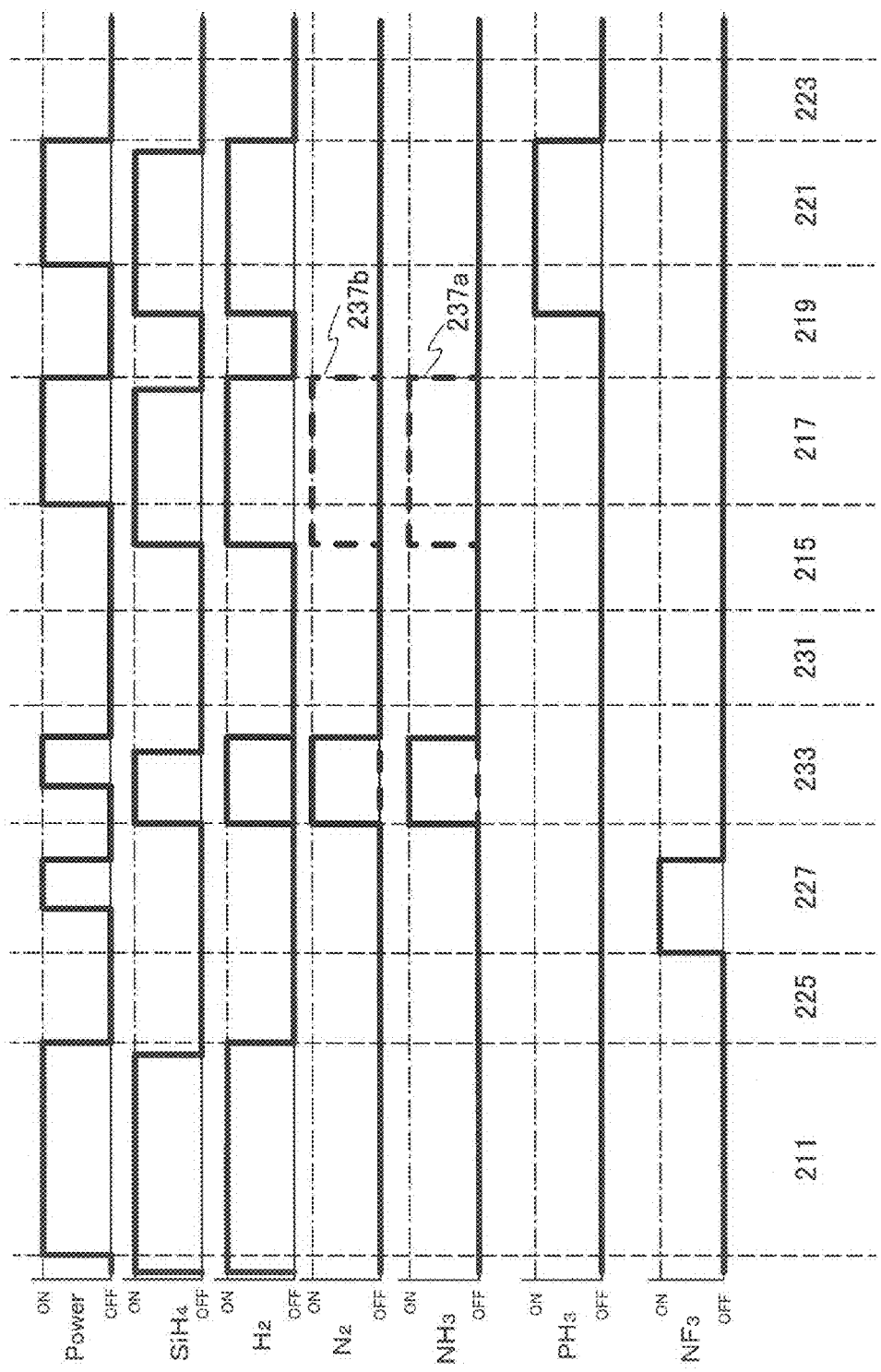
FIG. 21 is an example of a timing chart of a method for manufacturing a thin film transistor according to an embodiment of the present invention.

After the substrate 101 is carried out of the treatment chamber 241, for example, a $NF_3$ gas is introduced to the treatment chamber 241 and the inside of the treatment chamber 241 is cleaned (cleaning treatment 227 in FIG. 21). After that, treatment for forming a silicon nitride layer in the treatment chamber 241 is performed (precoating treatment 233 in FIG. 21). The silicon nitride layer is formed under a condition similar to that of the silicon nitride layer formed as the gate insulating layer in Embodiment 5. By this treatment, the silicon nitride layer is formed on the inner wall of the treatment chamber 241. After that, the substrate 101 is carried into the treatment chamber 241 (load 231 in FIG. 21).

Next, source gases used for depositing the buffer layer 111 are introduced to the treatment chamber 241 (replacement of gases 215 in FIG. 21). Next, the buffer layer 111 is formed over the entire surface of the semiconductor layer 109. In a later step, the buffer layer 111 is patterned into the buffer layer 131. Here, as the buffer layer, in a manner similar to that of Embodiment 5, a semiconductor layer including crystal regions in an amorphous structure with a thickness of about 80 nm can be formed. After that, the plasma discharge is stopped (formation of buffer layer 217 in FIG. 21). After that, these gases are exhausted and gases used for depositing the impurity semiconductor layer 113 are introduced (replacement of gases 219 in FIG. 21). In a manner similar to that of Embodiment 5, the impurity semiconductor layer 113 is formed (formation of impurity semiconductor layer 221 in FIG. 21).

The silicon nitride layer is formed on the inner wall of the treatment chamber 241 in this embodiment. When the silicon nitride layer formed in the treatment chamber 241 is exposed to plasma in a step of forming the buffer layer 111, nitrogen is dissociated, and thus at the early stage of depositing the buffer layer 111, nitrogen can be mixed into the buffer layer 111.

When the silicon nitride layer formed in the treatment chamber 241 is exposed to plasma in a step of forming the buffer layer 111, nitrogen, preferably, an NH group or an $NH_2$ group is dissociated, and thus at the early stage of depositing the buffer layer 111, nitrogen, preferably, an NH group or an $NH_2$ group can be mixed into the buffer layer 111. Further, when an amorphous semiconductor layer is deposited, different dangling bonds in the amorphous semiconductor layer are cross-linked in some cases. Further, when the amorphous semiconductor layer is deposited, dangling bonds in the amorphous semiconductor layer are terminated in some cases.

In the buffer layer 111 formed by such a method, the nitrogen concentration which is measured by secondary ion mass spectrometry has a peak at the interface between the semiconductor layer 109 and the buffer layer 111 and is gradually reduced as the semiconductor layer 109 is deposited.

As described above, at least right before the semiconductor layer is formed, the inner wall of the treatment chamber is covered with the silicon nitride layer, whereby the oxygen concentration can be suppressed low and the nitrogen concentration can be made higher than the oxygen concentration, and a semiconductor layer including crystal regions in an amorphous structure can be formed.

Further, covering the inner wall of the treatment chamber with the silicon nitride layer can prevent elements that constitute the inner wall of the treatment chamber and the like from entering the buffer layer.

Note that as indicated by a dashed line 237a in FIG. 21, in formation of buffer layer 217, an ammonia gas may be supplied to the reaction chamber. Instead of an ammonia gas, as indicated by a dashed line 237b, a nitrogen gas may be used. Further, an ammonia gas and a nitrogen gas may both be used. As a result of this, the nitrogen concentration of the buffer layer 111 is increased, so that minute crystal grains and/or conical or pyramidal crystal regions are formed as the crystal regions.

In the buffer layer 111 formed by such a method, the nitrogen concentration which is measured by secondary ion mass spectrometry has a peak at the interface between the semiconductor layer 109 and the buffer layer 111 and is constant in the direction in which the semiconductor layer 109 is deposited.

Note that in the description above, since the buffer layer 111 is formed in the same treatment chamber as that where the semiconductor layer 109 is formed, after the semiconductor layer 109 is formed, cleaning treatment and precoating treatment are performed; however, this embodiment may be carried out in combination with Embodiment 5. That is, after the semiconductor layer 109 is deposited, cleaning treatment 227 and precoating treatment 233 are performed, and a silicon nitride layer is formed in the treatment chamber 241, flush treatment 213 may be performed.

Through the above steps, a thin film transistor with high on-current as compared to a thin film transistor in which an amorphous semiconductor is included in a channel formation region and with low off-current as compared to a thin film transistor in which a microcrystalline semiconductor is included in a channel formation region can be manufactured.

Embodiment 7

In Embodiment 7, a formation process of a buffer layer which can be applied to Embodiment 5 will be described.

In this embodiment, by mixing nitrogen into a deposition gas for forming the buffer layer 111, the oxygen concentration is suppressed low and the nitrogen concentration is made higher than the nitrogen concentration. Since a series of steps from a step of forming the gate insulating layer 107 to a step of forming the semiconductor layer 109 can be performed in a manner similar to those of Embodiment 5, here, a series of steps from a step of forming the semiconductor layer 109 to a step of forming the impurity semiconductor layer 113 will be described with reference to FIG. 22.

The semiconductor layer 109 is formed over the gate insulating layer 107. In a later step, the semiconductor layer 109 is patterned into the semiconductor layer 115. First, source gases used for depositing the semiconductor layer 109 are introduced to a treatment chamber. Here, as an example, in a manner similar to that of Embodiment 5, a microcrystalline silicon layer with a thickness of about 50 nm is formed as the semiconductor layer 109. After that, the plasma discharge is stopped (formation of semiconductor layer 211 in FIG. 22). Then, these gases are exhausted and gases used for depositing the buffer layer 111 are introduced (replacement of gases 215 in FIG. 22).

Next, the buffer layer 111 is formed over the semiconductor layer 109. In a later step, the buffer layer 111 is patterned into the buffer layer 131. Here, a silicon layer including crystal regions in an amorphous structure with a thickness of about 80 nm is formed as the buffer layer 111. The deposition condition at this time is as follows: as for the source gases, the flow rate of $SiH_4$ is 20 sccm, the flow rate of $H_2$ is 1480 sccm, and the flow rate of 1000 ppm $NH_3$ (diluted with hydrogen) is 20 sccm, the pressure in the treatment chamber is 280 Pa, the temperature of the substrate is 280° C., and the output power is 50 W; plasma discharge is performed under this condition. After that, the plasma discharge is stopped (formation of buffer layer 217 in FIG. 22). Then, these gases are exhausted and gases used for depositing the impurity semiconductor layer 113 are introduced (replacement of gases 219 in FIG. 22). In a manner similar to that of Embodiment 5, the impurity semiconductor layer 113 is formed (formation of impurity semiconductor layer 221 in FIG. 22).

In the above example, with regard to the source gases for forming the semiconductor layer 109, the flow rate of $H_2$ is 150 times that of $SiH_4$; therefore, silicon is deposited gradually.

Note that instead of an ammonia gas, as indicated by a dashed line 238, a nitrogen gas may be used.

The source gases of the buffer layer 111 of this embodiment contain nitrogen. As described above, nitrogen suppresses crystal growth. Therefore, as the buffer layer 111 is deposited, crystal growth in which the semiconductor layer 109 is used as seed crystals is inhibited due to the flow rate of the ammonia gas, whereby regular conical or pyramidal crystal regions grow and/or minute crystal grains are formed. In this process, inverted conical or pyramidal crystal regions may also be formed.

In the buffer layer 111 formed by such a method, the nitrogen concentration which is measured by secondary ion mass spectrometry is constant.

As described above, nitrogen is contained in the gases used in depositing the buffer layer, whereby the oxygen concentration can be suppressed low and the nitrogen concentration can be made higher than the oxygen concentration, and thus a semiconductor layer including crystal regions can be formed.

Embodiment 8

A method for manufacturing a semiconductor layer including crystal regions in an amorphous structure in which the nitrogen concentration distribution is different from those in Embodiments 5 to 7 will be described with reference to FIG. 23 and FIG. 24.

Figure 23:
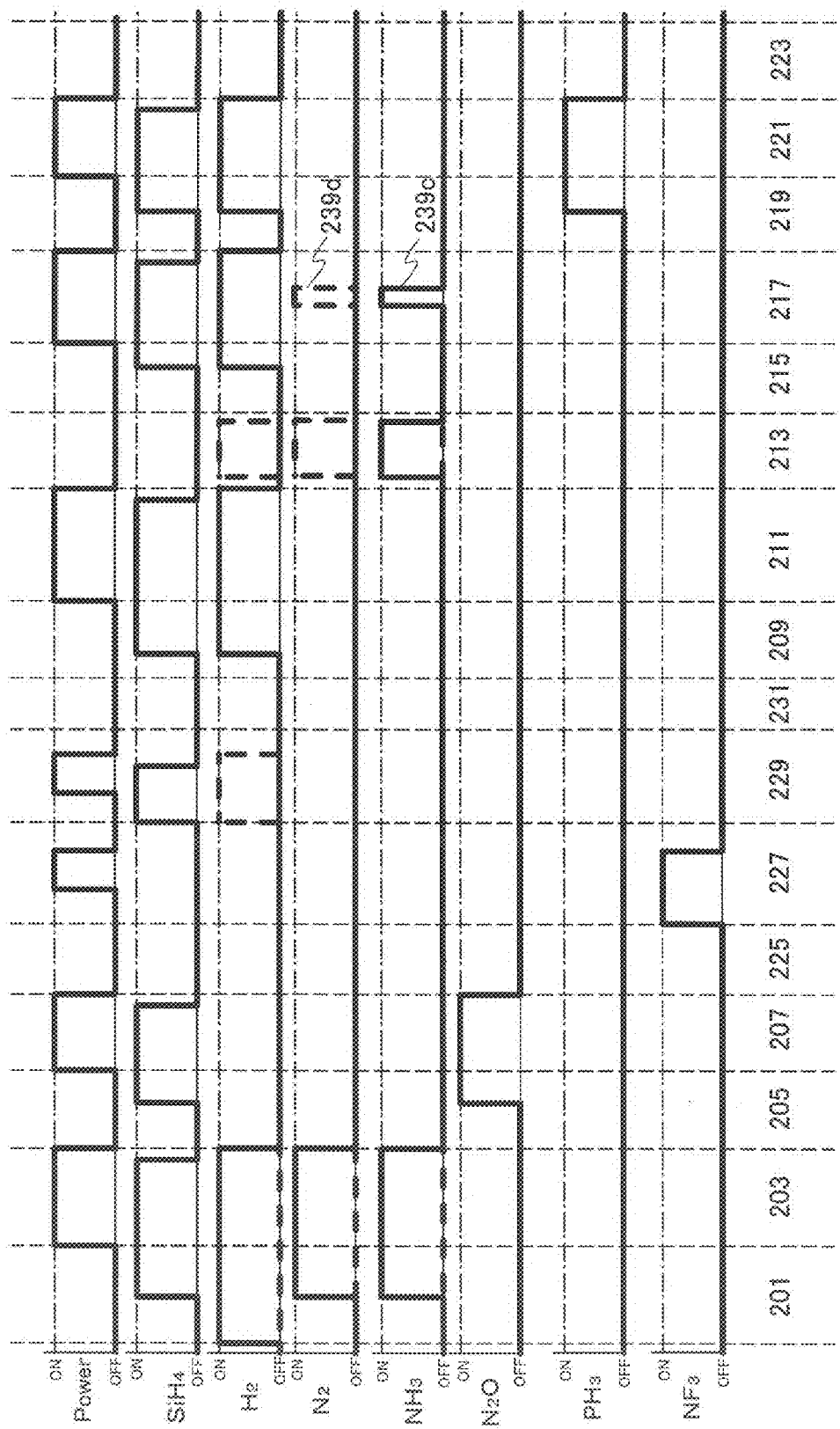
FIG. 23 is an example of a timing chart of a method for manufacturing a thin film transistor according to an embodiment of the present invention.

In this embodiment, nitrogen is added to the buffer layer 111 in such a manner that in Embodiment 6, after the formation of semiconductor layer 211, a gas containing nitrogen is introduced to the reaction chamber by flush treatment 213, and during formation of the buffer layer 111, a gas containing nitrogen is introduced again to the reaction chamber as indicated by a solid line 239c (FIG. 23). As the gas containing nitrogen, here, an ammonia gas is used. Note that instead of an ammonia gas, a nitrogen gas may be used as indicated by a dashed line 239d. Further, an ammonia gas and a nitrogen gas may both be used. As a result, at the early stage of deposition of the buffer layer 111 and during deposition of the buffer layer 111, the nitrogen concentration is made high to disturb crystal growth. Consequently, as illustrated in FIG. 3B-3, growth of the crystal region 131f stops at a given point of the buffer layer 131, and the amorphous structure is deposited on the upper surface of the crystal region 131f. In addition, a minute crystal grain is formed above the crystal region 131f.

Further, as illustrated in FIG. 3B-4, after the crystal region grows from the early stage of deposition, the gas containing nitrogen is introduced to the reaction chamber. At this time, the nitrogen concentration in the buffer layer 111 is increased, and the growth of the crystal region stops. After that, the nitrogen concentration in the buffer layer 111 is reduced, so that a crystal nucleus is formed and the crystal grows, and the structure 131g in which a plurality of inverted conical or pyramidal crystal regions are stacked can be obtained.

Figure 24:
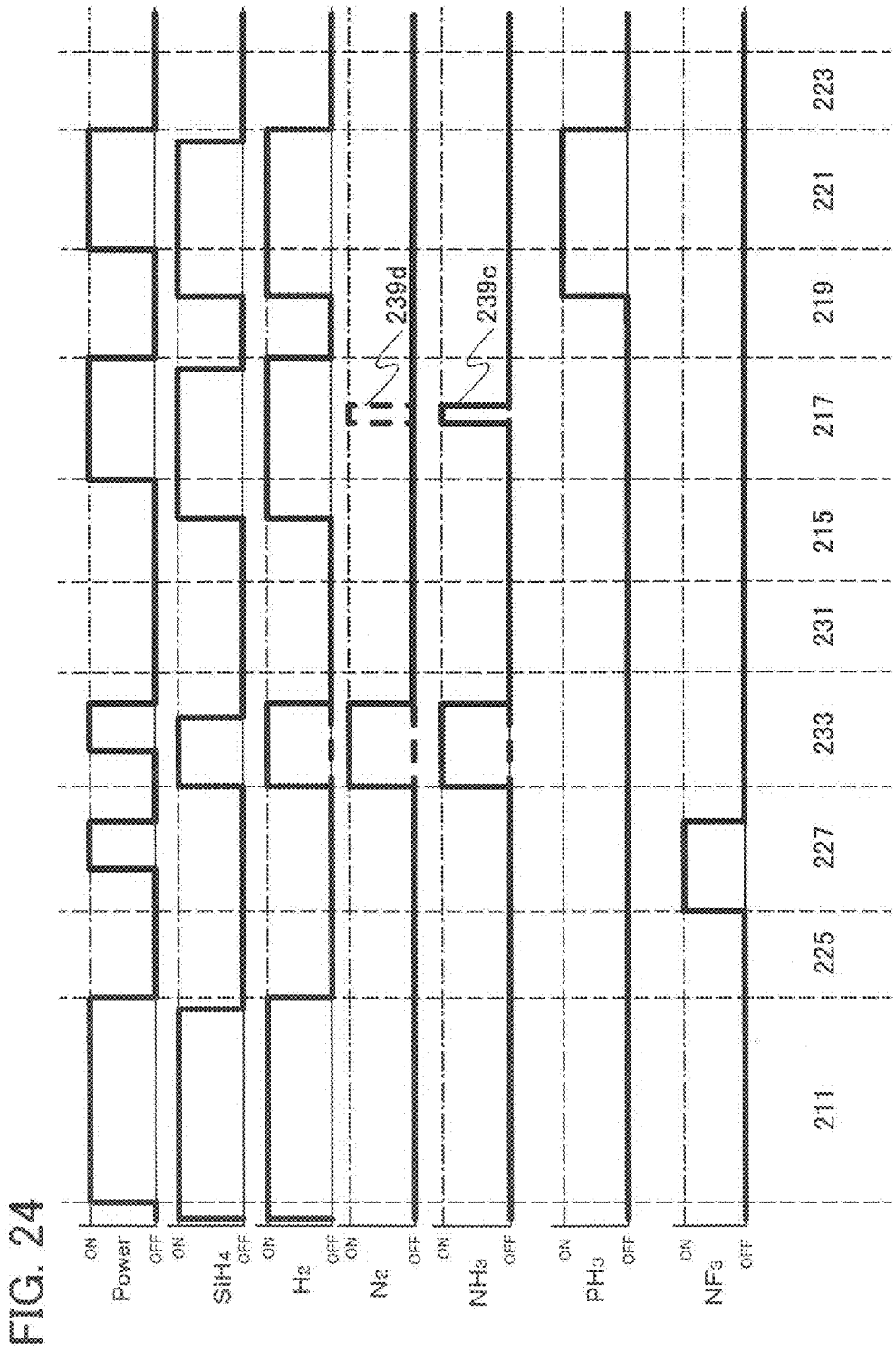
FIG. 24 is an example of a timing chart of a method for manufacturing a thin film transistor according to an embodiment of the present invention.

Alternatively, nitrogen is added to the buffer layer 111 in such a manner that in Embodiment 7, after formation of the semiconductor layer, a silicon nitride layer is formed in the reaction chamber, and during formation of the buffer layer 111, a gas containing nitrogen is introduced again to the reaction chamber as indicated by a solid line 239c (FIG. 24). As a gas containing nitrogen, here, an ammonia gas is used. Note that instead of an ammonia gas, a nitrogen gas may be used as indicated by a dashed line 239d. Further, an ammonia gas and a nitrogen gas may both be used. As a result, at the early stage of deposition of the buffer layer 111 and during deposition of the buffer layer 111, the nitrogen concentration is made high so as to disturb crystal growth. Consequently, as illustrated in FIG. 3B-3, growth of the crystal region 131f stops at a given point of the buffer layer 131, and the amorphous structure is deposited on the upper surface of the crystal region 131f. In addition, a minute crystal grain is formed above the crystal region 131f.

Further, as illustrated in FIG. 3B-4, after the crystal region grows from the early stage of deposition, a gas containing nitrogen is introduced to the reaction chamber. At this time, the nitrogen concentration in the buffer layer 111 is increased, and the growth of the crystal region stops. After that, the nitrogen concentration in the buffer layer 111 is reduced, so that a crystal nucleus is formed and the crystal grows, and the structure 131g in which a plurality of inverted conical or pyramidal crystal regions are stacked can be obtained.

As described above, the size of the crystal region is controlled by the nitrogen concentration on an upper side of the buffer layer, that is, on the side of the source and drain regions, whereby the proportion of crystal regions can be reduced, so that off-current of a thin film transistor can be reduced.

Embodiment 9

In Embodiment 9, a method for manufacturing the thin film transistor described in Embodiment 4 will be described. Also in this embodiment, a method for manufacturing an n-channel thin film transistor will be described.

In a manner similar to that of Embodiment 5, a gate electrode layer 103 and a capacitor wiring 105 are formed over a substrate 101 through a first photolithography process.

Figure 26A:
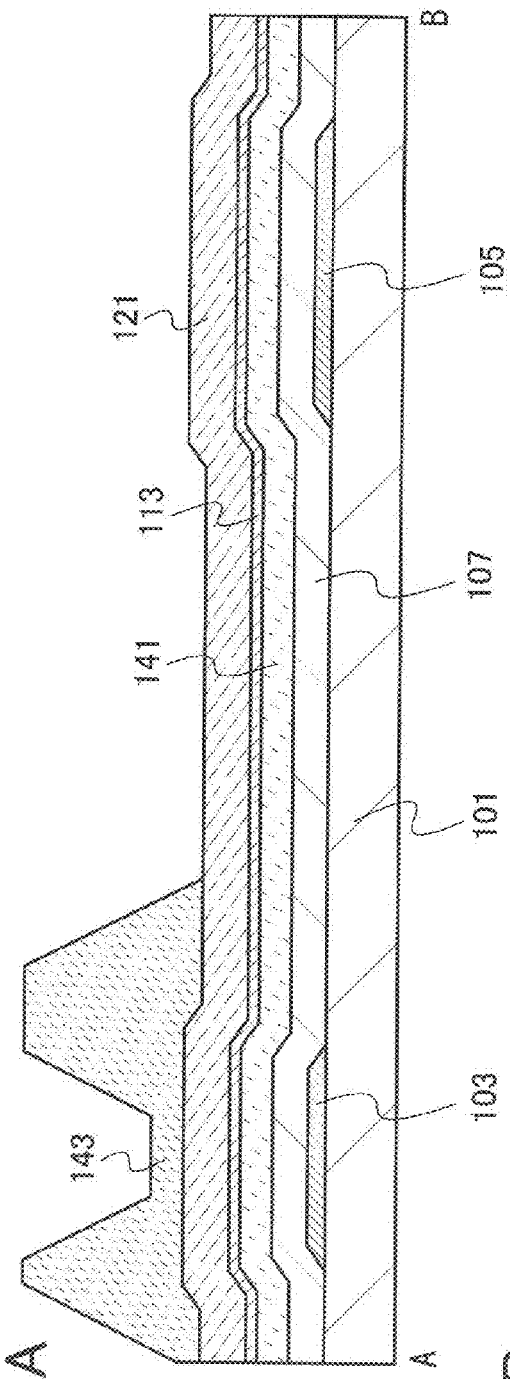
FIGS. 26A and 26B are explanatory views of an example of a method for manufacturing a thin film transistor according to an embodiment of the present invention.

Next, a gate insulating layer 107, a semiconductor layer 141 including crystal regions in an amorphous structure, an impurity semiconductor layer 113, and a conductive layer 121 are formed so as to cover the gate electrode layer 103. After that, a resist mask 143 is formed over the conductive layer 121 through a second photolithography process (FIG. 26A).

The gate insulating layer 107, the semiconductor layer 141 including crystal regions in an amorphous structure, and the impurity semiconductor layer 113 may be formed by the method in Embodiment 5 except the cleaning treatment 227 of reaction chamber, the precoating treatment 229, the load 231, the replacement of gases 209, and the formation of semiconductor layer 211. Specifically, as a method for forming the gate insulating layer 107, the steps from the pretreatment 201 to the formation of SiON 207 in FIG. 20 are carried out. Next, as a method for forming the semiconductor layer 141 including crystal regions in an amorphous structure, the steps from the flush treatment 213 to the formation of buffer layer 217 are carried out. Then, as a method for forming the impurity semiconductor layer 113, the steps from the replacement of gases 219 to the exhaust of gas 223 are carried out.

Instead of the above formation methods, the steps of Embodiment 6 except the formation of semiconductor layer 211 may be carried out. Specifically, as a method for forming the gate insulating layer 107, the steps from the pretreatment 201 to the formation of SiON 207 in FIG. 20 are carried out. Next, as a method for forming the semiconductor layer 141 including crystal regions in an amorphous structure, the steps from the unload 225 to the formation of buffer layer 217 in FIG. 21 are carried out. Then, as a method for forming the impurity semiconductor layer 113, the steps from the replacement of gases 219 to the exhaust of gas 223 are carried out.

Figure 22:
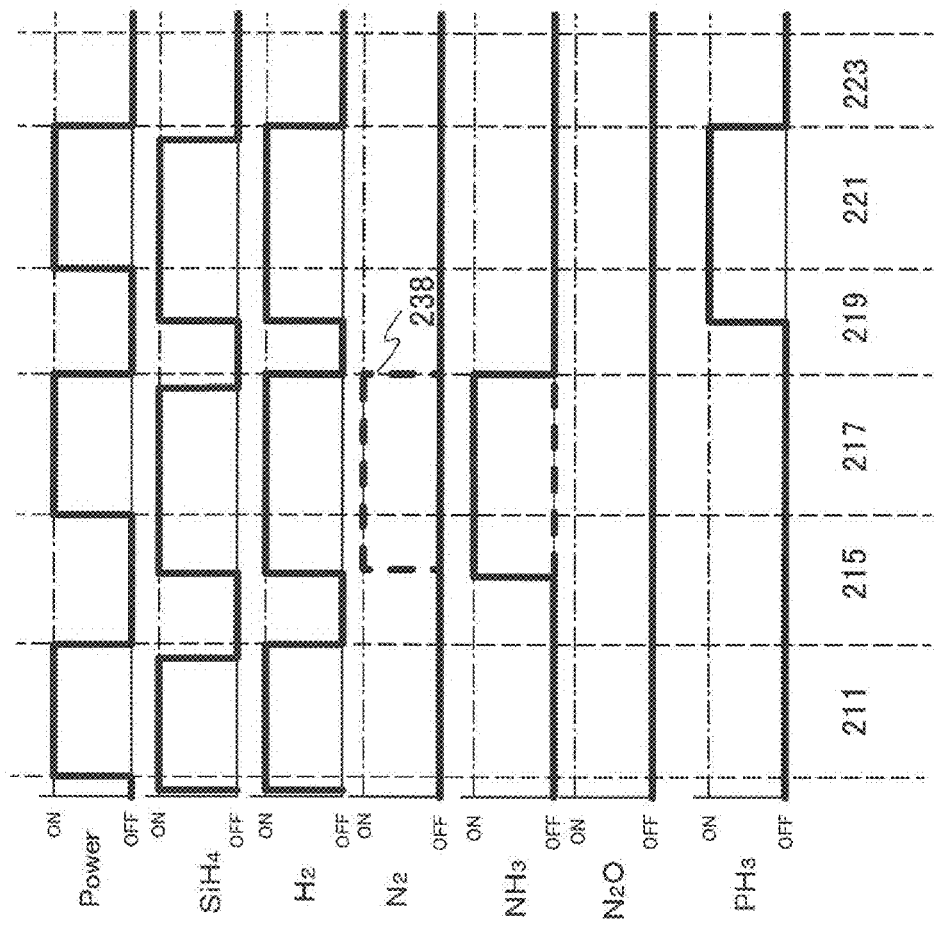
FIG. 22 is an example of a timing chart of a method for manufacturing a thin film transistor according to an embodiment of the present invention.

Further, instead of the above formation methods, the steps of Embodiment 7 except the formation of semiconductor layer 211 may be carried out. Specifically, as a method for forming the gate insulating layer 107, the steps from the pretreatment 201 to the formation of SiON 207 in FIG. 20 are carried out. Next, as a method for forming the semiconductor layer 141 including crystal regions in an amorphous structure, the steps from the replacement of gases 215 to the formation of buffer layer 217 in FIG. 22 are carried out. Then, as a method for forming the impurity semiconductor layer 113, the steps from the replacement of gases 219 to the exhaust of gas 223 are carried out.

The resist mask 143 has two regions with different thicknesses and can be formed using a multi-tone mask. The multi-tone mask is used, so that the number of photomasks to be used and the number of manufacturing steps are reduced, which is preferable. In this embodiment, the multi-tone mask can be used in a step of forming a pattern of the semiconductor layer and a step of separating the semiconductor layer into a source region and a drain region.

A multi-tone mask is a mask capable of light exposure with multi-level amount of light, and typically, light exposure is performed with three levels of light amount to provide an exposed region, a half-exposed region, and an unexposed region. When the multi-tone mask is used, one-time light exposure and development process allow a resist mask with plural thicknesses (typically, two kinds of thicknesses) to be formed. Therefore, by using a multi-tone mask, the number of photomasks can be reduced.

Figures 1, 30A:
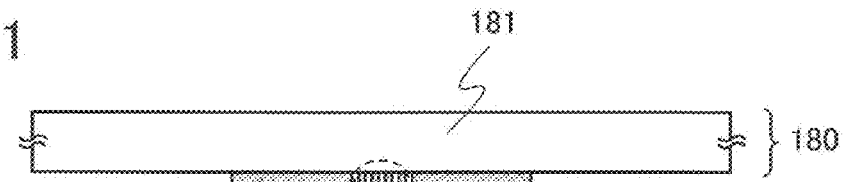
Figures 2, 30A:
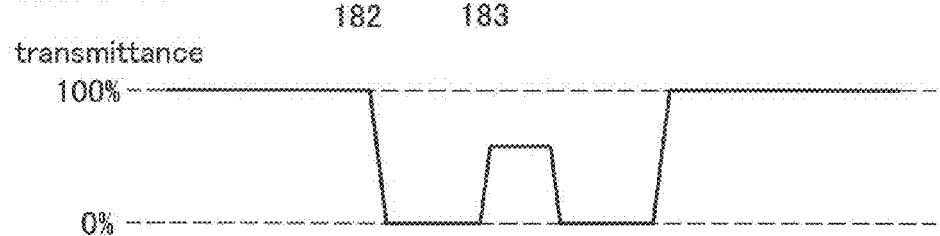
Figures 1, 30B:
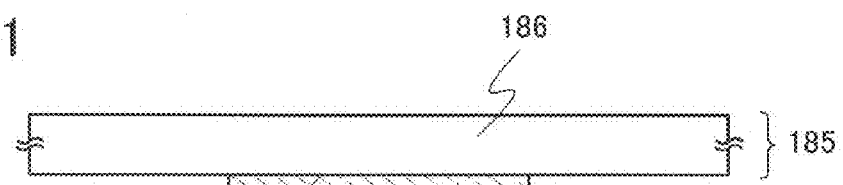
Figures 2, 30B:
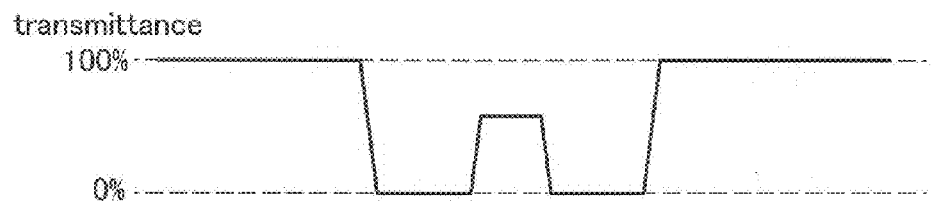

FIGS. 30A-1 and 30B-1 are cross-sectional views of typical multi-tone masks. FIG. 30A-1 illustrates a gray-tone mask 180 and FIG. 30B-1 illustrates a half-tone mask 185.

The gray-tone mask 180 illustrated in FIG. 30A-1 includes a light-shielding portion 182 formed using a light-shielding layer on a substrate 181 having a light-transmitting property, and a diffraction grating portion 183 provided with a pattern of the light-shielding layer.

The diffraction grating portion 183 has slits, dots, mesh, or the like that is provided at intervals which are less than or equal to the resolution limit of light used for the exposure, whereby the light transmittance can be controlled. Note that the slits, dots, or mesh provided at the diffraction grating portion 183 may be provided periodically or non-periodically.

As the substrate 181 having a light-transmitting property, a quartz substrate or the like can be used. The light-shielding layer for forming the light-shielding portion 182 and the diffraction grating portion 183 may be formed using chromium, chromium oxide, or the like.

In the case where the gray-tone mask 180 is irradiated with light for light exposure, as illustrated in FIG. 30A-2, the transmittance in the region overlapping with the light-shielding portion 182 is 0%, and the transmittance in the region where both the light-shielding portion 182 and the diffraction grating portion 183 are not provided is 100%. Further, the transmittance at the diffraction grating portion 183 is approximately in the range of 10 to 70%, which can be adjusted by the interval of slits, dots, or mesh of the diffraction grating, or the like.

The half-tone mask 185 illustrated in FIG. 30B-1 includes a semi-light-transmitting portion 187 which is formed on a substrate 186 having a light-transmitting property, using a semi-light-transmitting layer, and a light-shielding portion 188 formed using a light-shielding layer.

The semi-light-transmitting portion 187 can be formed using a layer of MoSiN, MoSi, MoSiO, MoSiON, CrSi, or the like. The light-shielding portion 188 may be formed using chromium, chromium oxide, or the like, similarly to the light-shielding layer of the gray-tone mask.

In the case where the half-tone mask 185 is irradiated with light for light exposure, as illustrated in FIG. 30B-2, the transmittance in the region overlapping with the light-shielding portion 188 is 0%, and the transmittance in the region where both the light-shielding portion 188 and the semi-light-transmitting portion 187 are not provided is 100%. Further, the transmittance in the semi-light-transmitting portion 187 is approximately in the range of 10 to 70%, which can be adjusted by the kind, the thickness, or the like of the material to be used.

By light exposure using the multi-tone mask and development, a resist mask which has regions having different thicknesses can be formed.

Figure 26B:
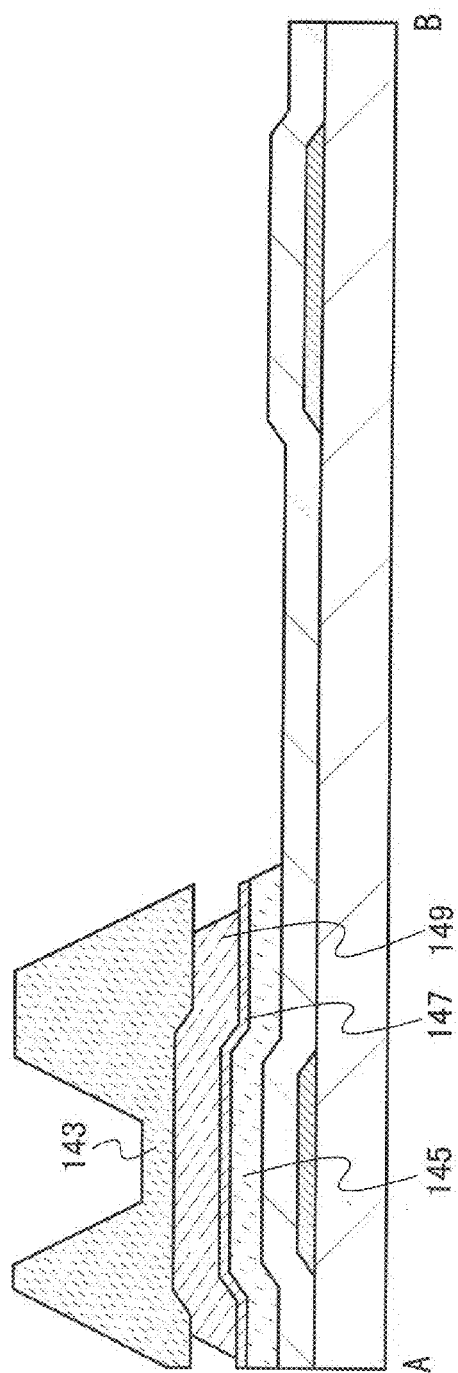

Next, with the use of the resist mask 143, the semiconductor layer 141 including crystal regions in an amorphous structure, the impurity semiconductor layer 113, and the conductive layer 121 are etched. Through this step, the semiconductor layer 141 including crystal regions in an amorphous structure, the impurity semiconductor layer 113, and the conductive layer 121 are separated into each element to form a semiconductor layer 145 including crystal regions in an amorphous structure, an impurity semiconductor layer 147, and a conductive layer 149 (FIG. 26B).

Next, the resist mask 143 is made to recede to form a resist mask 151. Ashing using oxygen plasma may be performed in order that the resist mask 143 is made to recede. Here, ashing is performed on the resist mask 143 so that the resist mask 143 is separated over the gate electrode. As a result, the resist mask 151 is separated (FIG. 27A).

Next, the conductive layer 149 is etched using the resist mask 151 to form a wiring layer 153 and a wiring layer 155 (FIG. 27B). The wiring layer 153 and the wiring layer 155 form a source electrode and a drain electrode. The conductive layer 149 is preferably etched in a manner similar to that of the conductive layer 121 described in Embodiment 5.

Next, in a state where the resist mask 151 is formed, part of the semiconductor layer 145 including crystal regions in an amorphous structure and the impurity semiconductor layer 147 are etched to form a semiconductor layer 159 including crystal regions in an amorphous structure and source and drain regions 157 (FIG. 27C). After that, the resist mask 151 is removed. FIG. 29A is a top view of FIG. 27C.

Next, dry etching may be performed in a manner similar to that of Embodiment 1. Further, the surface of the semiconductor layer 159 including crystal regions in an amorphous structure may be irradiated with water plasma ammonia plasma, nitrogen plasma, or the like.

Through the steps described above, a thin film transistor according to this embodiment can be manufactured. Like the thin film transistor described in Embodiment 5, the thin film transistor according to this embodiment can also be applied to a switching transistor in a pixel of a display device typified by a liquid crystal display device. Therefore, an insulating layer 133 is formed so as to cover this thin film transistor (FIG. 28A).

Next, an opening 134 and an opening 160 are formed in the insulating layer 133. The opening 134 and the opening 160 can be formed using a resist mask formed through a third photolithography process. After that, a pixel electrode layer 135 is provided over the insulating layer 133 through a fourth photolithography process so that connection is obtained through the openings 134 and 160. In such a manner, a switching transistor in a pixel of a display device which is illustrated in FIG. 28B can be manufactured.

Note that although not illustrated, an insulating layer formed using an organic resin by a spin coating method or the like may be formed between the insulating layer 133 and the pixel electrode layer 135.

After that, as in Embodiment 5, in a vertical alignment (VA) liquid crystal display device, in the case of employing a multi-domain vertical alignment mode (so-called MVA mode) in which a pixel is divided into a plurality of portions and the alignment of liquid crystal molecules is made different depending on each portion of the pixel for viewing angle expansion, a protrusion 137 is preferably formed over the pixel electrode layer 135 (FIG. 28C). FIG. 29B is a top view of FIG. 28C at this time.

Through the steps described above, an element substrate which can be used for a liquid crystal display device and which has a thin film transistor with high on-current as compared to a thin film transistor in which an amorphous semiconductor is included in a channel formation region and with low off-current as compared to a thin film transistor in which a microcrystalline semiconductor is included in a channel formation region can be manufactured with a smaller number of masks than that in Embodiment 5.

Embodiment 10

In Embodiment 10, regarding the thin film transistor described in Embodiment 3, a method for manufacturing the thin film transistor illustrated in FIG. 11 will be described. In this embodiment, the semiconductor layer 141 including crystal regions in an amorphous structure is formed through two different conditions.

A method for forming the gate electrode layer is the same as that in Embodiment 5; thus, a series of steps from a step of forming the gate insulating layer 107 to a step of forming the impurity semiconductor layer 113 are described below with reference to FIG. 25.

Figure 25:
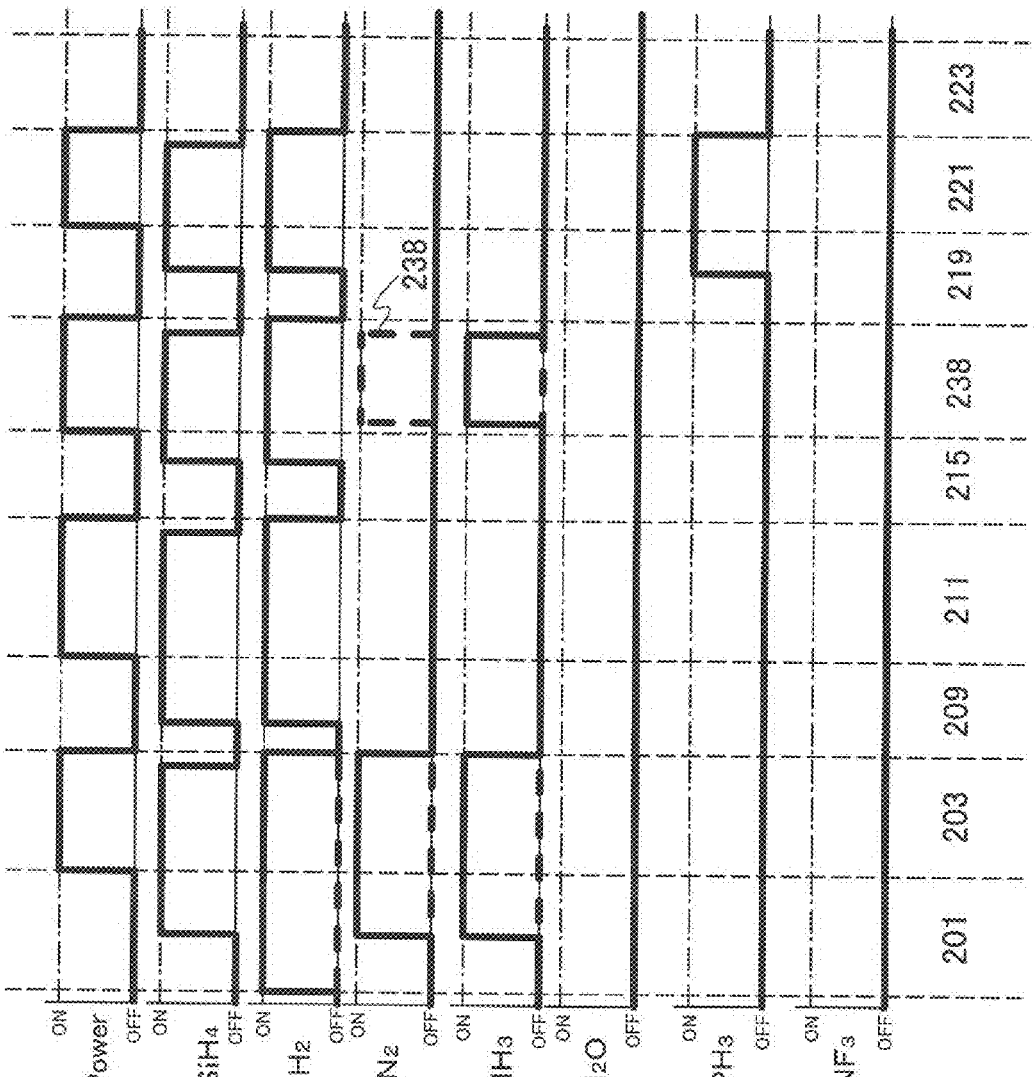
FIG. 25 is an example of a timing chart of a method for manufacturing a thin film transistor according to an embodiment of the present invention.

First, a substrate over which the gate electrode layer 103 is formed is heated in the treatment chamber 241 of a CVD apparatus, and in order to form a silicon nitride layer as the gate insulating layer 107, source gases used for depositing a silicon nitride layer are introduced to the treatment chamber 241 (pretreatment 201 in FIG. 25).

Next, as the gate insulating layer 107, a silicon nitride layer is formed. For the deposition condition at this time, the condition at the time of the formation of SiN 203 described in Embodiment 5 can be used.

Next, source gases used for deposition of the semiconductor layer 141 including crystal regions in an amorphous structure are introduced to the treatment chamber 241 (replacement of gases 209 in FIG. 25). Then, part of the semiconductor layer including crystal regions in an amorphous structure is formed over the gate insulating layer 107 under a first condition; consequently, inverted conical or pyramidal crystal regions can be formed like the semiconductor layer 132i illustrated in FIGS. 13A to 13B-3.

In the case where the outermost surface of the gate insulating layer 107 is not a silicon nitride layer, as described in Embodiment 5, after the gate insulating layer 107 is formed, the flush treatment 213 illustrated in FIG. 20 may be carried out and nitrogen may be adsorbed onto the surface of the gate insulating layer 107, and then replacement of gases 209 and formation of semiconductor layer 211 may be carried out. Alternatively, as described in Embodiment 6, after the gate insulating layer 107 is formed, the precoating treatment 233 illustrated in FIG. 21 may be carried out and a silicon nitride layer may be formed in the treatment chamber. After that, the replacement of gases 209 and the formation of semiconductor layer 211 may be carried out.

Through the first condition, nitrogen is supplied to the surface of the gate insulating layer 107. As described above, nitrogen inhibits generation of nucleus of silicon. Therefore, nuclei of silicon crystals are not likely to be generated in the early stage of the deposition of the semiconductor layer. The semiconductor layer is deposited while the nitrogen concentration is reduced. When the nitrogen concentration is less than or equal to a given value, crystal nuclei are generated, and after that, the crystal nuclei grow, so that the conical or pyramidal crystal regions or the minute crystal grains are formed.

Next, the gases used for deposition of the semiconductor layer 141 including crystal regions in an amorphous structure are introduced (replacement of gases 215 in FIG. 25). Here, the other part of the semiconductor layer including crystal regions in an amorphous structure is formed under a second condition. Here, a gas containing nitrogen is used for the source gases, similarly to the formation of buffer layer 217 described in Embodiment 7. Consequently, regular conical or pyramidal crystal regions are formed like the semiconductor layer 132j illustrated in FIGS. 13A to 13B-3.

With the use of the second condition, the semiconductor layer 132j is deposited while controlling the crystal growth. Therefore, the crystal growth in which the crystal regions included in the semiconductor layer 132i are used as seed crystals is controlled, whereby a structure in which the width of each of the crystal regions is narrowed can be obtained, that is, regular conical or pyramidal crystal regions can be formed.

Then, as a method for forming the impurity semiconductor layer 113, steps from replacement of gases 219 to exhaust of gas 223 are carried out.

Through the above steps, over the gate insulating layer 107, a semiconductor layer including the crystal regions 132h having a quadrangular shape each angle of which is not 90°, typically, a diamond shape in the amorphous structure 131b can be formed.

An element substrate which can be used for a liquid crystal display device and which has a thin film transistor with high on-current as compared to a thin film transistor in which an amorphous semiconductor is included in a channel formation region and with low off-current as compared to a thin film transistor in which a microcrystalline semiconductor is included in a channel formation region can be manufactured.

Embodiment 11

In Embodiment 11, a structure of a thin film transistor which can reduce contact resistance will be described. Specifically, the source and drain regions described in Embodiments 1 to 9 are formed using a semiconductor layer containing an impurity element imparting one conductivity type and nitrogen (hereinafter referred to as an impurity semiconductor layer containing nitrogen).

An impurity semiconductor layer containing nitrogen is formed by combining steps of forming the impurity semiconductor layer and the buffer layer in Embodiments 5 to 7. Specifically, in the case of combining the step of formation of the semiconductor layer including crystal regions in an amorphous structure and the step of formation of the impurity semiconductor layer described in Embodiment 5, in FIG. 20, flush treatment 213 is performed between the formation of buffer layer 217 and the replacement of gases 219, whereby the nitrogen concentration on the surface of the buffer layer may be made higher and the nitrogen concentration in the impurity semiconductor layer may be made higher.

Alternatively, in the case of combining a step of forming the semiconductor layer including crystal regions in an amorphous structure and a step of forming the impurity semiconductor layer which are described in Embodiment 6, in FIG. 21, the steps from unload 225 to load 231 are performed between formation of buffer layer 217 and replacement of gases 219, and a silicon nitride layer is formed on the inner wall of the reaction chamber, whereby the nitrogen concentration in the reaction chamber may be made higher and the nitrogen concentration in the impurity semiconductor layer may be made higher.

Further alternatively, in the case of combining a step of forming the semiconductor layer including crystal regions in an amorphous structure and a step of forming the impurity semiconductor layer which are described in Embodiment 7, in a step of formation of impurity semiconductor layer 221 in FIG. 22, an ammonia gas or a nitrogen gas is introduced, whereby the nitrogen concentration in the impurity semiconductor layer may be made higher.

In addition to an impurity element imparting one conductivity type, nitrogen is contained in the source and drain regions, whereby the defect levels of the source and drain regions can be reduced. In addition, in addition to an impurity element imparting one conductivity type, an NH group or an $NH_2$ group is contained in the source and drain regions in some cases, and defect levels in the source region and the drain region can be reduced with this structure. Therefore, the electric conductivity between the source and drain regions can be increased and contact resistance can be reduced.

Embodiment 12

The thin film transistors described in Embodiments 1 to 4 can be used for light-emitting display devices or light-emitting devices. As light-emitting elements used for light-emitting display devices or light-emitting devices, typically, light-emitting elements utilizing electroluminescence can be given. Light-emitting elements utilizing electroluminescence are roughly classified according to whether a light-emitting material is an organic compound or an inorganic compound. In general, the former is referred to as organic EL elements and the latter as inorganic EL elements.

Further, a light-emitting element is formed over the element substrate as described in Embodiments 5 and 11, whereby a light-emitting display device or a light-emitting device can be manufactured.

Since the thin film transistor having high on-current and low off-current is used as a pixel transistor in the light-emitting display device and the light-emitting device of this embodiment, a light-emitting display device and a light-emitting device having preferable image quality (for example, high contrast) and low power consumption can be manufactured.

Embodiment 13

Next, an example of a structure of a display panel included in a display device to which any of the above embodiments can be applied will be described below.

FIG. 31A illustrates a mode of a display panel in which only a signal line driver circuit 303 is formed separately to be connected to a pixel portion 302 formed over a substrate 301. An element substrate provided with the pixel portion 302, a protective circuit 306, and a scanning line driver circuit 304 is formed using the thin film transistor described in any of Embodiments 1 to 12. The signal line driver circuit 303 may be formed with a transistor using a single crystal semiconductor for a channel formation region, a thin film transistor using a polycrystalline semiconductor for a channel formation region, or a transistor using silicon on insulator (SOI) for a channel formation region. The transistor using SOI for a channel formation region includes a transistor using a single crystal semiconductor layer provided over a glass substrate for a channel formation region. To each of the pixel portion 302, the signal line driver circuit 303, and the scanning line driver circuit 304, potential of a power source, various signals, and the like are supplied through an FPC 305. The protective circuit 306 formed using the thin film transistor described in any of embodiments 1 to 12 may be provided between the signal line driver circuit 303 and the FPC 305 and/or between the signal line driver circuit 303 and the pixel portion 302. As the protective circuit 306, one or more elements selected from a thin film transistor with another structure, a diode, a resistive element, a capacitor, and the like may be used.

Note that the signal line driver circuit and the scanning line driver circuit may both be formed over a substrate over which a pixel transistor of the pixel portion is formed.

Further, when the driver circuit is separately formed, a substrate provided with the driver circuit is not always necessary to be attached to a substrate provided with the pixel portion, and may be attached to, for example, the FPC. FIG. 31B illustrates a mode of a display panel in which an element substrate provided with a pixel portion 312, a protective circuit 316, and a scanning line driver circuit 314 which are formed over a substrate 311 is connected to an FPC 315, with only a signal line driver circuit 313 formed separately. The pixel portion 312, the protective circuit 316, and the scanning line driver circuit 314 are formed using the thin film transistor described in any of the above embodiments. The signal line driver circuit 313 is connected to the pixel portion 312 through the FPC 315 and the protection circuit 316. To each of the pixel portion 312, the signal line driver circuit 313, and the scanning line driver circuit 314, potential of a power source, various signals, and the like are supplied through the FPC 315. The protective circuit 316 may also be provided between the FPC 315 and the pixel portion 312.

Furthermore, only part of the signal line driver circuit or part of the scanning line driver circuit may be formed over a substrate over which the pixel portion is formed, using the thin film transistor described in any of the above embodiments, and the rest may be formed separately and electrically connected to the pixel portion. FIG. 31C illustrates the mode of a display panel in which an analog switch 323a included in a signal line driver circuit is formed over a substrate 321, over which a pixel portion 322 and a scanning line driver circuit 324 are formed, and a shift register 323b included in the signal line driver circuit is separately formed over a different substrate and then attached to the substrate 321. The pixel portion 322, a protective circuit 326, and the scanning line driver circuit 324 are each formed using the thin film transistor described in any of the above embodiments. The shift register 323b included in the signal line driver circuit is connected to the pixel portion 322 through the analog switch 323a and the protective circuit 326. To each of the pixel portion 322, the signal line driver circuit, and the scanning line driver circuit 324, potential of a power source, various signals, and the like are supplied through an FPC 325. The protective circuit 326 may also be provided between the FPC 325 and the analog switch 323a.

As illustrated in each of FIGS. 31A to 31C, in the display device of this embodiment, part or all of the driver circuits can be formed using the thin film transistor described in any of the above embodiments over a substrate over which the pixel portion is formed.

Note that a connection method of a substrate which is separately formed is not particularly limited, and a known COG method, wire bonding method, TAB method, or the like can be used. In addition, a position for connection is not limited to the positions illustrated in FIGS. 31A to 31C as long as electrical connection is possible. A controller, a CPU, a memory, or the like may be formed separately and connected.

Note that the signal line driver circuit used in this embodiment includes a shift register and an analog switch. In addition to the shift register and the analog switch, another circuit such as a buffer, a level shifter or a source follower may be included. The shift register and the analog switch are not necessarily provided, and for example, a different circuit such as a decoder circuit which can select signal lines may be used instead of the shift register, and a latch or the like may be used instead of the analog switch.

Embodiment 14

An element substrate which is formed using the thin film transistor described in any of the above embodiments and a display device or the like using this element substrate can be applied to an active-matrix display panel. That is, the above embodiments can be applied to all the electronic devices including the element substrate and the display device or the like in a display portion.

Examples of such electronic devices include a camera such as a video camera or a digital camera, a head-mounted display (a goggle-type display), a car navigation system, a projector, a car stereo, a personal computer, and a portable information terminal (such as a mobile computer, a cellular phone, or an e-book reader). Examples of these devices are illustrated in FIGS. 32A to 32D.

FIG. 32A illustrates a television device. The television device can be completed by incorporating the display panel to which any of the above embodiments is applied into a housing. A main screen 333 is formed with the display panel, and a speaker portion 339, operation switches, or the like are provided as other additional accessories.

As illustrated in FIG. 32A, a display panel 332 utilizing a display element is incorporated into a housing 331. In addition to reception of general television broadcast by a receiver 335, communication of information in one direction (from a transmitter to a receiver) or in two directions (between a transmitter and a receiver or between receivers) can be performed by connection to a wired or wireless communication network through a modem 334. Operation of the television device can be performed by the switch incorporated into the housing or a remote control device 336. This remote control device 336 may also be provided with a display portion 337 for displaying output information. Further, the display portion 337 may also be provided with the thin film transistor described in any of the above embodiments. Further, the television device may include a sub screen 338 formed with a second display panel to display channels, volume, or the like, in addition to the main screen 333. In this structure, the thin film transistor described in any of Embodiments 1 to 12 can be applied to one or both of the main screen 333 and the sub screen 338.

FIG. 33 is a block diagram illustrating a main structure of a television device. A display panel is provided with a pixel portion 371. A signal line driver circuit 372 and a scanning line driver circuit 373 may be mounted on the display panel by a COG method.

As another external circuit, a video signal amplifier circuit 375 that amplifies a video signal among signals received by a tuner 374; a video signal processing circuit 376 that converts the signals outputted from the video signal amplifier circuit 375 into chrominance signals corresponding to colors of red, green, and blue; a control circuit 377 that converts the video signal into an input specification of the driver 1C; and the like are provided on an input side of the video signal. The control circuit 377 outputs a signal to both a scanning line side and a signal line side. In the case of digital driving, a structure may be employed in which a signal dividing circuit 378 is provided on the signal line side and an input digital signal is divided into m pieces to be supplied.

Among the signals received by the tuner 374, an audio signal is transmitted to an audio signal amplifier circuit 379, and an output thereof is supplied to a speaker 383 through an audio signal processing circuit 380. A control circuit 381 receives control information of a receiving station (received frequency) or a sound volume from an input portion 382, and transmits signals to the tuner 374 and the audio signal processing circuit 380.

Needless to say, this embodiment is not limited to a television device, and can be applied to monitors of personal computers, or display media having a large area, such as information display boards in railway stations, airports, and the like, and street-side advertisement display boards.

As described above, a television device having high image quality and low power consumption can be manufactured by applying the thin film transistor described in any of the above embodiments to one or both of the main screen 333 and the sub screen 338.

FIG. 32B illustrates one example of a cellular phone 341. The cellular phone 341 includes a display portion 342, an operation portion 343, and the like. The image quality thereof can be improved and the power consumption thereof can be reduced by applying, to the display portion 342, the thin film transistor described in any of the above embodiments.

A portable computer illustrated in FIG. 32C includes a main body 351, a display portion 352, and the like. The image quality thereof can be improved and the power consumption thereof can be reduced by applying, to the display portion 352, the thin film transistor described in Embodiment 1 or the like.

FIG. 32D illustrates a desk lamp, which includes a lighting portion 361, a shade 362, an adjustable arm 363, a support 364, a base 365, a power source switch 366, and the like. The desk lamp is manufactured using, for the lighting portion 361, the light-emitting device which is described in the above embodiment. The image quality thereof can be improved and the power consumption thereof can be reduced by applying, to the lighting portion 361, the thin film transistor described in Embodiment 1 or the like.

Figure 34A:
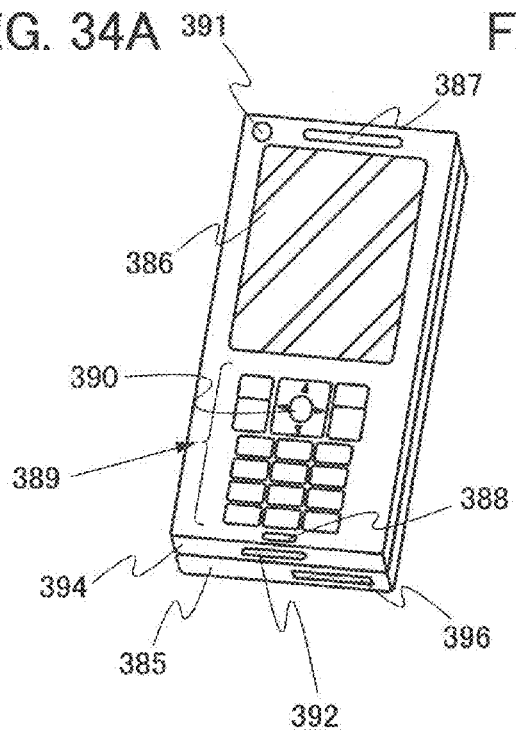
FIGS. 34A to 34C are explanatory views of an electronic device to which a thin film transistor according to an embodiment of the present invention can be applied.
Figure 34B:
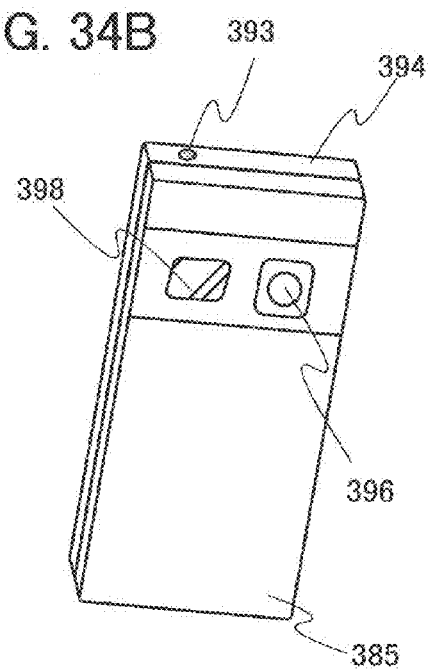
Figure 34C:
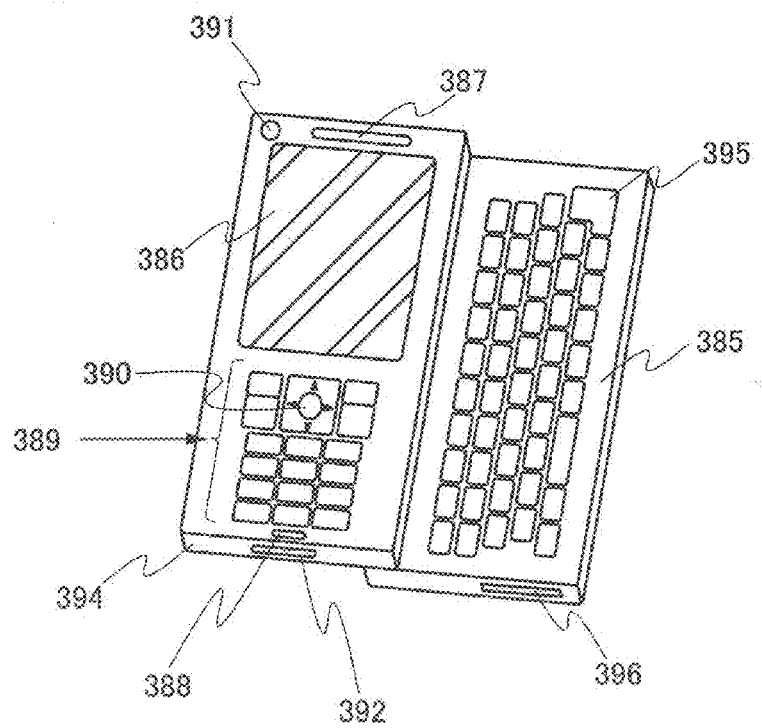

FIGS. 34A to 34C illustrate an example of a structure of a cellular phone, and an element substrate having the thin film transistor described in any of the above embodiments and a display device having the element substrate are applied to, for example, a display portion thereof. FIG. 34A is a front view, FIG. 34B is a rear view, and FIG. 34C is a development view. The cellular phone illustrated in FIG. 34A to 34C includes two housings, a housing 394 and a housing 385. The cellular phone illustrated in FIGS. 34A to 34C, which is also referred to as a smartphone, has both of functions of a cellular phone and a portable information terminal, incorporates a computer, and can perform a variety of data processing in addition to voice calls.

The cellular phone includes two housings, the housing 394 and the housing 385. The housing 394 includes a display portion 386, a speaker 387, a microphone 388, operation keys 389, a pointing device 390, a front camera lens 391, a jack 392 for an external connection terminal, an earphone terminal 393, and the like, while the housing 385 includes a keyboard 395, an external memory slot, a rear camera 396, a light 398, and the like. In addition, an antenna is incorporated into the housing 394.

In addition to the structure described above, a non-contact IC chip, a small size memory device, or the like can be incorporated therein.

The housings 394 and 385 are overlapped with each other in FIG. 34A and slid from a state illustrated in FIG. 34A, and the cellular phone is opened as illustrated in FIG. 34C. In the display portion 386, the display device described in any of the above embodiments can be incorporated, and a display direction can be changed as appropriate depending on a use mode. Note that since the front camera lens 391 is provided in the same plane as the display portion 386, the cellular phone can be used as a videophone. A still image and a moving image can be taken by the rear camera 396 and the light 398 by using the display portion 386 as a viewfinder.

The speaker 387 and the microphone 388 can be used for videophone, recording and playing sound, and the like without being limited to voice calls. With the use of the operation keys 389, operation of incoming and outgoing calls, simple information input such as electronic mail, scrolling of a screen, cursor motion, and the like are possible.

If much information needs to be treated, such as documentation, use as a portable information terminal, and the like, it is convenient to use the keyboard 395. The housings 394 and 385 that are overlapped with each other (FIG. 34A) can be slid and the cellular phone is opened as illustrated in FIG. 34C, so that the cellular phone can be used as a portable information terminal. In addition, with the use of the keyboard 395 and the pointing device 390, smooth operation is possible. An AC adaptor and various types of cables such as a USB cable can be connected to the jack 392 for an external connection terminal, through which charging and data communication with a personal computer or the like are possible. Moreover, by inserting a recording medium into the external memory slot, a large amount of data can be stored and transferred.

In the rear surface of the housing 385 (FIG. 34B), the rear camera 396 and the light 398 are provided, and a still image and a moving image can be taken by using the display portion 386 as a viewfinder.

Further, the cellular phone may have an infrared communication function, a USB port, a function of receiving one segment television broadcast, a non-contact IC chip, an earphone jack, or the like, in addition to the above structures.

The image quality can be improved and the power consumption can be reduced by applying, to a pixel, the thin film transistor described in any of the above embodiments.

Example 1

In Example 1, an image of a cross section of the thin film transistor manufactured according to Embodiment 6, which is observed by scanning transmission electron microscopy (STEM), is shown in FIGS. 35A and 35B.

First, a manufacturing process of the thin film transistor will be described with reference to FIGS. 15A to 15C and 16A to 16C.

A gate electrode layer 103 was formed over a substrate 101.

Here, as the substrate 101, a glass substrate with a thickness of 0.7 mm (EAGLE2000, manufactured by Corning, Inc.) was used.

A molybdenum target was sputtered on the substrate using argon ions with a flow rate of 50 sccm, so that a molybdenum layer with a thickness of 150 nm was formed. Next, after a resist was applied to the molybdenum layer, the resist was exposed to light with the use of a first photomask and developed, thereby forming a resist mask.

Next, the molybdenum layer was etched using the resist mask, thereby forming the gate electrode layer 103, in this example, an inductively coupled plasma (ICP) etching apparatus was used. The etching condition was as follows: the ICP power was 800 W, the bias power was 100 W, the pressure was 1.5 Pa, and as for the etching gases, the flow rate of carbon fluoride was 25 sccm, the flow rate of chlorine was 25 sccm, and the flow rate of oxygen was 10 sccm.

After the etching, the resist mask was removed.

Then, over the gate electrode layer 103 and the substrate 101, a gate insulating layer 107, a semiconductor layer 109, a buffer layer 111, and an impurity semiconductor layer 113 were formed successively without being exposed to the atmosphere (FIG. 15A).

Here, as the gate insulating layer 107, a silicon nitride layer and a silicon oxynitride layer were stacked. First, a silicon nitride layer with a thickness of 110 nm was formed by a plasma CVD method. The deposition condition at this time was as follows: as for the source gases, the flow rate of $SiH_4$ was 40 sccm, the flow rate of $H_2$ was 500 sccm, the flow rate of $N_2$ was 550 sccm, and the flow rate of $NH_3$ was 140 sccm, the pressure in the treatment chamber was 100 Pa, the temperature of the substrate was 280° C., the RF power source frequency was 13.56 MHz, and the power of the RF power source was 370 W; plasma discharge was performed under this condition. Next, a silicon oxynitride layer with a thickness of 110 nm was formed by a plasma CVD method. The deposition condition at this time was as follows: as for the source gases, the flow rate of $SiH_4$ was 30 sccm and the flow rate of $N_2O$ was 1200 sccm, the pressure in the treatment chamber was 40 Pa, the temperature of the substrate was 280° C., the RF power source frequency was 13.56 MHz, and the power of the RF power source was 50 W; plasma discharge was performed under this condition.

Then, the substrate 101 was carried out of the treatment chamber, and the inside of the treatment chamber was cleaned with an $NF_3$ gas. After that, a source gas for forming a protective layer in the treatment chamber was introduced, and treatment to form an amorphous silicon layer as the protective layer inside of the treatment chamber was performed. The deposition condition at this time was as follows: as for the source gas, the flow rate of $SiH_4$ was 300 sccm, the pressure in the treatment chamber was 160 Pa, the temperature of the substrate was 280° C., the RF power source frequency was 13.56 MHz, and the power of the RF power source was 120 W; plasma discharge was performed under this condition.

After that, the substrate 101 was carried into the treatment chamber and a microcrystalline silicon layer with a thickness of 5 nm was formed as the semiconductor layer 109 over the gate insulating layer 107. The deposition condition at this time was as follows: as for the source gases, the flow rate of $SiH_4$ was 10 sccm and the flow rate of $H_2$ was 1500 sccm, the pressure in the treatment chamber was 280 Pa, the temperature of the substrate was 280° C., the RF power source frequency was 13.56 MHz, and the power of the RF power source was 50 W; plasma discharge was performed under this condition.

Next, as the buffer layer 111, a silicon layer including crystal regions in an amorphous structure with a thickness of 55 nm was formed over the semiconductor layer 109. The deposition condition at this time was as follows: as for the source gases, the flow rate of $SiH_4$ was 20 sccm, the flow rate of $H_2$ was 1250 sccm, and the flow rate of 100 ppm $NH_3$ (diluted with hydrogen) was 250 sccm, the pressure in the treatment chamber was 280 Pa, the temperature of the substrate was 280° C., the RF power source frequency was 13.56 MHz, and the power of the RE power source was 50 W; plasma discharge was performed under this condition.

Next, as the impurity semiconductor layer 113, an amorphous silicon layer to which phosphorus was added with a thickness of 50 nm was formed over the buffer layer 111. The deposition condition at this time was as follows: as for the source gases, the flow rate of $SiH_4$ was 100 sccm and the flow rate of 0.5% phosphine (diluted with hydrogen) was 170 sccm, the deposition temperature was 280° C., the pressure was 170 Pa, the RF power source frequency was 13.56 MHz, and the power of the RF power source was 60 W; plasma discharge was performed under this condition.

Next, a resist was applied to the impurity semiconductor layer 113, and then exposed to light using a second photomask and developed, thereby forming a resist mask. Next, with the use of the resist mask, the semiconductor layer 109, the buffer layer 111, and the impurity semiconductor layer 113 were etched, whereby a semiconductor layer 115, a buffer layer 117, and an impurity semiconductor layer 119 were formed (FIG. 15B). Here, an ICP etching apparatus was used, and the etching condition was as follows: the ICP power was 150 W, the bias power was 40 W, the pressure was 1.0 Pa, the etching gas was chlorine with a flow rate of 100 sccm, and the etching time was 78 seconds.

Next, as illustrated in FIG. 15C, a conductive layer 121 was formed so as to cover the gate insulating layer 107, the semiconductor layer 115, the buffer layer 117, and the impurity semiconductor layer 119. Here, a molybdenum target was sputtered using argon ions with a flow rate of 50 sccm, thereby forming a molybdenum layer with a thickness of 300 nm.

Next, a resist was applied to the conductive layer 121 and then exposed to light using a third photomask and developed, thereby forming a resist mask. With the use of the resist mask, the conductive layer 121 was etched by wet etching, thereby forming wiring layers 123 and 125 as illustrated in FIG. 16A. Note that the planar shape of each of the wiring layers 123 and 125 was linear in this example.

Next, with the use of the resist mask, the impurity semiconductor layer 119 was etched, so that source and drain regions 129 were formed. In this process, part of the surface of the buffer layer 117 was also etched, so that a buffer layer 131 was obtained (FIG. 16B). Here, an ICP etching apparatus was used, and the etching condition was as follows: the ICP power was 150 W, the bias power was 40 W, the pressure was 1.0 Pa, the etching gas was chlorine with a flow rate of 100 sccm, and the etching time was 33 seconds. The thickness of the buffer layer 131 at this time was 40 nm. After that, the resist mask was removed.

Then, the surfaces of the buffer layer 131, and the source and drain regions 129 were irradiated with carbon fluoride plasma, whereby an impurity remaining on the buffer layer 131 was removed. Here, an ICP etching apparatus was used, and the etching condition was as follows: the source power was 1000 W, the bias power was 0 W, the pressure was 0.67 Pa, the etching gas was carbon fluoride with a flow rate of 100 sccm, and the etching time was 30 seconds.

Next, as an insulating layer 133, a silicon nitride layer with a thickness of 300 nm was formed (FIG. 16C). The deposition condition at this time was as follows: as for the source gases, the flow rate of $SiH_4$ was 20 sccm, the flow rate of $NH_3$ was 220 sccm, the flow rate of nitrogen was 450 sccm, and the flow rate of hydrogen was 450 sccm, the pressure in the treatment chamber was 160 Pa, the temperature of the substrate was 280° C., the RF power source frequency was 13.56 MHz, and the power of the RF power source was 150 W; plasma discharge was performed under this condition.

Next, a resist was applied to the insulating layer and then exposed to light using a fourth photomask and developed, thereby forming a resist mask. With the use of the resist mask, part of the insulating layer was etched by dry etching, so that the wiring layer 125 was exposed. In addition, part of the insulating layer and part of the gate insulating layer 107 were etched by dry etching, so that the gate electrode layer 103 was exposed. Here, an ICP etching apparatus was used. The ICP power was 475 W, the bias power was 300 W, the pressure was 5.5 Pa, and the etching gases included $CHF_3$ with a flow rate of 50 sccm and helium with a flow rate of 100 sccm. Plasma was generated under this condition. Then, etching treatment was performed with the use of $CHF_3$ with a flow rate of 7.5 sccm and helium with a flow rate of 142.5 sccm as the etching gases. After that, the resist mask was removed.

Next, a conductive layer was formed over the insulating layer. Here, an ITO film containing silicon oxide with a thickness of 50 nm was formed as the conductive layer by a sputtering method.

Next, a resist was applied to the conductive layer and then exposed to light using a fifth photomask and developed, thereby forming a resist mask. With the use of the resist mask, part of the conductive layer was etched by dry etching, thereby forming a pixel electrode layer 135. Next, after removing the resist mask, the ITO film containing silicon oxide was baked by heating at 250° C. for one hour.

Through the above process, the thin film transistor and the pixel electrode connected to the thin film transistor were manufactured.

An image of a cross section of the thin film transistor which was observed by STEM is shown in FIG. 35A. FIG. 35B is a schematic view of FIG. 35A.

In FIG. 35B, the silicon nitride layer and the silicon oxynitride layer each of which was formed as the gate insulating layer 107 are denoted by SiN and SiON, respectively. In addition, the semiconductor layer 115 is indicated by μc-Si and the buffer layer 131 is indicated by buffer layer. Further, the source and drain regions 129 are indicated by $n^+$ a-Si and the wiring layer 123 is indicated by Mo.

As shown in FIGS. 35A and 35B, in the buffer layer 131, conical or pyramidal crystal regions are formed. In addition, it is found that crystal regions which extend from the semiconductor layer 115 to the buffer layer in regular conical or pyramidal shapes are formed. This condition is also expressed as "the interface between the amorphous structure and the crystal regions in the buffer layer 131 is uneven".

Example 2

In Example 2, electric characteristics of a thin film transistor which is manufactured in accordance with Embodiment 6 are described.

First, a manufacturing process of the thin film transistor will be described with reference to FIGS. 15A to 15C and 16A to 16C.

A gate electrode layer 103 was formed over a substrate 101.

Here, as the substrate 101, a glass substrate with a thickness of 0.7 mm (EAGLE2000, manufactured by Corning, Inc.) was used.

In a manner similar to that of Example 1, a molybdenum layer with a thickness of 150 nm was formed over the substrate. Next, after a resist was applied to the molybdenum layer, the resist was exposed to light with the use of a first photomask and developed, thereby forming a resist mask.

Next, in a manner similar to that of Example 1, the molybdenum layer was etched using the resist mask, thereby forming the gate electrode layer 103. After that, the resist mask was removed.

Then, over the gate electrode layer 103 and the substrate 101, a gate insulating layer 107, a semiconductor layer 109, a buffer layer 111 and an impurity semiconductor layer 113 were formed successively (FIG. 15A).

Here, as the gate insulating layer 107, a silicon nitride layer and a silicon oxide layer were stacked. First, a silicon nitride layer with a thickness of 110 nm was formed by a plasma CVD method under a condition similar to that of Example 1. Next, a silicon oxide layer with a thickness of 110 nm was formed by a plasma CVD method. The deposition condition at this time was as follows: the source gases including tetraethyl orthosilicate (TEOS) with a flow rate of 15 sccm and $O_2$ with a flow rate of 750 sccm were introduced and stabilized, the pressure in the treatment chamber was 100 Pa, the temperature of an upper electrode was 300° C., the temperature of a lower electrode was 297° C., the RF power source frequency was 27 MHz, and the power of the RF power source was 300 W; plasma discharge was performed under this condition.

Next, as the semiconductor layer 109, a microcrystalline silicon layer with a thickness of 5 nm was formed over the gate insulating layer 107 under a condition similar to that of Example 1.

Next, as the buffer layer 111, a silicon layer including crystal regions in an amorphous structure with a thickness of 75 nm was formed over the semiconductor layer 109 under a condition similar to that of Example 1.

Next, as the impurity semiconductor layer 113, an amorphous silicon layer to which phosphorus was added with a thickness of 50 nm was formed over the buffer layer 111 under a condition similar to that of Example 1.

Next, a resist was applied to the impurity semiconductor layer 113, and then exposed to light using a second photomask and developed, thereby forming a resist mask. Next, with the use of the resist mask, the semiconductor layer 109, the buffer layer 117, and the impurity semiconductor layer 113 were etched, whereby a semiconductor layer 115, a buffer layer 117, and an impurity semiconductor layer 119 were formed (FIG. 15B). Here, an etching condition similar to that of Example 1 was used.

Next, as illustrated in FIG. 15C, a conductive layer 121 was formed so as to cover the gate insulating layer 107, the semiconductor layer 115, the buffer layer 117, and the impurity semiconductor layer 119. Here, a molybdenum layer with a thickness of 300 nm was formed under a condition similar to that of Example 1.

Next, a resist was applied to the conductive layer 121 and then exposed to light using a third photomask and developed thereby forming a resist mask. With the use of the resist mask, the conductive layer 121 was etched by wet etching, thereby forming wiring layers 123 and 125 as illustrated in FIG. 16A. Note that the planar shape of each of the wiring layers 123 and 125 was linear in this example.

Next, with the use of the resist mask, the impurity semiconductor layer 119 was etched, so that source and drain regions 129 were formed. In this process, part of the surface of the buffer layer 117 was also etched, so that a buffer layer 131 was obtained (FIG. 16B). Here, an etching condition similar to that of Example 1 was used. The thickness of the buffer layer 131 at this time was 40 nm.

Then, the surfaces of the buffer layer 131, and the source and drain regions 129 were irradiated with carbon fluoride plasma, whereby an impurity remaining on the buffer layer 131 was removed. Here, an ICP etching apparatus was used, and the etching condition was as follows: the source power was 1000 W, the pressure was 0.67 Pa, the etching gas was carbon fluoride with a flow rate of 100 sccm, and the etching time was 30 seconds.

Next, the surfaces of the buffer layer 131 and the source and drain regions 129 were irradiated with water plasma. Here, an ICP etching apparatus was used, and the condition was set as follows: the power of the power source was 1800 W, the pressure was 66.5 Pa, and plasma was generated in an atmosphere containing water vapor with a flow rate of 300 sccm, and the surfaces were irradiated with the plasma for 180 seconds. After that, the resist was removed.

Next, as an insulating layer 133, a silicon nitride layer was formed. Here, under the condition similar to that of Example 1, a silicon nitride layer with a thickness of 300 nm was formed.

Next, a resist was applied to the insulating layer and then exposed to light using a fourth photomask and developed, thereby forming a resist mask. With the use of the resist mask, part of the insulating layer was etched by dry etching, so that the wiring layer 125 was exposed. In addition, part of the insulating layer and part of the gate insulating layer 107 were etched by dry etching, so that the gate electrode layer 103 was exposed. Here, the etching condition similar to that of Example 1 was used. After that, the remaining resist mask was removed.

Through the above-described steps, the thin film transistor was manufactured.

Figure 36A:
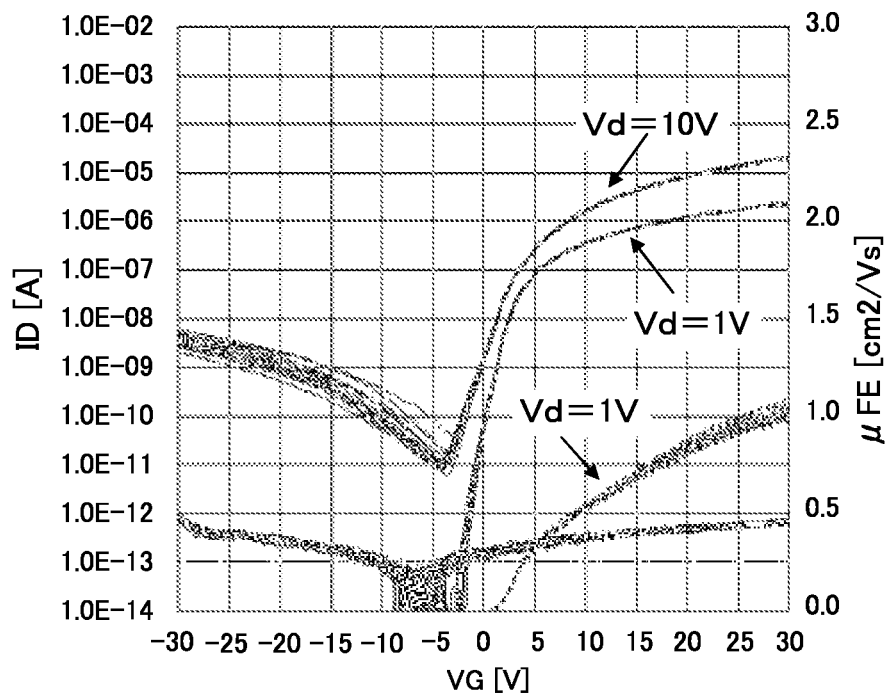
FIGS. 36A and 36B are graphs showing electric characteristics of a thin film transistor manufactured in Example 2.
Figure 36B:
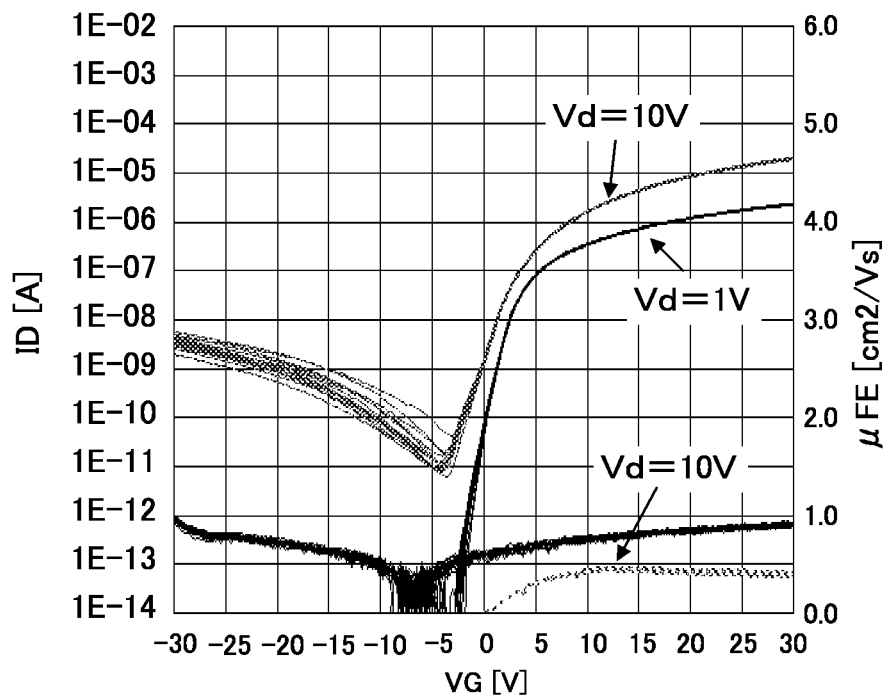

After that, electric characteristics of the thin film transistor were measured and FIGS. 36A and 36B show the results. At this time, measurement was performed by increasing the gate voltage in increments of 0.25 V. In addition, the temperature at the time of measurement was room temperature. Note that the thin film transistor of this example was formed so as to have a channel length of 3.4 μm and a channel width of 20 μm. The channel width W was the width of the gate electrode here. The width of the semiconductor layer 115 was 22 μm. Further, field-effect mobility was calculated under the condition that the thickness of the gate insulating layer of the thin film transistor was the sum of 110 nm of the silicon nitride layer (permittivity: 7) and 110 nm of the silicon oxide layer (permittivity; 4.1). Current vs. voltage characteristics of when the drain voltage was 1 V and current vs. voltage characteristics of when the drain voltage was 10 V are represented by solid lines. In addition, field-effect mobility of when the drain voltage was 1 V is represented by a dashed line in FIG. 36A, and field-effect mobility of when the drain voltage was 10 V is represented by a dashed line in FIG. 36B.

Table 1 shows the measurement results of the following items. Here, average values obtained by performing measurement on 16 thin film transistors are shown.

On-current (Ion) (drain voltage: 10 V, gate voltage: 15 V)
Minimum off-current (Ioff min) (drain voltage: 10 V)
Off-current (Ioff) (drain voltage: 10 V, gate voltage: (gate voltage at minimum off-current−10) V)
On/Off ratio
Threshold Voltage (Vth) (drain voltage: 10 V)
Maximum field-effect mobility (μFE max) (drain voltage: 1 V)
Maximum field-effect mobility (μFE max) (drain voltage: 10 V)

TABLE 1

| Ion [A] | Ioff_min [A] | Ioff [A] | On/Off ratio | Vth [V] | μFE_max [cm2/V · s] (Vd = 1 V) | μFE_max [cm2/V · s] (Vd = 10 V) |
| --- | --- | --- | --- | --- | --- | --- |
| 4.4E−06 | 4.2E−11 | 7.3E−10 | 5.6 | 2.39 ± 0.24 | 1.02 | 0.45 |

As described above, when a silicon oxide layer formed using TEOS is used as the gate insulating layer, a microcrystalline silicon layer is used as the semiconductor layer, and a silicon layer including crystal regions in an amorphous structure is used as the buffer layer, a thin film transistor with high field-effect mobility can be manufactured.

Comparative Example

Here, as a comparative example, electric characteristics of a thin film transistor which does not include a buffer layer and includes a microcrystalline silicon layer as a channel formation layer will be described.

First, a manufacturing process of the thin film transistor will be described with reference to FIGS. 15A to 15C and 16A to 16C. A gate electrode layer 103 was formed under a condition similar to that of Example 1.

As a gate insulating layer 107, a silicon nitride layer and a silicon oxide layer were stacked under a condition similar to that of Example 1.

Then, after the substrate was carried out of a treatment chamber of a CVD apparatus to a waiting chamber, the inside of the treatment chamber was cleaned with nitrogen fluoride. Next, an amorphous silicon layer was formed in the treatment chamber. The deposition condition at this time was as follows: as for the source gas, the flow rate of $SiH_4$ was 300 sccm, the pressure in the treatment chamber was 160 Pa, the temperature of the treatment chamber was 280° C., the RF power source frequency was 13.56 MHz, and the power of the RF power source was 120 W; plasma discharge was performed under this condition.

Next, the substrate was carried into the treatment chamber. Then, as a semiconductor layer 109, a microcrystalline silicon layer with a thickness of 80 nm was formed over the gate insulating layer under a condition similar to that of Example 1.

Next, as an impurity semiconductor layer 113 over the semiconductor layer, a microcrystalline silicon layer to which phosphorus was added with a thickness of 50 nm was formed under a condition similar to that of Example 1 (FIG. 15A, except the buffer layer 111). The deposition condition at this time was as follows: as for the source gases, the flow rate of $SiH_4$ was 10 sccm, the flow rate of 0.5 vol % $PH_3$ (diluted with $H_2$) was 30 sccm, and the flow rate of $H_2$ was 1500 sccm, the pressure in the treatment chamber was 280 Pa, the temperature of the substrate was 280° C., the RF power source frequency was 13.56 MHz, and the power of the RF power source was 300 W; plasma discharge was performed under this condition.

Next, a resist was applied to the impurity semiconductor layer, and then exposed to light using a second photomask and developed, thereby forming a resist mask. Next, with the use of the resist mask, the semiconductor layer and the impurity semiconductor layer were etched, whereby a semiconductor layer 115 and an impurity semiconductor layer 119 were formed (FIG. 15B, except the buffer layer 117). Here, an etching condition similar to that of Example 1 was used.

Next, a conductive layer was formed so as to cover the gate insulating layer, the semiconductor layer and the impurity semiconductor layer (FIG. 15C, except the buffer layer 117). Here, a molybdenum layer with a thickness of 300 nm was formed under a condition similar to that of Example 1.

Next, a resist was applied to the conductive layer and then exposed to light using a third photomask and developed, thereby forming a resist mask. With the use of the resist mask, the conductive layer was etched by wet etching, thereby forming wiring layers 123 and 125 (FIG. 16A, except the buffer layer 117). Note that the planar shape of each of the wiring layers 123 and 125 was linear in this example.

Next, with the use of the resist mask, the impurity semiconductor layer 119 was etched, so that source and drain regions 129 were formed. In this process, part of the surface of the semiconductor layer 109 was also etched (FIG. 16B, except the buffer layer 131). Here, an etching condition similar to that of Example 1 was used.

Then, the exposed surfaces of the semiconductor layer and the source and drain regions 129 were irradiated with carbon fluoride plasma as in Example 1, whereby an impurity remaining on the exposed semiconductor layer was removed.

Next, the exposed surfaces of the semiconductor layer and the source and drain regions 129 were irradiated with water plasma.

Next, a silicon nitride layer was formed as in Example 1.

Next, a resist was applied to the insulating layer and then exposed to light using a fourth photomask and developed, thereby forming a resist mask. With the use of the resist mask, part of the insulating layer was etched by dry etching, so that the wiring layer 125 was exposed. In addition, part of the insulating layer and part of the gate insulating layer 107 were etched by dry etching, so that the gate electrode layer 103 was exposed. Here, an etching condition similar to that of Example 1 was used. After that, the remaining resist mask was removed.

Through the above-described steps, the thin film transistor was manufactured.

Figure 46A:
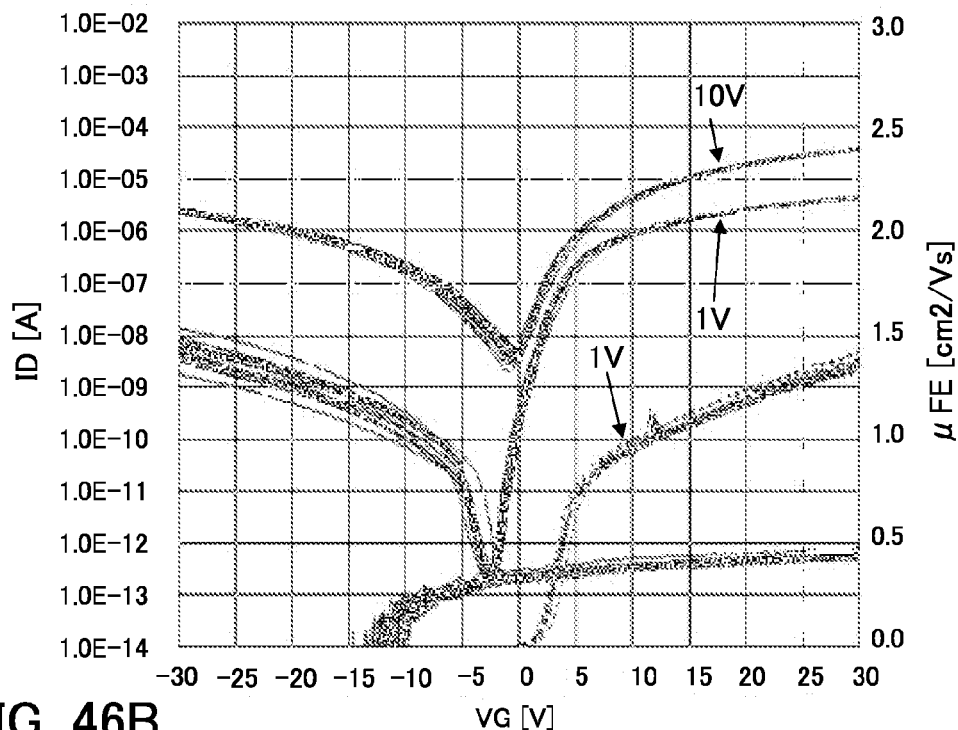
FIGS. 46A and 46B are graphs showing electric characteristics of a thin film transistor manufactured in Comparative Example.
Figure 46B:
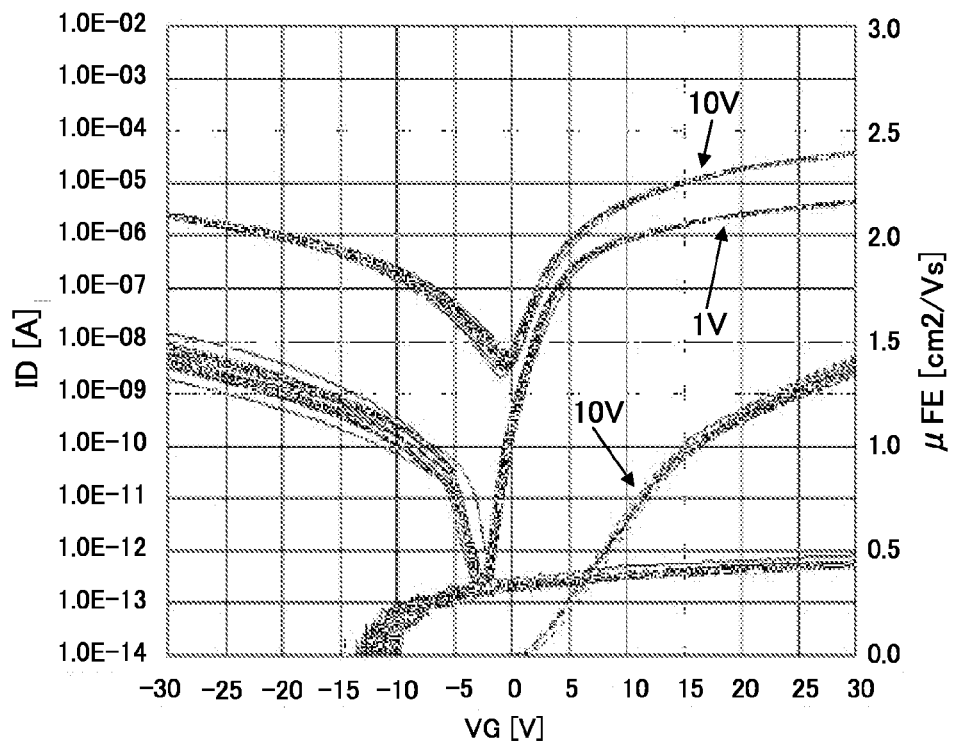

After that, electric characteristics of the thin film transistor were measured and FIGS. 46A and 46B show the results. At this time, measurement was performed by increasing the gate voltage in increments of 0.25 V. In addition, the temperature at the time of measurement was room temperature. Note that the thin film transistor of this example was formed so as to have a channel length of 3.4 μm and a channel width of 24 μm. The channel width W was the width of the gate electrode here. The width of the semiconductor layer 115 was 26 μm. Further, field-effect mobility was calculated under the condition that the thickness of the gate insulating layer of the thin film transistor was the sum of 110 nm of the silicon nitride layer (permittivity: 7) and 110 nm of the silicon oxide layer (permittivity: 4.1). Current vs. voltage characteristics of when the drain voltage was 1 V and current vs. voltage characteristics of when the drain voltage was 10 V are represented by solid lines. Specifically, field-effect mobility of when the drain voltage was 1 V is represented by a dashed line in FIG. 46A, and field-effect mobility of when the drain voltage was 10 V is represented by a dashed line in FIG. 46B.

Table 2 shows the measurement results of the following items. Here, average values obtained by performing measurement on 16 thin film transistors are shown.

On-current (Ion) (drain voltage: 10 V, gate voltage: 15 V)

Minimum off-current (Ioff min) (drain voltage: 10 V)

Off-current (Ioff) (drain voltage: 10 V, gate voltage: (gate voltage at minimum off-current−10) V)

On/Off ratio

Threshold Voltage (Vth) (drain voltage: 10 V)

Maximum field-effect mobility (μFE max) (drain voltage: 1 V)

Maximum field-effect mobility (μFE max) (drain voltage: 10 V)

TABLE 2

| Ion [A] | Ioff_min [A] | Ioff [A] | On/Off ratio | Vth [V] | µFE_max [cm2/V · s] (Vd = 1 V) | µFE_max [cm2/V · s] (Vd = 10 V) |
| --- | --- | --- | --- | --- | --- | --- |
| 1.03E−05 | 4.08E−09 | 2.25E−07 | 3.43 | 1.51 ± 0.66 | 0.77 | 1.36 |

As described above, when a silicon oxide layer formed using TEOS is used as the gate insulating layer, a microcrystalline silicon layer is used as the semiconductor layer, and a silicon layer including crystal regions in an amorphous structure is used as the buffer layer, a thin film transistor with high field-effect mobility can be manufactured. In addition, as compared to the thin film transistor of the comparative example, by providing the silicon layer including crystal regions in an amorphous structure as the buffer layer as described in this example, off-current can be reduced. That is, a thin film transistor with a high on/off ratio can be manufactured.

Figure 37A:
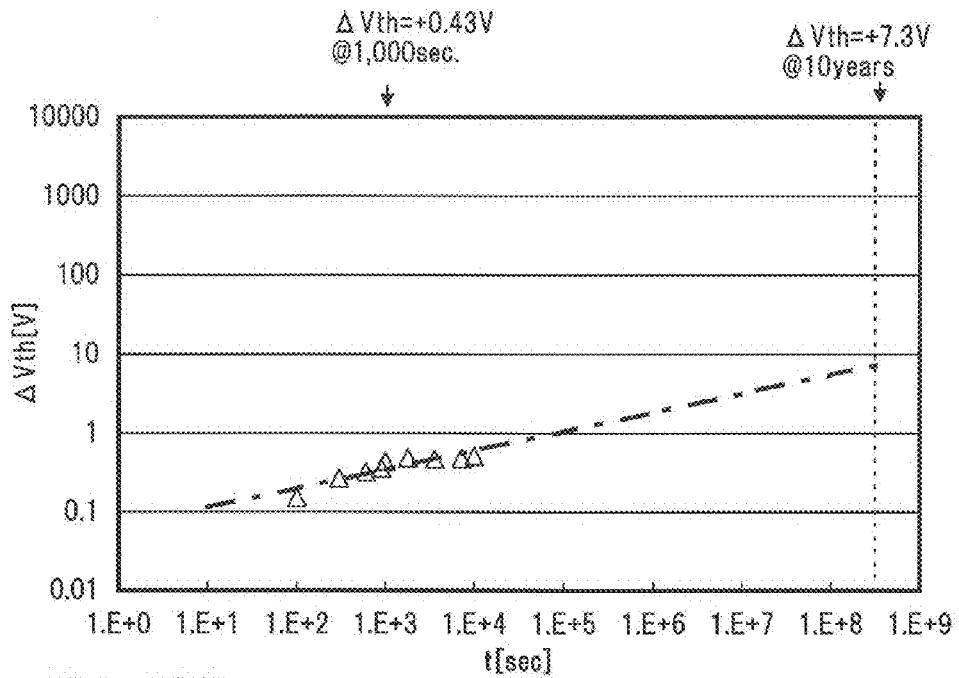
FIGS. 37A and 37B are graphs showing reliability of the thin film transistor manufactured in Example 2.
Figure 37B:
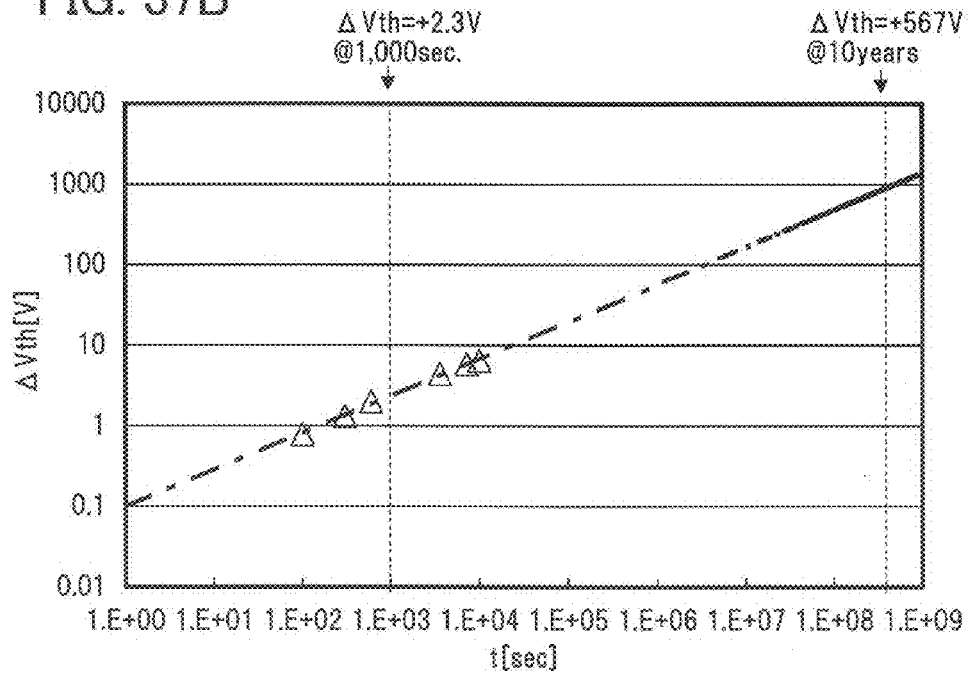

Next, FIGS. 37A and 37B3 show results of bias temperature (BT) test performed on the thin film transistor manufactured in this example.

First, initial characteristics of the thin film transistor were measured and then the BT test was performed on the thin film transistor, and deterioration of the characteristics was examined. At this time, measurement was performed by increasing the gate voltage in increments of 0.25 V. In addition, the temperature at the time of measurement was room temperature. Here, ΔVth is a value obtained by subtracting the threshold voltage at the initial characteristics from the threshold voltage after the BT test.

The stress condition of the BT test under which the measurement results shown in FIGS. 37A and 37B were obtained was as follows: the temperature of the substrate was 85° C., the drain voltage VD was 0.1 V, the source voltage VS was 0 V, and the gate voltage VG was +30 V. In addition, in the thin film transistor which was a target to be measured, the designed value of the channel length L was 10 µm and the designed value of the channel width W was 20 µm. Note that the channel width W was the width of the gate electrode here. In addition, the width of the semiconductor layer 115 was 22 µm. Further, the thickness of the gate insulating layer of the thin film transistor was the sum of 110 nm of the silicon nitride layer (permittivity: 7) and 110 nm of the silicon oxide layer (permittivity: 4.1).

FIG. 37A shows ΔVth of the thin film transistor manufactured in this example. FIG. 37B shows ΔVth of a thin film transistor including an amorphous silicon layer with a thickness of 70 nm, instead of the semiconductor layer and the buffer layer of the thin film transistor in this example. In accordance with the BT test results, an approximate line of values of ΔVth up to a value after 10,000 seconds is represented by a dashed line.

As shown in FIG. 37A, according to the approximate line represented by the dashed line, it is anticipated that ΔVth after 1,000 seconds is +0.43 V and ΔVth after 10 years is +7.3 V. Further, as shown in FIG. 37B, according to the approximate line represented by the dashed line, it is anticipated that ΔVth after 1,000 seconds is +2.3 V and ΔVth after 10 years is +567 V.

According to FIGS. 37A and 37B, the shift of the threshold voltage of the thin film transistor described in this example is smaller than that of an inverted staggered thin film transistor including an amorphous silicon layer in a channel formation region. Accordingly, in accordance with this example, a highly reliable thin film transistor can be manufactured.

Example 3

In Example 3, electric characteristics of a thin film transistor which is manufactured in accordance with Embodiment 6 are described.

First, a manufacturing process of the thin film transistor will be described with reference to FIGS. 15A to 15C and 16A to 16C.

A gate electrode layer 103 was formed over a substrate 101.

Here, as the substrate 101, a glass substrate with a thickness of 0.7 mm (EAGLE2000, manufactured by Corning, Inc.) was used.

In a manner similar to that of Example 1, a molybdenum layer with a thickness of 150 nm was formed over the substrate. Next, after a resist was applied to the molybdenum layer, the resist was exposed to light with the use of a first photomask and developed, thereby forming a resist mask.

Next, in a manner similar to that of Example 1, the molybdenum layer was etched using the resist mask, thereby forming the gate electrode layer 103. After that, the resist mask was removed.

Then, over the gate electrode layer 103 and the substrate 101, a gate insulating layer 107, a semiconductor layer 109, a buffer layer 111 and an impurity semiconductor layer 113 were formed successively (FIG. 15A).

Here, as the gate insulating layer 107, a silicon nitride layer and a silicon oxide layer were stacked in a manner similar to that of Example 2.

Next, as the semiconductor layer 109, a microcrystalline silicon layer with a thickness of 7 nm was formed over the gate insulating layer 107. The deposition condition at this time was as follows: as for the source gases, the flow rate of $SiH_4$ was 10 sccm, the flow rate of $H_2$ was 1500 sccm, and the flow rate of Ar was 2000 sccm, the pressure in the treatment chamber was 280 Pa, the temperature of the substrate was 280° C., the RF power source frequency was 13.56 MHz, and the power of the RF power source was 50 W; plasma discharge was performed under this condition.

Next, as the buffer layer 111, a silicon layer including crystal regions in an amorphous structure with a thickness of 175 nm was formed over the semiconductor layer 109. The deposition condition at this time was as follows: as for the source gases, the flow rate of $SiH_4$ was 30 sccm, the flow rate of $H_2$ was 1475 sccm, and the flow rate of 1000 ppm $NH_3$ (diluted with hydrogen) was 25 sccm, the pressure in the treatment chamber was 280 Pa, the temperature of the substrate was 280° C., the power of the RF power source was 50 W; plasma discharge was performed under this condition.

Next, as the impurity semiconductor layer 113, an amorphous silicon layer to which phosphorus was added with a thickness of 50 nm was formed over the buffer layer 111 under a condition similar to that of Example 1.

Next, a resist was applied to the impurity semiconductor layer 113, and then exposed to light using a second photomask and developed, thereby forming a resist mask. Next, with the use of the resist mask, the semiconductor layer 109, the buffer layer 111, and the impurity semiconductor layer 113 were etched, whereby a semiconductor layer 115, a buffer layer 117, and an impurity semiconductor layer 119 were formed (FIG. 15B). Here, an ICP etching apparatus was used, and the etching condition was as follows: the ICP power was 1000 W, the bias power was 80 W, the pressure was 1.51 Pa, the etching gas was chlorine with a flow rate of 100 sccm, and the etching time was 78 seconds. After that, the resist mask was removed.

Next, as illustrated in FIG. 15C, a conductive layer 121 was formed so as to cover the gate insulating layer 107, the semiconductor layer 115, the butter layer 117, and the impurity semiconductor layer 119. Here, a molybdenum layer with a thickness of 300 nm was formed under a condition similar to that of Example 1.

Next, a resist was applied to the conductive layer 121 and then exposed to light using a third photomask and developed, thereby forming a resist mask. With the use of the resist mask, the conductive layer 121 was etched by wet etching, thereby forming wiring layers 123 and 125 as illustrated in FIG. 16A. Note that the planar shape of each of the wiring layers 123 and 125 was linear in this example.

Next, with the use of the resist mask, the impurity semiconductor layer 119 was etched, so that source and drain regions 129 were formed. In this process, part of the surface of the buffer layer 117 was also etched, so that a buffer layer 131 was obtained (FIG. 16B). Here, an ICP etching apparatus was used, and the etching condition was as follows: the ICP power was 1000 W, the bias power was 50 W, the pressure was 1.5 Pa, the etching gas was chlorine with a flow rate of 100 sccm, and the etching time was 35 seconds. The thickness of the buffer layer 131 at this time was 165 nm. After that, the resist mask was removed.

Then, the surfaces of the buffer layer 131, and the source and drain regions 129 were irradiated with carbon fluoride plasma, whereby an impurity remaining on the buffer layer 131 was removed. Here, an ICP etching apparatus was used, and the etching condition was as follows: the source power was 1000 W, the bias power was 0 W, the pressure was 0.67 Pa, the etching gas was carbon fluoride with a flow rate of 100 sccm, and the etching time was 30 seconds.

Next, the surfaces of the buffer layer 131 and the source and drain regions 129 were irradiated with water plasma. The power of the power source was 1800 W, the pressure was 66.5 Pa, and plasma was generated in an atmosphere containing water vapor with a flow rate of 300 scam, and the surfaces were irradiated with the plasma for 180 seconds. After that, the remaining resist mask was removed.

Next, as an insulating layer 133, a silicon nitride layer was formed. Here, under a condition similar to that of Example 1, a silicon nitride layer with a thickness of 300 nm was formed.

Next, a resist is applied to the insulating layer and then exposed to light using a fourth photomask and developed, thereby forming a resist mask. With the use of the resist mask, part of the insulating layer was etched by dry etching, so that the wiring layer 125 was exposed. In addition, part of the insulating layer and part of the gale insulating layer 107 were etched by dry etching, so that the gate electrode layer 103 was exposed. Here, an etching condition similar to that of Example 1 was used. After that, the resist mask was removed.

Through the above-described steps, the thin film transistor was manufactured.

Figure 38A:
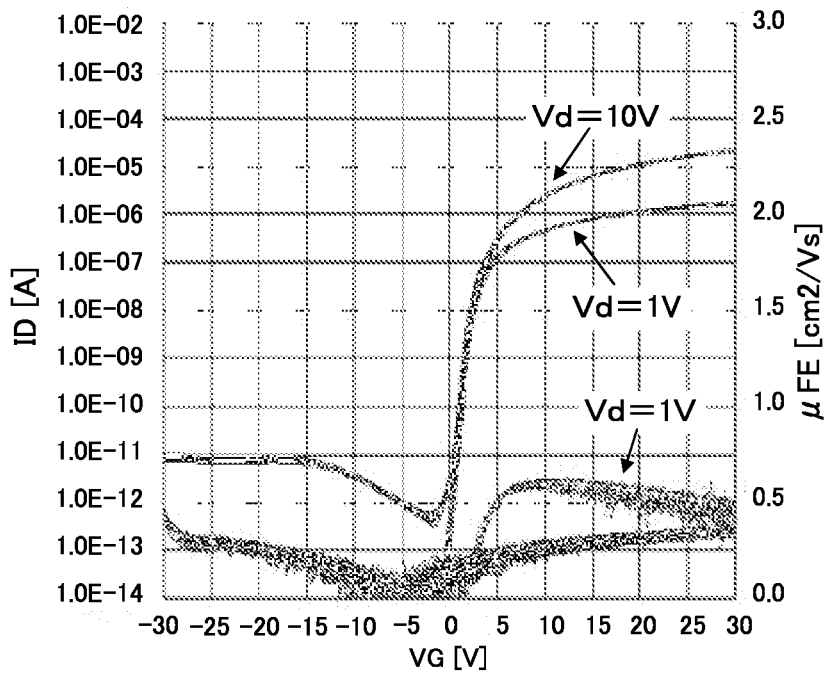
FIGS. 38A and 38B are graphs showing electric characteristics of a thin film transistor manufactured in Example 3.
Figure 38B:
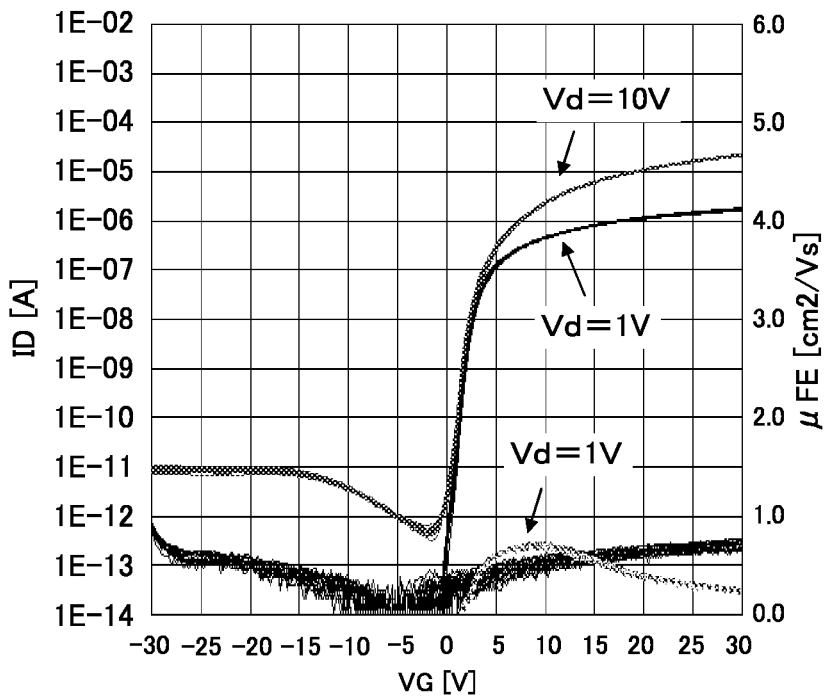

After that, electric characteristics of the thin film transistor were measured and FIGS. 38A and 38B show the results. Note that the thin film transistor of this example was manufactured to have a channel length L of 4 μm and a channel width W of 20 μm. In practice, the channel length L was 3.53 μm and the channel width W was 20 μm. The channel width W was the width of the gate electrode here. The width of the semiconductor layer 115 was 22 μm. Further, field-effect mobility was calculated under the condition that the thickness of the gate insulating layer of the thin film transistor was the sum of 110 nm of the silicon nitride layer (permittivity: 7) and 110 nm of the silicon oxide layer (permittivity; 4.1). Current vs. voltage characteristics of when the drain voltage was 1 V and current vs. voltage characteristics of when the drain voltage was 10 V are represented by solid lines. Field-effect mobility of when the drain voltage was 1V is represented by a dashed line in FIG. 38A, and field-effect mobility of when the drain voltage was 10 V is represented by a dashed line in FIG. 38B.

Table 3 shows the measurement results of the following items. Here, average values obtained by performing measurement on 16 thin film transistors are shown.

On-current (Ion) (drain voltage: 10 V, gate voltage: 15 V)
Minimum off-current (Ioff min) (drain voltage: 10 V)
Off-current (Ioff) (drain voltage: 10 V, gate voltage: (gate voltage at minimum off-current−10) V)
On/Off ratio
Threshold Voltage (Vth) (drain voltage: 10 V)
Maximum field-effect mobility (μFE max) (drain voltage: 1 V)
Maximum field-effect mobility (μFE max) (drain voltage: 10 V)

TABLE 3

| Ion [A] | Ioff_min [A] | Ioff [A] | On/Off ratio | Vth [V] | μFE_max [cm2/V · s] (Vd = 1 V) | μFE_max [cm2/V · s] (Vd = 10 V) |
| --- | --- | --- | --- | --- | --- | --- |
| 6.6E−06 | 6.4E−13 | 5.4E−12 | 7.1 | 2.45 ± 0.28 | 0.59 | 0.71 |

From the above results, by increasing the thickness of the buffer layer 131 as compared to Example 2, off-current of when the drain voltage is 10 V can be reduced. In addition, according to the graphs, it is found that the drain current is drastically increased around the threshold voltage and that variation in electric characteristics of the thin film transistor is reduced.

Example 4

FIG. 39 shows a cross-sectional TEM image obtained by performing ion milling to a stacked structure which includes a silicon oxide layer, a microcrystalline silicon layer, and a silicon layer including crystal regions in an amorphous structure. A silicon oxide layer 401 with a thickness of 100 nm was formed over a glass substrate, a microcrystalline silicon layer 402 with a thickness of 5 nm was formed over the silicon oxide layer 401, a buffer layer 403 with a thickness of 145 nm was formed over the microcrystalline silicon layer 402, and an amorphous silicon layer 404 with a thickness of 100 nm was formed over the buffer layer 403. Note that there is no interface observed between the buffer layer 403 and the amorphous silicon layer 404. In addition, a protective layer 405 was provided over the amorphous silicon layer 404.

Here, the silicon oxide layer 401 was formed under a condition similar to that of the silicon oxide layer described in Example 2.

The microcrystalline silicon layer 402 was formed under a condition similar that of the microcrystalline silicon layer described in Example 1.

The deposition condition of the buffer layer 403 was as follows: as for the source gases, the flow rate of $SiH_4$ was 30 sccm, the flow rate of $H_2$ was 1475 sccm, and the flow rate of 1000 ppm $NH_3$ (diluted with hydrogen) was 25 sccm, the pressure in the treatment chamber was 280 Pa, the temperature of the substrate was 280° C., the RF power source frequency was 13.56 MHz, and the power of the RE power source was 50 W; plasma discharge was performed under this condition.

The deposition condition of the amorphous silicon layer 404 was as follows: as for the source gases, the flow rate of $SiH_4$ was 280 sccm and the flow rate of $H_2$ was 300 sccm, the pressure in the treatment chamber was 170 Pa, the temperature of the substrate was 280° C., the RF power source frequency was 13.56 MHz, and the power of the RF power source was 60 W; plasma discharge was performed under this condition.

Figure 40:
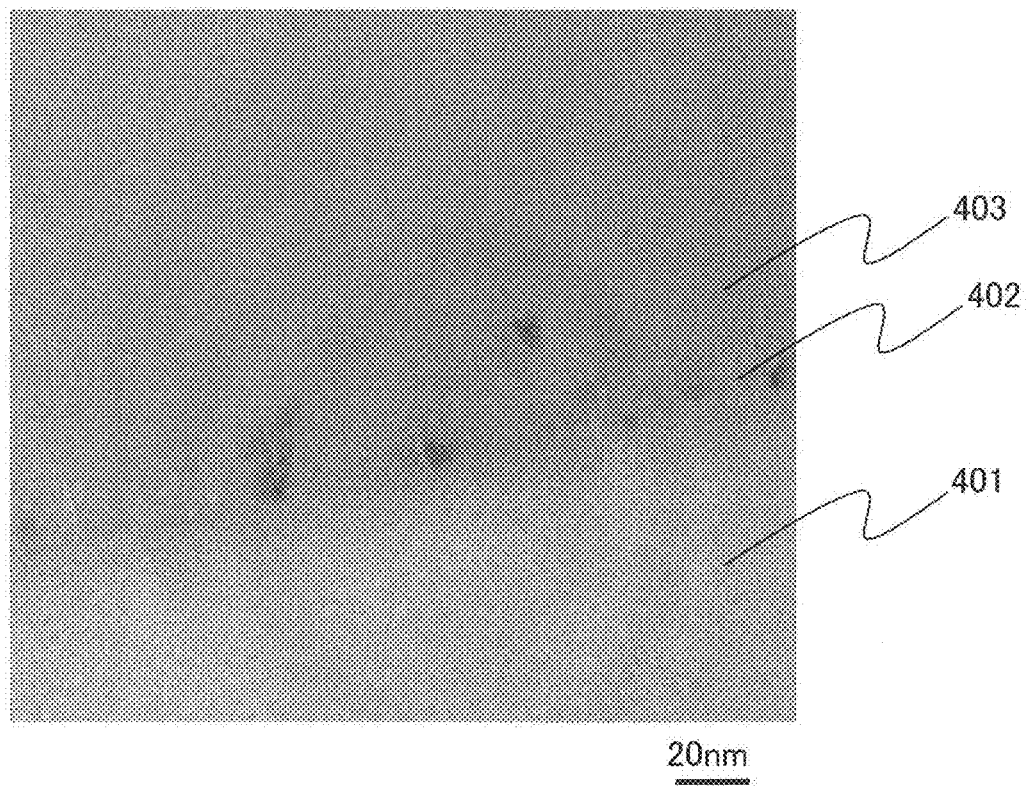
FIG. 40 is an explanatory view of a cross-sectional TEM image described in Example 4.

FIG. 40 is an enlarged view of a region 406 in FIG. 39.

In FIG. 40, a number of lattice fringes having short-range order are observed on the silicon oxide layer 401.

Figure 41A:
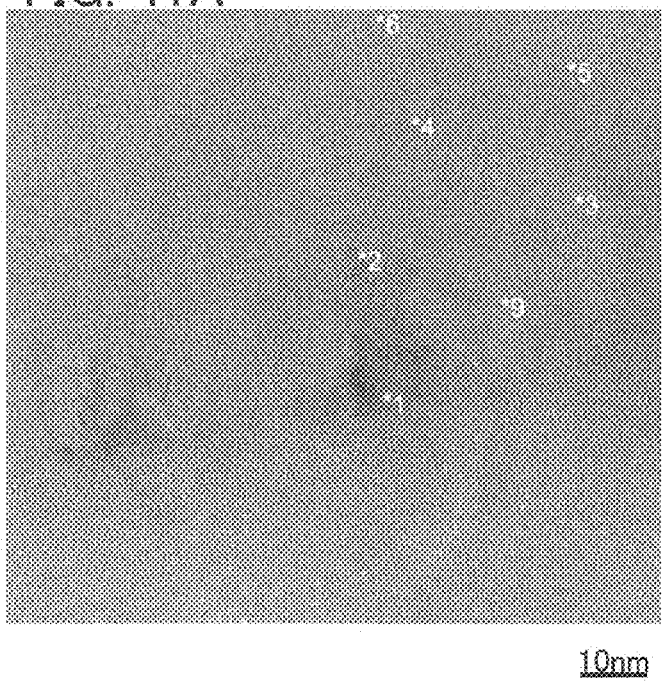
FIGS. 41A to 41H are explanatory views of a cross-sectional TEM image described in Example 4.
Figure 41B:
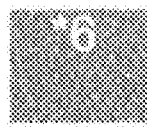
Figure 41C:
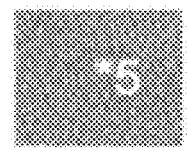
Figure 41D:
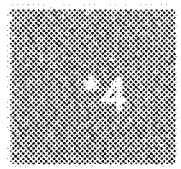
Figure 41E:
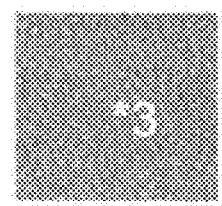
Figure 41F:
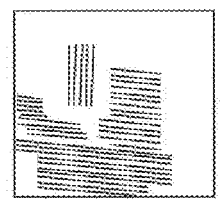
Figure 41G:
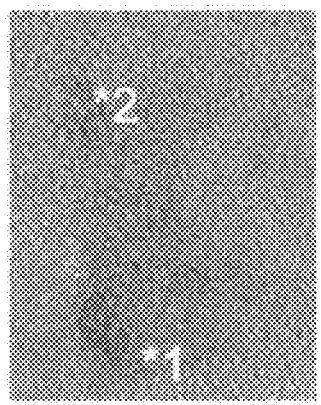
Figure 41H:
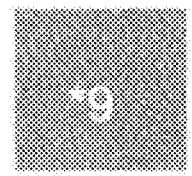

In FIG. 41A, enlarged images of the silicon oxide layer 401, the microcrystalline silicon layer 402, and the buffer layer 403 in FIG. 40 are shown. FIG. 41B is an enlarged view of a portion around *6 in FIG. 41A, FIG. 41C is an enlarged view of a portion around *5 in FIG. 41A, FIG. 41D is an enlarged view of a portion around *4 in FIG. 41A, FIG. 41E is an enlarged view of a portion around *3 in FIG. 41A, FIG. 41G is an enlarged view of a portion around *1 and *2 in FIG. 41A, and FIG. 41H is an enlarged view of a portion around *9 in FIG. 41A. In, addition, FIG. 41F schematically shows the lattices fringes in FIG. 41E. According to FIGS. 41E, 41F, and 41G the lattice fringes having short-range order are observed at *1, *2, and *3. On the other hand, according to FIGS. 41B, 41C, 41D, and 41H, the lattice fringes are not observed and an amorphous structure is formed at *4 to *6, and *9.

Accordingly, it is found that crystal regions as denoted by *1, *2, and *3 in FIG. 41A are provided in the amorphous structure as denoted by *4 to *6, and *9 in FIG. 41A.

Figure 42:
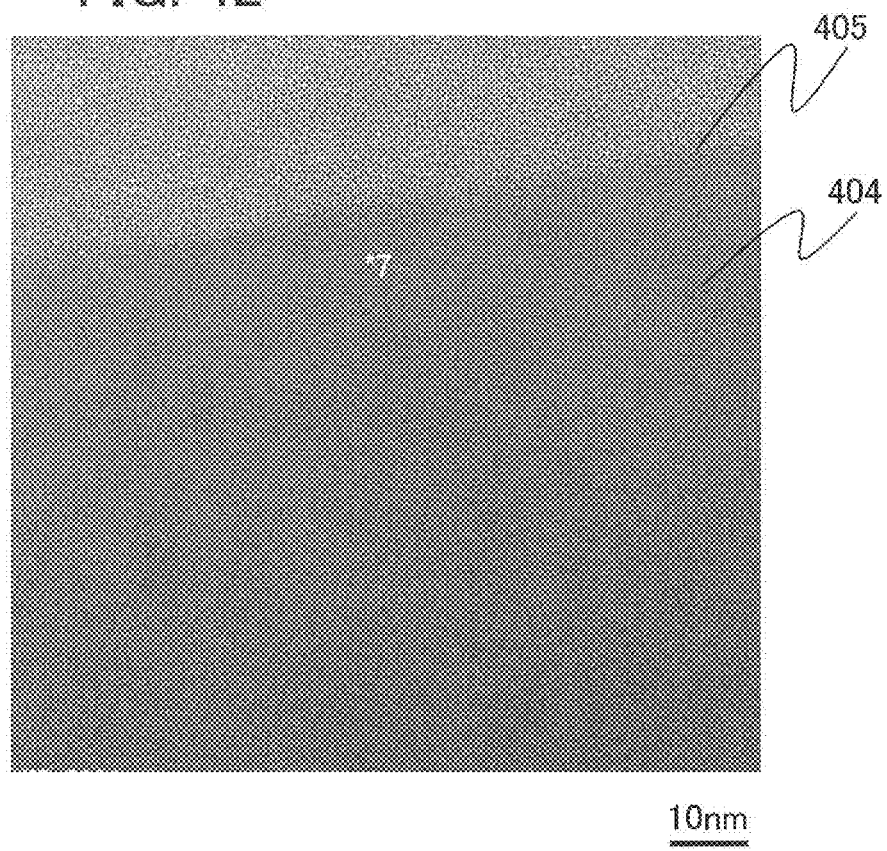
FIG. 42 is an explanatory view of a cross-sectional TEM image described in Example 4.

Next, FIG. 42 is an enlarged view of a portion around *7 in the buffer layer 403 shown in FIG. 39. According to FIG. 42, it is found that the lattice fringes are not observed and the amorphous structure is formed around *7.

Example 5

In Example 5, electric characteristics of a thin film transistor which is manufactured in accordance with Embodiment 6 are described.

First, a manufacturing process of the thin film transistor will be described with reference to FIGS. 15A to 15C and 16A to 16C.

A gate electrode layer 103 was formed over a substrate 101.

Here, as the substrate 101, a glass substrate with a thickness of 0.7 mm (EAGLE2000, manufactured by Corning, Inc.) was used.

In a manner similar to that of Example 1, a molybdenum layer with a thickness of 150 nm was formed over the substrate. Next, after a resist was applied to the molybdenum layer, the resist was exposed to light with the use of a first photomask and developed, thereby forming a resist mask.

Next, in a manner similar to that of Example 1, the molybdenum layer was etched using the resist mask, thereby forming the gate electrode layer 103. After that, the resist mask was removed.

Then, over the gate electrode layer 103 and the substrate 101, a gate insulating layer 107, a semiconductor layer 109, a buffer layer 111 and an impurity semiconductor layer 113 were formed successively (FIG. 15A).

Here, as the gate insulating layer 107, a silicon nitride layer and a silicon oxide layer were stacked in a manner similar to that of Example 2.

Next, as the semiconductor layer 109, a microcrystalline silicon layer with a thickness of 50 nm was formed over the gate insulating layer 107 under a condition similar to that of Example 3.

Next, as the buffer layer 111, a silicon layer including crystal regions in an amorphous structure with a thickness of 175 nm was formed over the semiconductor layer 109. The deposition condition at this time was as follows: as for the source gases, the flow rate of $SiH_4$ was 40 sccm, the flow rate of $H_2$ was 1475 sccm, and the flow rate of 1000 ppm $NH_3$ (diluted with hydrogen) was 25 sccm, the pressure in the treatment chamber was 280 Pa, the temperature of the substrate was 280° C., and the power of the RF power source was 100 W; plasma discharge was performed under this condition.

Next, as the impurity semiconductor layer 113, an amorphous silicon layer to which phosphorus was added with a thickness of 50 nm was formed over the buffer layer 111 under a condition similar to that of Example 1.

Next, a resist was applied to the impurity semiconductor layer 113, and then exposed to light using a second photomask and developed, thereby forming a resist mask. Next, with the use of the resist mask, the semiconductor layer 109, the buffer layer 111, and the impurity semiconductor layer 113 were etched, whereby a semiconductor layer 115, a buffer layer 117, and an impurity semiconductor layer 119 were formed (FIG. 15B). Here, an ICP etching apparatus was used, and the etching condition was as follows: the ICP power was 1000 W, the bias power was 80 W, the pressure was 1.51 Pa, and the etching gas was chlorine with a flow rate of 100 sccm. After that, the resist mask was removed.

Next, as illustrated in FIG. 15C, a conductive layer 121 was formed so as to cover the gate insulating layer 107, the semiconductor layer 115, the buffer layer 117, and the impurity semiconductor layer 119. Here, after a titanium layer with a thickness of 50 nm was formed by sputtering a titanium target with use of argon ions with a flow rate of 20 sccm, an aluminum layer with a thickness of 200 nm was formed by sputtering an aluminum target with use of argon ions with a flow rate of 50 sccm. Then, a titanium layer with a thickness of 50 nm was formed by sputtering a titanium target with use of argon ions with a flow rate of 20 sccm.

Next, a resist was applied to the conductive layer 121 and then exposed to light using a third photomask and developed, thereby forming a resist mask. With the use of the resist mask, the conductive layer 121 and the impurity semiconductor layer 119 were etched by dry etching, thereby forming wiring layers 123 and 125 and source and drain regions 129. In this process, part of the surface of the buffer layer 117 was also etched, so that a buffer layer 131 was obtained (FIG. 16B). Note that the planar shape of each of the wiring layers 123 and 125 was linear in this example. Here, an ICP etching apparatus was used, and the etching condition was as follows: the ICP power was 450 W, the bias power was 100 W, the pressure was 1.9 Pa, and the etching gases included boron chloride with a flow rate of 60 sccm and chlorine with a flow rate of 20 sccm. The total thickness of the semiconductor layer 115 and the buffer layer 131 at this time was 205 nm. After that, the resist mask was removed.

Then, the surfaces of the buffer layer 131, and the source and drain regions 129 were irradiated with carbon fluoride plasma, whereby an impurity remaining on the buffer layer 131 was removed. Here, an ICP etching apparatus was used, and the etching condition was as follows: the source power was 1000 W, the bias power was 0 W, the pressure was 0.67 Pa, the etching gas was carbon fluoride with a flow rate of 100 sccm, and the etching time was 30 seconds.

Next, as an insulating layer 133, a silicon nitride layer was formed. Here, under a condition similar to that of Example 1, a silicon nitride layer with a thickness of 300 nm was formed.

Next, a resist is applied to the insulating layer and then exposed to light using a fourth photomask and developed, thereby forming a resist mask. With the use of the resist mask, part of the insulating layer was etched by dry etching, so that the wiring layer 125 was exposed. In addition, part of the insulating layer and part of the gate insulating layer 107 were etched by dry etching, so that the gate electrode layer 103 was exposed. Here, an etching condition similar to that of Example 1 was used. After that, the resist mask was removed.

Through the above-described steps, the thin film transistor was manufactured.

Figure 45A:
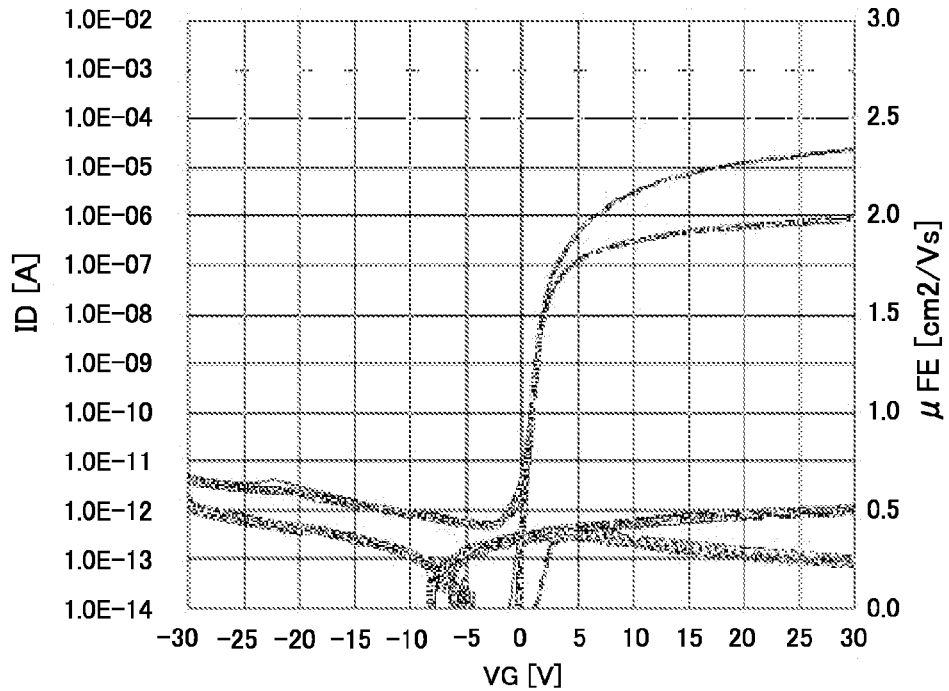
FIGS. 45A and 45B are graphs showing electric characteristics of a thin film transistor manufactured in Example 5.
Figure 45B:
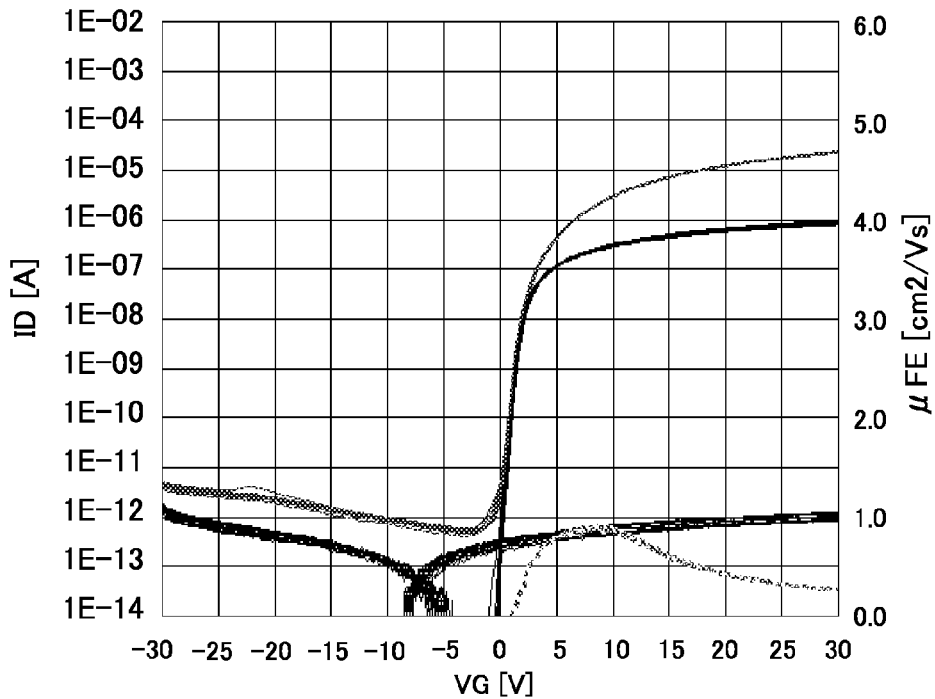

After that, electric characteristics of the thin film transistor were measured and FIGS. 45A and 45B show the results. At this time, measurement was performed by increasing the gate voltage in increments of 0.25 V. In addition, the temperature at the time of measurement was room temperature. Note that the thin film transistor of this example was manufactured to have a channel length L of 4 μm and a channel width W of 20 μm. The channel width was the width of the gate electrode here. The width of the semiconductor layer 115 was 22 μm. Further, field-effect mobility was calculated under the condition that the thickness of the gate insulating layer of the thin film transistor was the sum of 110 nm of the silicon nitride layer (permittivity: 7) and 110 nm of the silicon oxide layer (permittivity; 4.1). Current vs. voltage characteristics of when the drain voltage was 1 V and current vs. voltage characteristics of when the drain voltage was 10 V are represented by solid lines. Field-effect mobility of when the drain voltage was 1V is represented by a dashed line in FIG. 45A, and field-effect mobility of when the drain voltage was 10 V is represented by a dashed line in FIG. 45B.

Table 4 shows the measurement results of the following items. Here, average values obtained by performing measurement on 16 thin film transistors are shown.

On-current (Ion) (drain voltage: 10 V, gate voltage: 15 V)
Minimum off-current (Ioff min) (drain voltage: 10 V)
Off-current (Ioff) (drain voltage: 10 V, gate voltage (gate voltage at minimum off-current–10) V)
On/Off ratio
Threshold Voltage (Vth) (drain voltage: 10 V)
Maximum field-effect mobility (μFE max) (drain voltage: 1 V)
Maximum field-effect mobility (μFE max) (drain voltage: 10 V)

As described above, by increasing the thickness of the semiconductor layer 115 as compared to Example 3, the amount of transfer of carriers is increased and on-current and field-effect mobility can be increased. In addition, since the thickness of the semiconductor layer 115 is increased and off-current is not increased even though on-current is increased as compared to Example 3, off-current can be reduced by using a silicon layer including crystal regions in an amorphous structure as a buffer layer. Further, by using a titanium layer as a wiring in contact with the impurity semiconductor layer, contact resistance is reduced as compared to Examples 2 and 3 in which the wiring is a molybdenum layer, whereby on-current and field-effect mobility can be increased.

Example 6

In Example 6, a relation between a buffer layer and off-current of a thin film transistor will be described. In this example, a thin film transistor in which ammonia is used for source gases of a buffer layer and a thin film transistor in which ammonia is not used for source gases of a buffer layer are compared.

First, a manufacturing process of the thin film transistor will be described with reference to FIGS. 15A to 15C and 16A to 16C. Note that Sample 1 and Sample 2 are different only in deposition condition of the buffer layer and other conditions are the same.

A gate electrode layer 103 was formed over a substrate 101.

In a manner similar to that of Example 1, a molybdenum layer with a thickness of 150 nm was formed over the substrate. Then, a resist was applied to the molybdenum layer and exposed to light with the use of a first photomask and developed, thereby forming a resist mask.

Next, in a manner similar to that of Example 1, the molybdenum layer was etched using the resist mask, thereby forming the gate electrode layer 103. After that, the resist mask was removed.

Then, over the gate electrode layer 103 and the substrate 101, a gate insulating layer 107, a semiconductor layer 109, a buffer layer 111, and an impurity semiconductor layer 113 were formed successively (FIG. 15A).

Here, as the gate insulating layer 107, a silicon nitride layer and a silicon oxide layer were stacked in a manner similar to that of Example 2.

Next, as the semiconductor layer 109, a microcrystalline silicon layer with a thickness of 10 nm was formed over the gate insulating layer 107 under a condition similar to that of Example 3.

Next, as the buffer layer 111, a buffer layer with a thickness of 175 nm was formed over the semiconductor layer 109.

In Sample 1, the buffer layer was formed using source gases containing ammonia. The deposition condition at this time was as follows: as for the source gases, the flow rate of $SiH_4$ was 40 sccm, the flow rate of $H_2$ was 1475 sccm, the flow rate of 1000 ppm $NH_3$ (diluted with hydrogen) was 25 sccm, and the flow rate of Ar was 2000 sccm, the pressure in the treatment chamber was 280 Pa, the temperature of the sub-

TABLE 4

| Ion [A] | Ioff_min [A] | Ioff [A] | On/Off ratio | Vth [V] | μFE_max [cm2/V · s] (Vd = 1 V) | μFE_max [cm2/V · s] (Vd = 10 V) |
|---|---|---|---|---|---|---|
| 7.3E−06 | 6.1E−13 | 1.2E−12 | 7.15 | 2.01 ± 0.12 | 0.37 | 0.90 | strate was 280° C., and the power of the RF power source was 100 W; plasma discharge was performed under this condition.

In Sample 2, the buffer layer was formed using source gases which do not contain ammonia. The deposition condition at this time was as follows: as for the source gases, the flow rate of $SiH_4$ was 40 sccm, the flow rate of $H_2$ was 1500 sccm, and the flow rate of Ar was 2000 sccm, the pressure in the treatment chamber was 280 Pa, the temperature of the substrate was 280° C., and the power of the RF power source was 100 W; plasma discharge was performed under this condition. That is, in this condition, ammonia was omitted from the source gases of Sample 1.

Next, as the impurity semiconductor layer 113, an amorphous silicon layer to which phosphorus was added with a thickness of 50 nm was formed over the buffer layer 111 under a condition similar to that of Example 1.

Next, a resist was applied to the impurity semiconductor layer 113, and then exposed to light using a second photomask and developed, thereby forming a resist mask. Next, with the use of the resist mask, the semiconductor layer 109, the buffer layer 111, and the impurity semiconductor layer 113 were etched, whereby a semiconductor layer 115, a buffer layer 117, and an impurity semiconductor layer 119 were formed (FIG. 15B). Here, a condition similar to that of Example 5 was used. After that, the resist mask was removed.

Next, as illustrated in FIG. 15C, a conductive layer 121 was formed so as to cover the gate insulating layer 107, the semiconductor layer 115, the buffer layer 117, and the impurity semiconductor layer 119. Here, a molybdenum layer with a thickness of 300 nm was formed under a condition similar to that of Example 1.

Next, a resist was applied to the conductive layer 121 and then exposed to light using a third photomask and developed, thereby forming a resist mask. With the use of the resist mask, the conductive layer 121 was etched by wet etching, thereby forming wiring layers 123 and 125 as illustrated in FIG. 16A. Note that the planar shape of each of the wiring layers 123 and 125 was linear in this example.

Next, the impurity semiconductor layer 119 was etched with the use of the resist mask, whereby source and drain regions 129 were formed. In this step, part of the surface of the buffer layer 117 was also etched to be a buffer layer 131 (FIG. 16B). Here, an etching condition similar to that of Example 1 was used. The thickness of the buffer layer 131 at this time was 155 nm. After that, the resist mask was removed.

Then, the surfaces of the buffer layer 131, and the source and drain regions 129 were irradiated with carbon fluoride plasma, whereby an impurity remaining on the buffer layer 131 was removed. Here, an impurity remaining on the buffer layer was removed under a condition similar to that of Example 5. After that, the surfaces of the wiring layers 123 and 125 and the buffer layer 131 were cleaned.

Then, the surfaces of the buffer layer 131 and the source and drain regions 129 were irradiated with water plasma. Here, a condition similar to that of Example 2 was used.

Next, as an insulating layer 133, a silicon nitride layer was formed (FIG. 16C). Here, under a condition similar to that of Example 1, a silicon nitride layer with a thickness of 300 nm was formed.

Next, a resist is applied to the insulating layer and then exposed to light using a fourth photomask and developed, thereby forming a resist mask. With the use of the resist mask, part of the insulating layer was etched by dry etching, so that the wiring layer 125 was exposed. In addition, part of the insulating layer and part of the gate insulating layer 107 were etched by dry etching, so that the gate electrode layer 103 was exposed. Here, an etching condition similar to that of Example 1 was used. After that, the resist mask was removed.

Through the above-described steps, the thin film transistors for Sample 1 and Sample 2 were manufactured.

Figure 47:
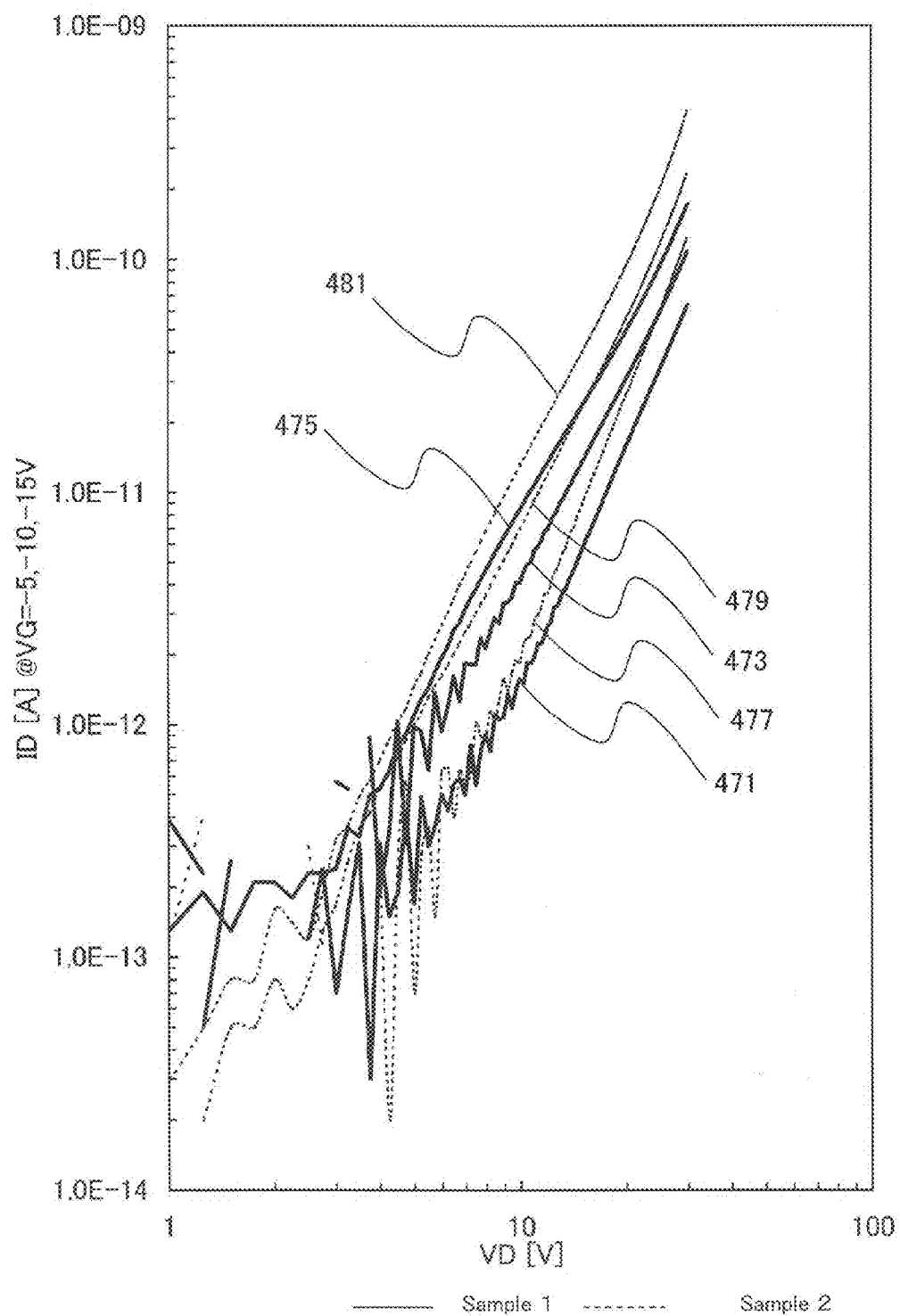
FIG. 47 is a graph showing electric characteristics of a thin film transistor manufactured in Example 6.

After that, electric characteristics of the thin film transistors were measured and FIG. 47 shows the results. At this time, measurement was performed by increasing the gate voltage in increments of 0.25 V. In addition, the temperature at the time of measurement was room temperature. Note that each of the thin film transistors for Sample 1 and Sample 2 of this example was manufactured to have a channel length L of 4 μm and a channel width W of 20 μm. The channel width was the width of the gate electrode here. The width of the semiconductor layer 111 was 22 μm. The horizontal axis indicates drain voltage and the vertical axis indicates drain current, and drain current (off current, here) of when drain voltage was 1 to 30 V was measured, with the gate voltage at −5 V, 31 10 V, and −15 V.

In FIG. 47, a solid line 471 indicates off-current of the thin film transistor for Sample 1 in the case where the gate voltage is 5 V, a solid line 473 indicates that in the case where the gate voltage is −10 V, and a solid line 475 indicates that in the case where the gate voltage is −15 V. In addition, a dashed line 477 indicates off-current of the thin film transistor for Sample 2 in the case where the gate voltage is −5 V, a dashed line 479 indicates that in the case where the gate voltage is −10 V, and a dashed line 481 indicates that in the case where the gate voltage is −15 V.

According to FIG. 47, when off-current of Sample 1 is compared with that of Sample 2 at the same gate voltage, it is found that off-current is lower in Sample 1. That is, when a silicon layer including crystal regions in an amorphous structure, which is formed using ammonia for source gases and contains nitrogen, is used as a buffer layer, off-current is reduced. This is because defects in the buffer layer are reduced by using ammonia for the source gases of the buffer layer.

Example 7

In Example 7, a state of LUMO in the case where dangling bonds of Si at a crystal grain boundary are cross-linked with an NH group in the simulation described in Embodiment 1 will be described.

FIG. 5 illustrates a state of LUMO (lowest unoccupied molecular orbital) in a model (model 1) in which dangling bonds at a crystal grain boundary of Si are cross-linked with an O atom and FIG. 6 illustrates a state of LUMO in a model (model 2) in which dangling bonds at a crystal grain boundary of Si are cross-linked with an NH group. Here. LUMO is a molecular orbital with the lowest energy, which electrons in an excited state enter, and corresponds to an orbital of a bottom edge of a conduction band (CB) in a band theory. Therefore, LUMO can be interpreted as a wave function of an electron contributing to carrier transfer and an orbital which determines carrier mobility.

Next, an atom and an orbital of the atom from which LUMO in each of the model 1 and the model 2 was derived were examined. A wave function of LUMO can be expressed as a linear combination (that is, the sum of scalar multiples) of atomic orbitals of atoms included in the film.

Note that existence probability of each of a Si atomic orbital, an H atomic orbital, an O atomic orbital, and an N atomic orbital can be obtained by the square of an absolute value of its respective factor in the linear combination and a sign proves whether the atomic orbitals form a bonding orbital (the same sign) or an antibonding orbital (a different sign).

FIG. 43A is a schematic diagram of a main atomic orbital forming LUMO at the periphery of the crystal grain boundary in the model 1, and FIG. 43B is a schematic diagram of a main atomic orbital forming LUMO at the periphery of the crystal grain boundary in the model 2. Here, regions with different hatchings have opposite signs of the wave function. Here, s orbitals 452 and 456 of a Si atom, p orbitals 451, 453, 455, and 457 of a Si atom, a 2s orbital 454 of an O atom, a 2s orbital 458 of an N atom, and a 1s orbital 459 of an H atom are illustrated.

As illustrated in FIG. 43A, in the case where dangling bonds at the crystal grain boundary of Si are cross-linked with the O atom, when the 2s orbital 454 of the O atom is focused, the phase of the 2s orbital 454 of the O atom is different from that of $sp^3$ orbitals (3s orbital 452+3p orbital 453 and 3s orbital 456+3p orbital 455) of the Si atom which are on opposite sides of the crystal grain boundary. That is, the 2s orbital 454 of the O atom contributes to a bonding between atoms; however, the 2s orbital 454 of the O atom cannot connect electron clouds because of a narrow spread of the wave function. Therefore, it is considered that the 2s orbital 454 of the O atom does not contribute to improvement in conductivity.

On the other hand, as illustrated in FIG. 43B, in the case where dangling bonds at the crystal grain boundary of Si are cross-linked with the NH group, when the 2s orbital 458 of the N atom is focused, the phase of the 2s orbital 458 of the N atom is different from that of $sp^3$ orbitals (the 3s orbital 452+the 3p orbital 453 and the 3s orbital 456+the 3p orbital 455) of the Si atom which are on opposite sides of the crystal grain boundary. That is, the 2s orbital 458 of the N atom cannot connect electron clouds. However, by mixing the 2s orbital 458 of the N atom with the 1s orbital 459 of the H atom, regions which have the same sign, that is, the $sp^3$ orbitals (the 3s orbital 452+the 3p orbital 453) of the Si atom, the 1s orbital 459 of the H atom, and the $sp^3$ orbitals of Si (the 3s orbital 456+the 3p orbital 455) become bonding orbitals, whereby the electron clouds can be connected to each other. Accordingly, it is considered that the conductivity is improved.

Figure 44A:
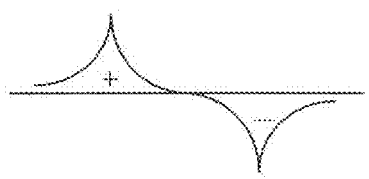
FIGS. 44A and 44B are explanatory diagrams of an atomic orbital of a semiconductor layer.
Figure 44B:

The aforementioned results can be interpreted as follows. That is, LUMO is an exited state (has high energy); therefore, in general, LUMO has an antibonding orbital for the atomic orbitals as illustrated in 44A. In the cross-link at the Si crystal grain boundary with the O atom in the model 1 illustrated in FIG. 43A or the cross-link at the Si crystal grain boundary with the NH group in the model 2 illustrated in FIG. 43B, the 2s orbitals 454 and 458 of the O atom and the N atom have antibonding with (have phases opposite to) the $sp^3$ orbitals of the Si atom (the 3s orbital 452+the 3p orbital 453 and the 3s orbital 456+the 3p orbital 455). The antibonding orbital indicates that a joint is formed between electron clouds. Accordingly, in the case of the cross-link at the Si crystal grain boundary with the O atom in the model 1 illustrated in FIG. 43A, the electron clouds are not connected to each other. Meanwhile, in the case of the cross-link at the Si crystal grain boundary with the NH group in the model 2 illustrated in FIG. 43B, although the 2s orbital 458 of the N atom and the $sp^3$ orbitals of Si (the 3s orbital 452+the 3p orbital 453 and the 3s orbital 456+the 3p orbital 455) form an antibonding orbital, the 1s orbital 459 of the H atom and the $sp^3$ orbitals of Si (the 3s orbital 452+the 3p orbital 453 and the 3s orbital 456+the 3p orbital 455) can form a bonding orbital as illustrated in FIG. 44B because of existence of the H atom. That is, the electron clouds can be connected to each other with the NH group because of existence of the H atom.

Note that although a $CH_2$ group includes H, a molecular orbital to which an atomic orbital of a C atom or an H atom in the $CH_2$ group is bonded is a molecular orbital with higher energy and therefore the molecular orbital is not included in the atomic orbital which forms LUMO (lowest unoccupied molecular orbital). Thus, it is considered that even with a cross-link at the Si crystal grain boundary with the $CH_2$ group, the electron clouds are not connected to each other.

Accordingly, in LUMO of the Si crystal grain boundary where dangling bonds are cross-linked with the NH group, the $sp^3$ orbitals of the Si atom on the opposite sides of the crystal grain boundary have phases which are opposite to the phase of the 2s orbital of the N atom and the same as the phase of the 1s orbital of the H atom. Thus, the 1 s orbital of the H atom functions as a bridge between the electron clouds. As a result, the electron clouds are connected to each other and thus a carrier path is formed. Further, it is estimated that, in order to connect the electron clouds at the Si crystal grain boundary, an atomic orbital in a cross-linking group is needed to have an atom forming LUMO (for example, an O atom in the O cross-link, or the N atom and the H atom in the NH group) and an atom which can have the same phase as the $sp^3$ orbital of Si (for example, the H atom in the NH group).

This application is based on Japanese Patent Application serial No. 2008-169286, 2009-046433, and 2009-129313 filed with Japan Patent Office on Jun. 27, 2008, Feb. 27, 2009, and May 28, 2009, respectively, the entire contents of which are hereby incorporated by reference.

EXPLANATION OF REFERENCE

101: substrate, 103: gate electrode layer, 105: capacitor wiring, 107: gate insulating layer, 109: semiconductor layer, 111: buffer layer, 113: impurity semiconductor layer, 115: semiconductor layer, 117: buffer layer, 118: microcrystalline semiconductor, 119: impurity semiconductor layer, 121: conductive layer, 123: wiring layer, 125: wiring layer, 127: capacitor electrode, 129: source region and drain region, 131: buffer layer, 132: semiconductor layer, 133: insulating layer, 134: opening, 135: pixel electrode layer, 136: opening, 137: protrusion, 141: semiconductor layer, 143: resist mask, 145: semiconductor layer, 147: impurity semiconductor layer, 149: conductive layer, 151: resist mask, 153: wiring layer, 155: wiring layer, 157: source region and drain region, 159: semiconductor layer, 171: region, 172: region, 173: region, 174: region, 180: graytone mask, 181: substrate, 182: light-shielding portion, 183: diffraction grating portion, 185: half-tone mask, 186: substrate, 187: semi-light-transmitting portion, 188: light-shielding portion, 192: crystal grain boundary, 193: O atom, 194: NH group, 195: nitrogen atom, 196: wave function, 197: wave function, 198: wave function, 199: wave function, 201: pretreatment, 203: formation of SiN, 205: replacement of gases, 207: formation of SiON, 209: replacement of gases, 211: formation of semiconductor layer, 213: flush treatment, 215: replacement of gases, 217: formation of buffer layer, 219: replacement of gases, 221: formation of impurity semiconductor layer, 223: exhaust of gas, 225: unload, 227: cleaning treatment, 229: precoating treatment, 231: load, 233: precoating treatment, 234: dashed line, 241: treatment chamber, 242: stage, 243: gas supply portion, 244: shower plate, 245: exhaust port, 246: upper electrode, 247: lower electrode, 248: alternate-current power source, 249: temperature control portion, 250: gas supply means, 251: exhaust means, 252: cylinder, 253:

pressure adjusting valve, 254: stop valve, 255: mass flow controller, 256: butterfly valve, 257: conductance valve, 258: turbo molecular pump, 259: dry pump, 260: cryopump, 261: plasma CVD apparatus, 301: substrate, 302: pixel portion, 303: signal line driver circuit, 304: scanning line driver circuit, 305: FPC, 306: protective circuit, 311: substrate, 312: pixel portion, 313: signal line driver circuit, 314: scanning line driver circuit, 315: FPC, 316: protective circuit, 321: substrate, 322: pixel portion, 324: scanning line driver circuit, 325: FPC, 326: protective circuit, 331: housing, 332: display panel, 333: main screen, 334: modem, 335: receiver, 336: remote control device, 337: display portion, 338: sub screen, 339: speaker portion, 341: cellular phone, 342: display portion, 343: operation portion, 351: main body, 352: display portion, 361: lighting portion, 362: shade, 363: adjustable arm, 364: support, 365: base, 366: power source switch, 371: pixel portion, 372: signal line driver circuit, 373: scanning line driver circuit, 374: tuner, 375: video signal amplifier circuit, 376: video signal processing circuit, 377: control circuit, 378: signal dividing circuit, 379: audio signal amplifier circuit, 380: audio signal processing circuit, 381: control circuit, 382; input portion, 383: speaker, 385: housing, 386: display portion, 387: speaker, 388: microphone, 389: operation key, 390: pointing device, 391: front camera lens, 392: jack for external connection terminal, 393: earphone terminal, 394: housing, 395: keyboard, 396: rear camera, 398: light, 401: silicon oxide layer, 402: microcrystalline silicon layer, 403: buffer layer, 404: amorphous silicon layer, 405: protective layer, 406: region, 451: p orbital, 452: s orbital, 453: p orbital, 454: s orbital, 455: p orbital, 456: s orbital, 457: p orbital, 458: s orbital, 459: s orbital, 471: solid line, 473: solid line, 475: solid line, 477: dashed line, 479: dashed line, 481: dashed line, 483: defect, 491: dashed line, 493: narrow solid line, 495: wide solid line, 115*a*: needle-like crystal, 115*b*: crystal grain boundary, 115*c*: amorphous structure, 115*d*: amorphous layer, 118*a*: microcrystalline semiconductor particle, 118*b*: microcrystalline semiconductor, 131*a*: crystal region, 131*b*: amorphous structure, 131*c*: minute crystal grain, 131*d*: crystal region, 131*e*: crystal region, 131*f*: crystal region, 131*g*: structure, 131*h*: crystal region, 131*i*: crystal region, 131*j*: crystal region, 131*k*: crystal grain boundary, 132*a*: crystal region, 132*b*: amorphous structure, 132*c*: minute crystal grain, 132*d*: crystal region, 132*e*: crystal region, 132*f*: crystal region, 132*g*: structure, 132*h*: crystal region, 132*i*: semiconductor layer, 132*j*: semiconductor layer, 191*a*: H atom, 191*b*: hydrogen atom, 235*a*: dashed line, 235*b*: dashed line, 236*a*: dashed line, 236*b*: dashed line, 237*a*: dashed line, 237*b*: dashed line, 239*c*: solid line, 239*d*: dashed line

The invention claimed is:

1. A thin film transistor comprising:
a gate electrode over a substrate;
a gate insulating layer over the gate electrode;
a semiconductor layer on and in contact with the gate insulating layer and including a first region and a second region;
a pair of impurity semiconductor layers forming a source region and a drain region each on and in contact with the semiconductor layer,
wherein the first region is interposed between the second region and the gate insulating layer,
wherein a microcrystalline semiconductor is formed in the first region of the semiconductor layer,
wherein the second region includes a crystal region in an amorphous structure, and
wherein a degree of crystallinity of the first region is higher than a degree of crystallinity of the second region.

2. The thin film transistor according to claim 1, wherein the second region includes a crystal grain having a diameter of greater than or equal to 1 nm and less than or equal to 10 nm.

3. The thin film transistor according to claim 1, wherein the crystal region includes a conical or pyramidal crystal region.

4. The thin film transistor according to claim 1, wherein the crystal region includes a conical or pyramidal crystal region, and wherein the second region includes a crystal grain having a diameter of greater than or equal to 1 nm and less than or equal to 10 nm.

5. The thin film transistor according to claim 3, wherein the conical or pyramidal crystal region is an inverted conical or pyramidal crystal region grown in a substantially radial manner from a lower surface side of the semiconductor layer to an upper surface side of the semiconductor layer.

6. The thin film transistor according to claim 3, wherein the conical or pyramidal crystal region is a conical or pyramidal crystal region whose width is narrowed from a lower surface side of the semiconductor layer to an upper surface side of the semiconductor layer.

7. The thin film transistor according to claim 4, wherein the conical or pyramidal crystal region is an inverted conical or pyramidal crystal region grown in a substantially radial manner from a lower surface side of the semiconductor layer to an upper surface side of the semiconductor layer.

8. The thin film transistor according to claim 4, wherein the conical or pyramidal crystal region is a conical or pyramidal crystal region whose width is narrowed from a lower surface side of the semiconductor layer to an upper surface side of the semiconductor layer.

9. The thin film transistor according to claim 1, wherein the substrate has an insulating surface.

10. The thin film transistor according to claim 1, wherein the semiconductor layer contains nitrogen.

11. The thin film transistor according to claim 1, wherein the semiconductor layer contains an NH group or an $NH_2$ group.

12. A thin film transistor comprising:
a gate electrode over a substrate;
a gate insulating layer over the gate electrode;
a first semiconductor layer in contact with the gate insulating layer;
a second semiconductor layer stacked over the first semiconductor layer; and
a pair of impurity semiconductor layers forming a source region and a drain region each on and in contact with the second semiconductor layer,
wherein the second semiconductor layer includes a crystal region in an amorphous structure, and
wherein a degree of crystallinity of the first semiconductor layer is higher than a degree of crystallinity of the second semiconductor layer.

13. The thin film transistor according to claim 12, wherein the second semiconductor layer includes a crystal grain having a diameter of greater than or equal to 1 nm and less than or equal to 10 nm.

14. The thin film transistor according to claim 12, wherein the crystal region has a conical or pyramidal shape.

15. The thin film transistor according to claim 12, wherein the crystal region includes a conical or pyramidal crystal region, and wherein the second semiconductor layer includes a crystal grain having a diameter of greater than or equal to 1 nm and less than or equal to 10 nm.

16. The thin film transistor according to claim 14, wherein the conical or pyramidal crystal region is an inverted conical or pyramidal crystal region grown in a substantially radial manner from an interface between the first semiconductor layer and the second semiconductor layer in a deposition direction of the second semiconductor layer.

17. The thin film transistor according to claim 14, wherein the conical or pyramidal crystal region is a conical or pyramidal crystal region which is in contact with the first semiconductor layer and whose width is narrowed from the first semiconductor layer toward the source region and the drain region.

18. The thin film transistor according to claim 15, wherein the conical or pyramidal crystal region is an inverted conical or pyramidal crystal region grown in a substantially radial manner from an interface between the first semiconductor layer and the second semiconductor layer in a deposition direction of the second semiconductor layer.

19. The thin film transistor according to claim 15, wherein the conical or pyramidal crystal region is a conical or pyramidal crystal region which is in contact with the first semiconductor layer and whose width is narrowed from the first semiconductor layer toward the source region and the drain region.

20. The thin film transistor according to claim 12, wherein the substrate has an insulating surface.

21. The thin film transistor according to claim 12, wherein the second semiconductor layer contains nitrogen.

22. The thin film transistor according to claim 12, wherein the second semiconductor layer contains an NH group or an $NH_2$ group.

23. The thin film transistor according to claim 12, wherein the first semiconductor layer comprises dispersed microcrystalline semiconductors or a net-like microcrystalline semiconductor.

24. A thin film transistor comprising:
a gate electrode over a substrate;
a gate insulating layer over the gate electrode;
a first semiconductor layer in contact with the gate insulating layer;
a second semiconductor layer stacked over the first semiconductor layer;
a pair of impurity semiconductor layers forming a source region and a drain region on and in contact with the second semiconductor layer,
wherein the second semiconductor layer includes a crystal region in an amorphous structure,
wherein the first semiconductor layer and the second semiconductor layer each consist of crystalline semiconductor portions and amorphous semiconductor portions,
wherein, in the first semiconductor layer, a first volume occupied by the crystalline semiconductor portions is greater than a second volume occupied by the amorphous semiconductor portions, and
wherein, in the second semiconductor layer, a third volume occupied by the amorphous semiconductor portions is greater than a fourth volume occupied by the crystalline semiconductor portions.

25. The thin film transistor according to claim 24, wherein the crystal region is an inverted conical or pyramidal crystal region grown in a substantially radial manner from an interface between the gate insulating layer and the first semiconductor layer in a deposition direction of the first semiconductor layer.

26. The thin film transistor according to claim 24, wherein the crystal region includes a crystal grain having a diameter of greater than or equal to 1 nm and less than or equal to 10 nm.

27. The thin film transistor according to claim 24, wherein the crystal region includes an inverted conical or pyramidal crystal region grown from an interface between the gate insulating layer and the first semiconductor layer in a deposition direction of the first semiconductor layer, and wherein the first semiconductor layer includes a crystal grain having a diameter of greater than or equal to 1 nm and less than or equal to 10 nm.

28. The thin film transistor according to claim 24, wherein the substrate has an insulating surface.

29. The thin film transistor according to claim 24, wherein the first semiconductor layer contains nitrogen.

30. The thin film transistor according to claim 24, wherein the first semiconductor layer contains an NH group or an $NH_2$ group.

31. The thin film transistor according to claim 24, wherein the amorphous structure is formed on the crystal region.

32. The thin film transistor according to claim 24, wherein a plurality of inverted conical or pyramidal crystal regions are stacked in the crystal region.

33. The thin film transistor according to claim 24, wherein the crystal region has a quadrangular shape each angle of which is not 90°.

34. The thin film transistor according to claim 1,
wherein the first region and the second region each consist of crystalline semiconductor portions and amorphous semiconductor portions,
wherein, in the first region, a first volume occupied by the crystalline semiconductor portions is greater than a second volume occupied by the amorphous semiconductor portions, and
wherein, in the second region, a third volume occupied by the amorphous semiconductor portions is greater than a fourth volume occupied by the crystalline semiconductor portions.

35. The thin film transistor according to claim 12,
wherein the first semiconductor layer and the second semiconductor layer each consist of crystalline semiconductor portions and amorphous semiconductor portions,
wherein, in the first semiconductor layer, a first volume occupied by the crystalline semiconductor portions is greater than a second volume occupied by the amorphous semiconductor portions.

* * * * *

UNITED STATES PATENT AND TRADEMARK OFFICE
CERTIFICATE OF CORRECTION

| | | |
|---|---|---|
| PATENT NO. | : 8,637,866 B2 | |
| APPLICATION NO. | : 12/490447 | |
| DATED | : January 28, 2014 | |
| INVENTOR(S) | : Toshiyuki Isa et al. | |

It is certified that error appears in the above-identified patent and that said Letters Patent is hereby corrected as shown below:

In the Specification:

Column 6, line 49, "Film" should be --film--.

Column 7, line 43, "52B3" should be --52B--.

Column 11, line 48, "regions and" should be --region, and--.

Column 14, line 6, "Therefore it" should be --Therefore, it--.

Column 17, lines 33-34, "structure at" should be --structure, at--.

Column 18, line 38, "a denotes" should be --σ denotes--.

Column 22, line 63, "In additions" should be --In addition,--.

Column 25, line 41, "inkjet" should be --ink-jet--.

Column 26, line 38, "$Ge_2H_6$, $Ge_2H_6$" should be --$GeH_4$, $Ge_2H_6$--.

Column 27, line 33, "Supply" should be --supply--.

Column 28, line 1, "ease" should be --case--.

Column 28, line 37, "RE" should be --RF--.

Column 29, line 40, "as" should be --gas--.

Column 29, line 49, "gas, however" should be --gas; however,--.

Column 30, line 45, "FIG. 20 an" should be --FIG. 20, an--.

Column 33, line 8, "thereof" should be --thereof,--.

Column 33, line 10, "materials and" should be --materials, and--.

Column 39, lines 45-46, "semi-fight-transmitting" should be --semi-light-transmitting--.

Column 40, line 20, "plasma ammonia" should be --plasma, ammonia--.

Column 44, line 55, "shifter or" should be --shifter, or--.

Column 45, line 48, "1C" should be --IC--.

Column 47, line 49, "103, in" should be --103. In--.

Signed and Sealed this
Twenty-fourth Day of June, 2014

Michelle K. Lee
*Deputy Director of the United States Patent and Trademark Office*

CERTIFICATE OF CORRECTION (continued)
U.S. Pat. No. 8,637,866 B2

Column 48, line 1, "seem," should be --sccm,--.

Column 48, line 28, "chamber and" should be --chamber, and--.

Column 48, line 47, "RE" should be --RF--.

Column 50, line 52, "111 and" should be --111, and--.

Column 51, line 18, "117" should be --111--.

Column 51, line 32, "developed" should be --developed,--.

Column 53, line 59, "layer and" should be --layer, and--.

Column 55, line 21, "37B3" should be --37B--.

Column 56, line 36, "111 and" should be --111, and--.

Column 57, line 13, "butter" should be --buffer--.

Column 57, line 56, "scam," should be --sccm,--.

Column 57, line 67, "gale" should be --gate--.

Column 59, line 16, "RE" should be --RF--.

Column 59, line 41, "41G the" should be --41G, the--.

Column 60, line 9, "111 and" should be --111, and--.

Column 61, lines 2 and 12, "seem" should be --sccm--.

Column 64, line 14, "111" should be --115--.

Column 64, line 18, "–5V, 31 10 V" should be -- –5 V, –10 V--.

Column 64, line 52, "Here." should be --Here,--.

Column 66, line 16, "1 s" should be --1s--.